US012660147B2

(12) United States Patent
Madia et al.

(10) Patent No.:  US 12,660,147 B2
(45) Date of Patent:       Jun. 16, 2026

(54) STACKABLE MEMORY DEVICES WITH VERTICAL CHANNELS AND METHODS OF MANUFACTURING THEREOF

(71) Applicant: Taiwan Semiconductor Manufacturing Company, Ltd., Hsinchu (TW)

(72) Inventors: Oreste Madia, Hsinchu City (TW); Gerben Doornbos, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 402 days.

(21) Appl. No.: 18/362,212

(22) Filed: Jul. 31, 2023

(65)      Prior Publication Data

US 2024/0357789 A1      Oct. 24, 2024

Related U.S. Application Data

(60) Provisional application No. 63/497,548, filed on Apr. 21, 2023.

(51) Int. Cl.
H10B 10/00          (2023.01)
H10D 30/01          (2025.01)
          (Continued)

(52) U.S. Cl.
CPC ......... H10B 10/125 (2023.02); H10D 30/014 (2025.01); H10D 30/43 (2025.01);
          (Continued)

(58) Field of Classification Search
None
See application file for complete search history.

(56)      References Cited

U.S. PATENT DOCUMENTS

| | | | |
|---|---|---|---|
| 2014/0167215 A1 | 6/2014 | Barth et al. | |
| 2016/0336329 A1* | 11/2016 | Colinge | ................ H10B 10/12 |

(Continued)

FOREIGN PATENT DOCUMENTS

| | | |
|---|---|---|
| DE | 10 2021 108 598 A1 | 12/2021 |
| KR | 10-2023-0036507 A | 3/2023 |
| TW | 202336965 A | 9/2023 |

OTHER PUBLICATIONS

Office Action issued in connection with Korean Appl. No. 10-2023-0165906 dated Jun. 13, 2025.

(Continued)

*Primary Examiner* — Khaja Ahmad
(74) *Attorney, Agent, or Firm* — Foley & Lardner LLP

(57)      ABSTRACT

A memory device includes a first n-type transistor and a second n-type transistor formed of a first channel extending along a vertical direction and wrapped by first, second, third, fourth, and fifth metal tracks; a third n-type transistor and a fourth n-type transistor formed of a second channel extending along the vertical direction and is wrapped by fourth, sixth, seventh, eighth, and ninth metal tracks; a first p-type transistor formed of a third channel extending along the vertical direction and is wrapped by second, third, and tenth metal tracks; and a second p-type transistor formed of a fourth channel extending along the vertical direction and is wrapped by sixth, seventh, and tenth metal tracks.

20 Claims, 54 Drawing Sheets

(51) Int. Cl.
    *H10D 30/43*           (2025.01)
    *H10D 30/67*           (2025.01)
    *H10W 20/41*          (2026.01)

(52) U.S. Cl.
    CPC ..... *H10D 30/6728* (2025.01); *H10D 30/6735*
           (2025.01); *H10D 30/6755* (2025.01); *H10D*
           *30/6757* (2025.01); *H10W 20/435* (2026.01)

(56)               References Cited

U.S. PATENT DOCUMENTS

2016/0351249 A1*   12/2016   Liaw ...................... H10D 30/62
2020/0075776 A1     3/2020   Van Dal

OTHER PUBLICATIONS

Office Action issued in connection with Taiwan Appl. No. 112136905 dated Jun. 6, 2024.
Office Action issued in connection with German Appl. No. 102023131585.4 dated Feb. 21, 2024.

\* cited by examiner

500

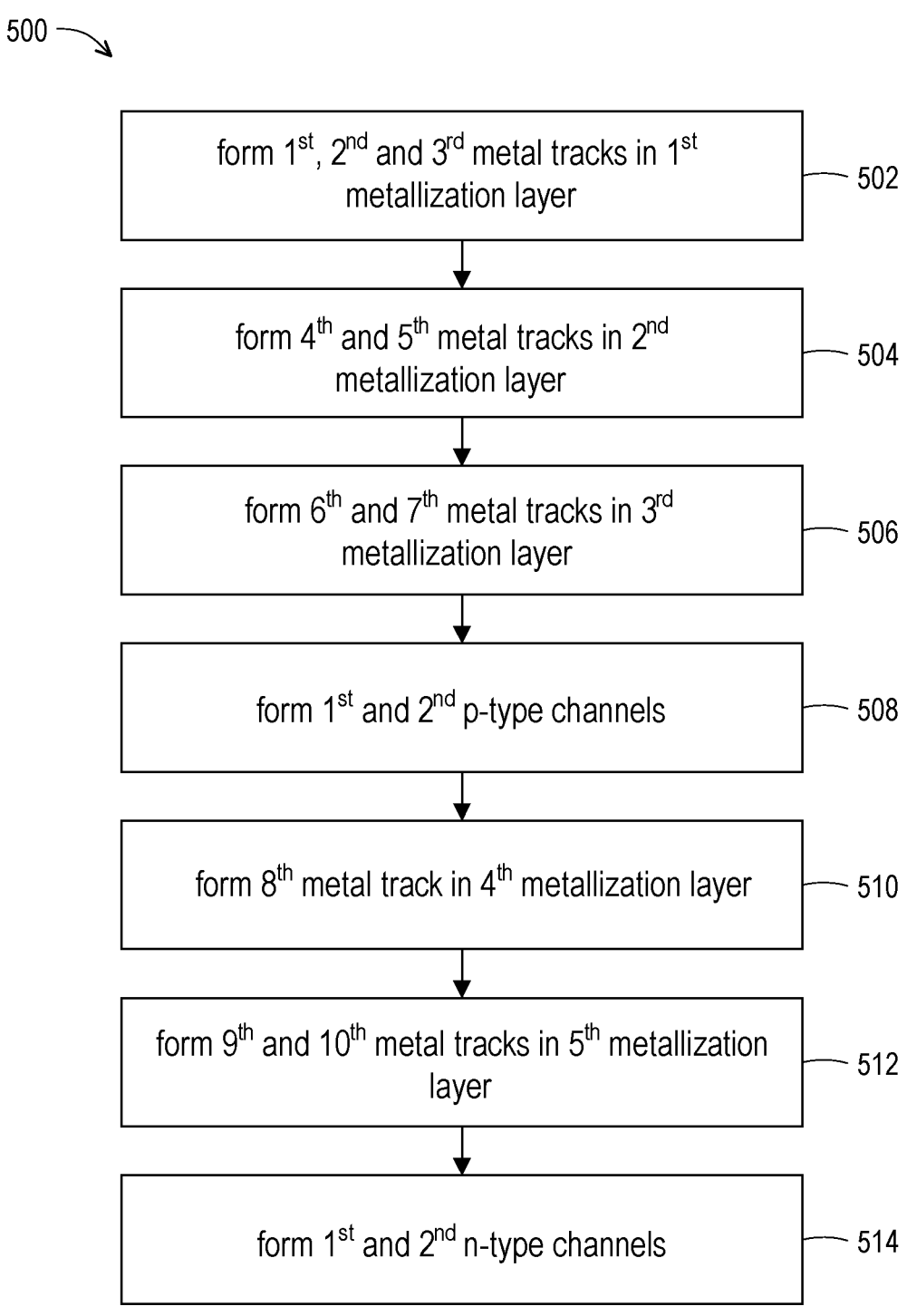

form 1$^{st}$, 2$^{nd}$ and 3$^{rd}$ metal tracks in 1$^{st}$ metallization layer — 502 form 4$^{th}$ and 5$^{th}$ metal tracks in 2$^{nd}$ metallization layer — 504 form 6$^{th}$ and 7$^{th}$ metal tracks in 3$^{rd}$ metallization layer — 506 form 1$^{st}$ and 2$^{nd}$ p-type channels — 508 form 8$^{th}$ metal track in 4$^{th}$ metallization layer — 510 form 9$^{th}$ and 10$^{th}$ metal tracks in 5$^{th}$ metallization layer — 512 form 1$^{st}$ and 2$^{nd}$ n-type channels — 514

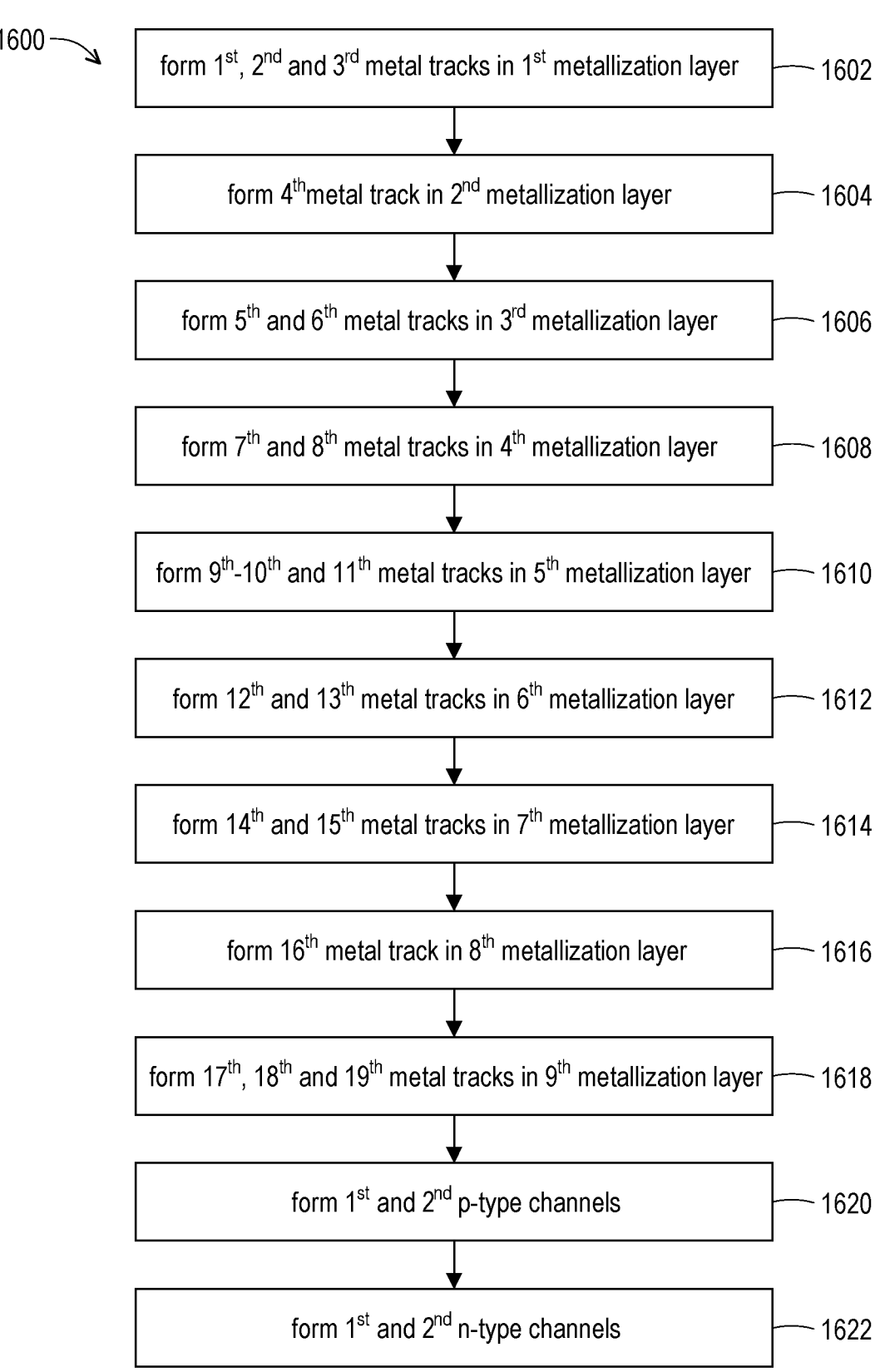

form 1$^{st}$, 2$^{nd}$ and 3$^{rd}$ metal tracks in 1$^{st}$ metallization layer — 1602 form 4$^{th}$ metal track in 2$^{nd}$ metallization layer — 1604 form 5$^{th}$ and 6$^{th}$ metal tracks in 3$^{rd}$ metallization layer — 1606 form 7$^{th}$ and 8$^{th}$ metal tracks in 4$^{th}$ metallization layer — 1608 form 9$^{th}$-10$^{th}$ and 11$^{th}$ metal tracks in 5$^{th}$ metallization layer — 1610 form 12$^{th}$ and 13$^{th}$ metal tracks in 6$^{th}$ metallization layer — 1612 form 14$^{th}$ and 15$^{th}$ metal tracks in 7$^{th}$ metallization layer — 1614 form 16$^{th}$ metal track in 8$^{th}$ metallization layer — 1616 form 17$^{th}$, 18$^{th}$ and 19$^{th}$ metal tracks in 9$^{th}$ metallization layer — 1618 form 1$^{st}$ and 2$^{nd}$ p-type channels — 1620 form 1$^{st}$ and 2$^{nd}$ n-type channels — 1622

FIG. 16

STACKABLE MEMORY DEVICES WITH VERTICAL CHANNELS AND METHODS OF MANUFACTURING THEREOF

CROSS-REFERENCE TO RELATED APPLICATION

This application claims priority to and the benefit of U.S. Provisional Application No. 63/497,548, filed Apr. 21, 2023, entitled "STACKABLE SRAM AND MANUFACTURING PROCESS THEREOF," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 illustrates an example flow chart of a method for fabricating a memory device including the memory cell shown in FIG. 3, in accordance with some embodiments.

FIG. 16 is an example flow chart of a method for fabricating a memory device including the two memory cells shown in FIG. 13, in accordance with some embodiments.

FIGS. 17A, 17B, 18A, 18B, 19A, 19B, 20A, 20B, 21A, 21B, 22A, 22B, 23A, 23B, 24A, 24B, 25A, 25B, 26, 27A, and 27B illustrate perspective views or top views of the memory device shown in FIG. 13 during various fabrication stages, in accordance with some embodiments.

DETAILED DESCRIPTION

Figure 1:
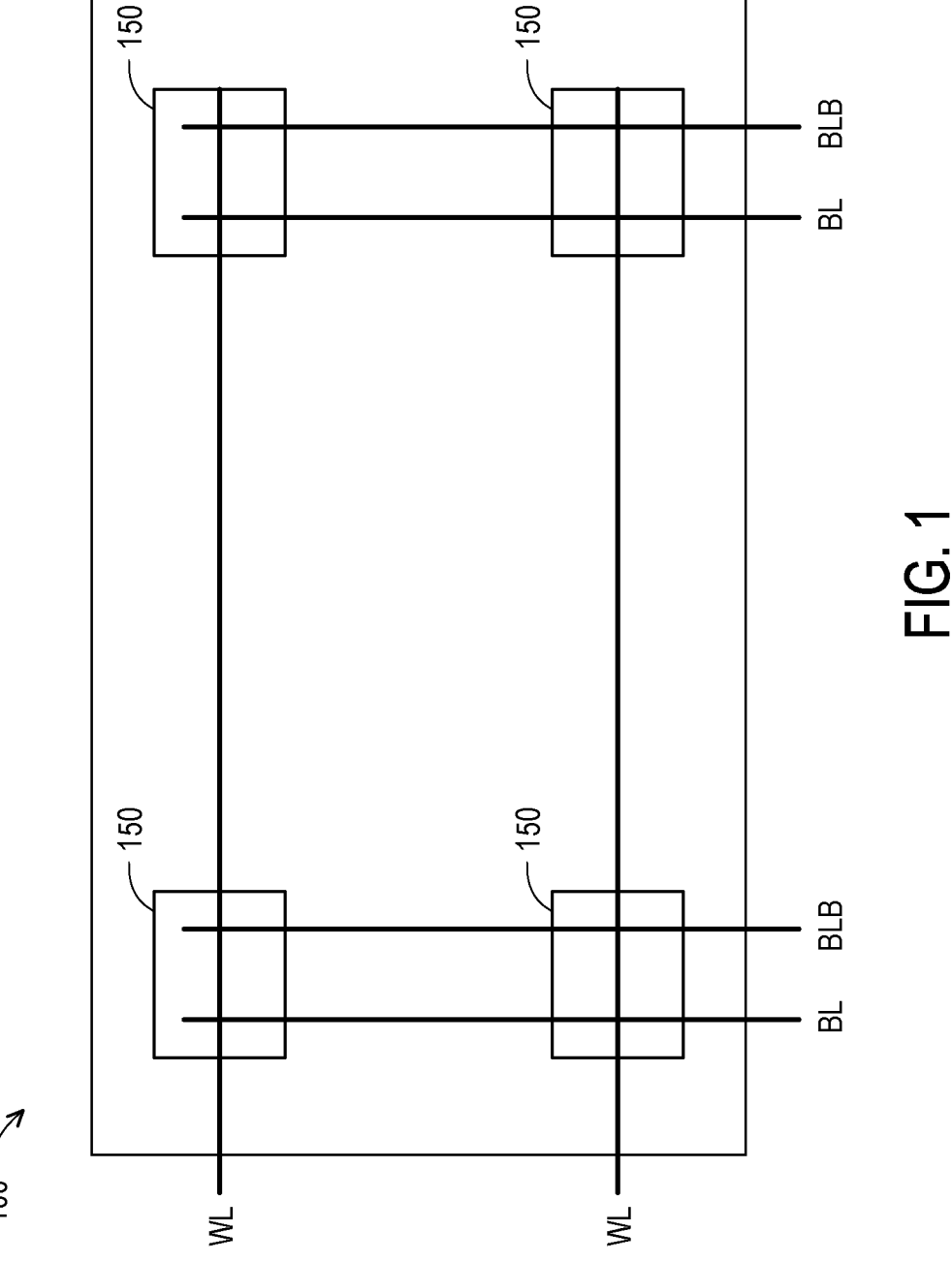
FIG. 1 illustrates a block diagram of a memory array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Vertical gate all around (VGAA) transistors can be formed with a channel that vertically extends above a substrate and a gate layer that surrounds a portion of the channel region above the substrate. A VGAA transistor may consist of a bottom conductive structure on a substrate on which one of the source or drain may be formed, a vertically extending channel region that extends vertically above the substrate, a gate layer that surrounds at least a portion of the channel region, and a top conductive structure above the channel region on which the other of the source or drain may be formed. Even with such novel device architectures for enhanced electrostatic control, the performance and scalability of current silicon-based transistors are still reaching fundamental limits. Alternative semiconductors materials such as germanium, III-V semiconductor materials are also being considered, but the ultra-thin body performance scalability of these relatively costly materials remains a challenge.

The present disclosure provides various embodiments of a semiconductor device including a plural number of VGAA transistors, with each of their channels formed of a semiconductive-behaving oxide material. For example, the semiconductor device includes a memory device with one or more Static Random Access Memory (SRAM) cells, each of which consists of multiple (e.g., 6) VGAA transistors. In some embodiments, such VGAA transistors of the SRAM cells can have their channels formed as respective tube-like or pillar-like structures that are formed of the semiconductive-behaving oxide material and extend in a vertical direction. Such semiconductive-behaving oxide materials can generally be formed under a relatively low temperature (e.g., under 200° C.), which allows the whole fabrication of the SRAM cell to be compatible with typical Back-End-Of-Line (BEOL) processes. Accordingly, respective source, drain, and gate terminals of these VGAA transistors (of the SRAM cell) can be configured as conductive (e.g., metal) tracks formed by the BEOL processes. This allows different SRAM cells to be vertically stacked on top of one another, which significantly reduce an area occupied by these SRAM cells. In addition, due to such a vertical configuration, other mono-layer or ultra-thin layer materials (generally referred to as two-dimensional (2D) materials) can be utilized as the channels, according to some embodiments. These 2D materials have presented outstanding transport properties, making them a great potential for applications in nano-electronics. As such, the disclosed memory device can still have improved performance, while keeping an area of the disclosed memory device substantially compact.

FIG. 1 illustrates a schematic diagram of an example memory array 100, in accordance with some embodiments. As shown, the memory array 100 includes a number of memory cells 150, or bit-cells 150. One or more peripheral circuits (not shown) may be located at one or more regions peripheral to, or within, the memory array 100. The memory cells 150 and the periphery circuits may be operatively coupled by a number of word lines (WL shown in FIG. 1) and a number of bit lines (e.g., BL and BLB shown in FIG. 1), in which the memory cells 150 can be accessed via such word lines and data can read from and written to the memory cell 150s via such bit lines.

In various embodiments of the present disclosure, the memory cell 150 may be implemented as a Static Random Access Memory (SRAM) cell that consists of a plural number of transistors. In the following examples, the memory cell 150 may consist of six transistors (sometimes referred to as "6T SRAM"). The six transistors may each be formed as a VGAA transistor. A corresponding channel of each of these VGAA transistors is formed as a tube-like or pillar-like structure extending along a vertical direction, with corresponding gate terminal, source terminal, and drain terminal formed as lateral metal tracks disposed in respectively different metallization layers. However, it should be understood that the memory cell 150 can have any other number of transistors, while remaining within the scope of the present disclosure. For example, the memory cell 150 can consist of seven transistors (sometimes referred to as a "7T SRAM") accessed through two word lines, eight transistors (sometimes referred to as an "8T SRAM") accessed through three word lines, etc.

Figure 2:
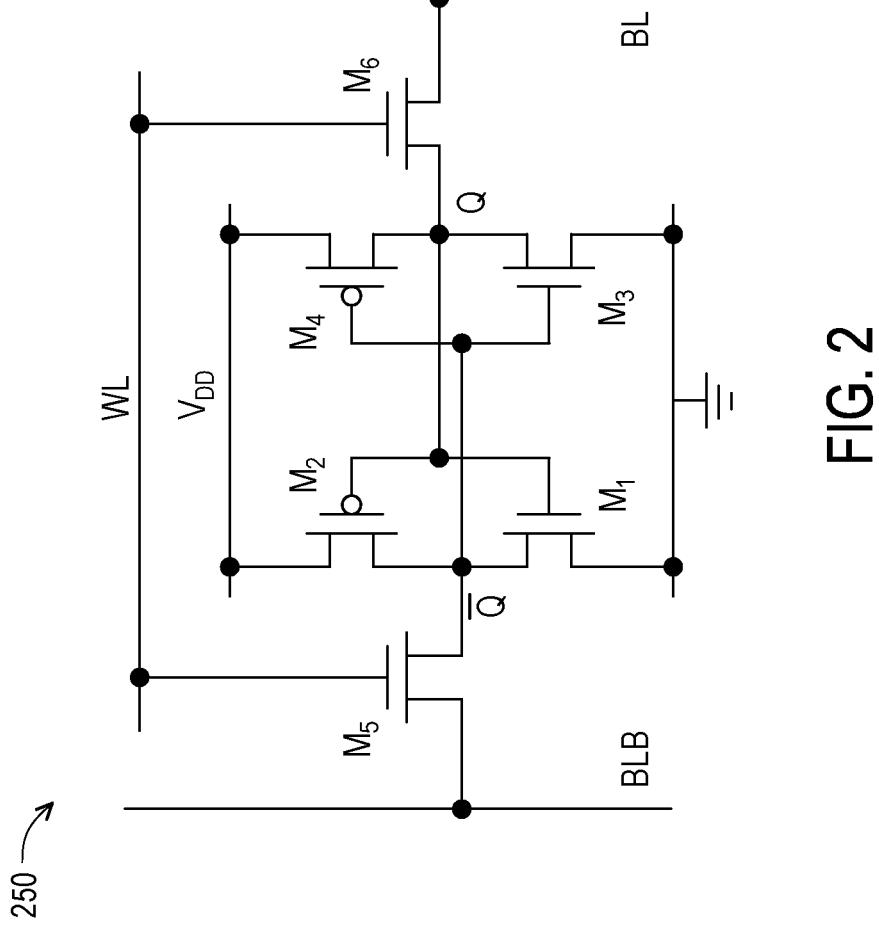
FIG. 2 illustrates a circuit diagram of a memory cell of the memory array of FIG. 1, in accordance with some embodiments.

FIG. 2 illustrates one example circuit diagram of the memory cell 150 shown in FIG. 1 (hereinafter "memory cell 250"), in accordance with some embodiments. As shown, the memory cell 250 consists of six transistors: a first pull-down transistor (M1), a second pull-down transistor (M3), a first pull-up transistor (M2), a second pull-up transistor (M4), a first pass gate/access transistor (M5), and a second pass gate/access transistor (M6), in which the transistors M2 and M4 are each implemented as a p-type metal-oxide-semiconductor field-effect-transistor (MOSFET), and the transistors M1, M3, M5, and M6 are each implemented as an n-type MOSFET. However, it should be understood that these transistors can each be configured otherwise, while remaining within the scope of the present disclosure.

In general, the transistors M1 and M2 form a first invertor, and the transistors M3 and M4 form a second inverter. Such two inverters are cross-coupled to each other. Power is supplied to each of the inverters, for example, a first source/drain (S/D) terminal of each of the transistors M2 and M4 is coupled to a power supply VDD, while a first S/D terminal of each of transistors M1 and M3 is coupled to a reference voltage VSS, for example, ground. A bit of data is stored in the memory cell 250 as a voltage level at node Q. The data stored at the node Q can be read by circuitry (e.g., a sense amplifier) via a bit line BL, which is enabled through the transistor M6 gated by a word line WL. Access (e.g., write operation) to the node Q is also controlled by the transistor M6. The node Qbar (Q̄) stores the complement to value at Q, e.g., if Q is "high," Qbar is "low," and access to Qbar is controlled by the transistor M5. A gate of the transistor M5 is also coupled to (e.g., controlled by) the word line WL. A first S/D terminal of the transistor M6 is coupled to the bit line BL, and a second S/D terminal of the transistor M6 is coupled to second S/D terminals of the transistors M3 and M4 at the node Q. Similarly, a gate of the transistor M5 is also coupled to the word line WL. A first S/D terminal of the transistor M5 is coupled to a complementary bit line BLB, and a second S/D terminal of the transistor M5 is coupled to second S/D terminals of the transistors M1 and M2 at the node Qbar.

Figure 3:
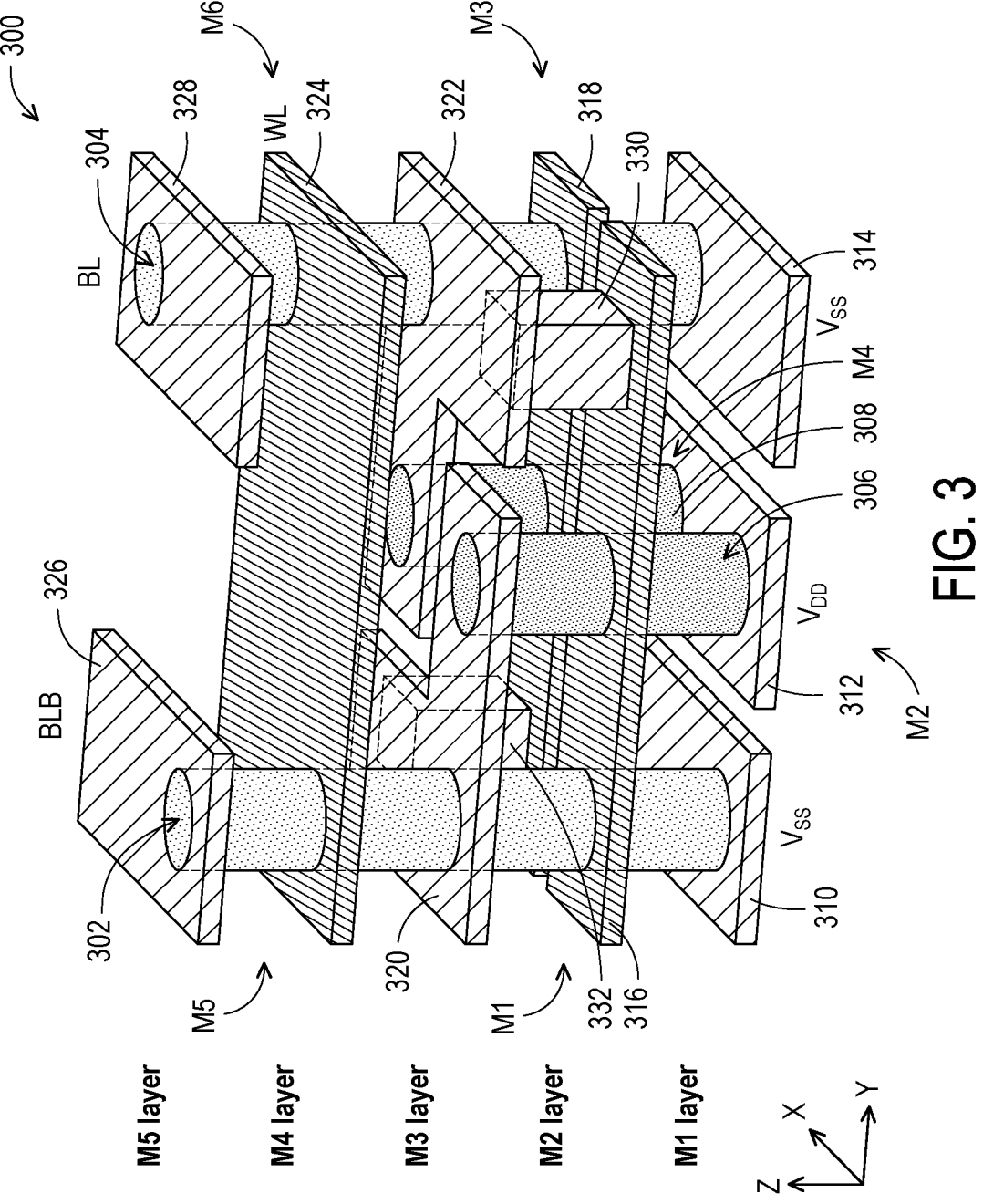
FIG. 3 illustrates a perspective view of a memory device including the memory cell of FIG. 2, in accordance with some embodiments.

FIG. 3 illustrates a perspective view of a memory device 300 including the memory cell 250 being formed as a plural number of VGAA transistors, in accordance with various embodiments. Such VGAA transistors can correspond to the transistors M1 to M6 shown in FIG. 2, respectively, and thus, some of the references may be again used in the following discussion of FIG. 3. According to various embodiments of the present disclosure, these VGAA transistors are formed with BEOL processes. In other words, components of each of the VGAA transistors may be formed in one or more metallization layers disposed above a semiconductor substrate.

As shown, the transistors M1 to M6 are formed based on channels, 302, 304, 306, and 308, extending in a vertical direction (e.g., the Z direction) and spaced from one another in at least one of a first lateral direction (e.g., the X direction) or second lateral direction (e.g., the Y direction). The channels 302 and 304 have a first conductivity (e.g., n-type), while the channel 306 and 308 have a second conductivity (e.g., p-type). The channel 302 and 304 vertically extend across five metallization layers (e.g., M1 layer, M2 layer, M3 layer, M4 layer, and M5 layer), and the channel 306 and 308 vertically across three metallization layers (e.g., M1 layer, M2 layer, and M3 layer). Further, each of the channels 302 to 308 has a plural number of portions coupled to (e.g., wrapped by) metal tracks formed in the corresponding metallization layers, respectively. As will be discussed below, each of the channels 302 to 308 can be formed as a tube-like or pillar-like structure made of one or more semiconductive-behaving oxide materials or otherwise ultra-thin materials.

For example, the channel 302 is coupled to metal tracks 310, 316, 320, 324, and 326, which are disposed in the M1 layer, M2 layer, M3 layer, M4 layer, and M5 layer, respectively. The channel 302 has five portions respectively wrapped by the metal tracks 310, 316, 320, 324, and 326, which can operatively configure the transistors M1 and M5. Specifically, the metal track 316 may operatively serve as a gate terminal of the transistor M1, with the metal tracks 310 and 320 operatively serving as a source terminal and a drain terminal of the transistor M1, respectively; and the metal track 324 may operatively serve as a gate terminal of the transistor M5, with the metal tracks 320 and 326 operatively serving as a source terminal and a drain terminal of the transistor M5, respectively. As such, the metal track 310 may be coupled to (or be configured to carry) VSS, the metal track 326 may be coupled to (or serve as) the BLB, and the metal track 324 may be coupled to (or serve as) the WL.

The channel 304 is coupled to metal tracks 314, 318, 322, 324, and 328, which are disposed in the M1 layer, M2 layer, M3 layer, M4 layer, and M5 layer, respectively. The channel 304 has five portions respectively wrapped by the metal tracks 314, 318, 322, 324, and 328, which can operatively configure the transistors M3 and M6. Specifically, the metal track 318 may operatively serve as a gate terminal of the transistor M3, with the metal tracks 314 and 322 operatively serving as a source terminal and a drain terminal of the transistor M3, respectively; and the metal track 324 may operatively serve as a gate terminal of the transistor M6, with the metal tracks 322 and 328 operatively serving as a source terminal and a drain terminal of the transistor M6, respectively. As such, the metal track 314 may be coupled to (or be configured to carry) VSS, the metal track 328 may be coupled to (or serve as) the BL, and the metal track 324 may be coupled to (or serve as) the WL.

The channel 306 is coupled to metal tracks 312, 316, and 320, which are disposed in the M1 layer, M2 layer, and M3 layer, respectively. The channel 306 has three portions respectively wrapped by the metal tracks 312, 316, and 320, which can operatively configure the transistor M2. Specifically, the metal track 316 may operatively serve as a gate terminal of the transistor M2, with the metal tracks 312 and 320 operatively serving as a source terminal and a drain terminal of the transistor M2, respectively. As such, the metal track 312 may be coupled to (or be configured to carry) VDD.

The channel 308 is coupled to metal tracks 312, 318, and 322, which are disposed in the M1 layer, M2 layer, and M3 layer, respectively. The channel 308 has three portions respectively wrapped by the metal tracks 312, 318, and 322, which can operatively configure the transistor M4. Specifically, the metal track 318 may operatively serve as a gate terminal of the transistor M4, with the metal tracks 312 and 322 operatively serving as a source terminal and a drain terminal of the transistor M4, respectively.

The metal track 322 (functioning as the drain terminal of the transistor M6, the drain terminal of the transistor M3, and the drain terminal of the transistor M4) is in electrical connection with the metal track 316 (functioning as the gate terminal of the transistor M2 and the gate terminal of the transistor M1) through a via structure 330. As such, the connection through or to the node Q shown in FIG. 2 is realized. Similarly, the metal track 320 (functioning as the drain terminal of the transistor M1, the drain terminal of the transistor M5, and the drain terminal of the transistor M2) is in electrical connection with the metal track 318 (functioning as the gate terminal of the transistor M4 and the gate terminal of the transistor M3) through a via structure 332. As such, the connection through or to the node Qbar shown in FIG. 2 is realized.

In some embodiments, the metal tracks 310 to 314 formed in the M1 layer may extend along the X direction; the metal tracks 316 to 318 formed in the M2 layer may extend along the Y direction; the metal track 324 formed in the M4 layer may extend along the Y direction; and the metal tracks 326 to 328 formed in the M5 layer may extend along the X direction, as shown in FIG. 3. Further, the metal tracks 320 and 322 may each be formed in an L-shape, according to some embodiments. For example, the metal tracks 320 and 322 each consist of a first portion extending in the X direction and a second portion extending in the Y direction, where the first portion and the second portion are connected to (merge with) each other so as to form a corner with a normal angle. The first portion, the corner portion, and the second portion of the metal track 320 is coupled to the metal track 318, wraps around the channel 302, and wraps around the channel 306, respectively; and the first portion, the corner portion, and the second portion of the metal track 322 is coupled to the metal track 316, wraps around the channel 304, and wraps around the channel 308, respectively. However, it should be understood that the metal tracks in the M1 to M5 layers can extend along different lateral direction(s), while remaining within the scope of the present disclosure.

Figure 4:
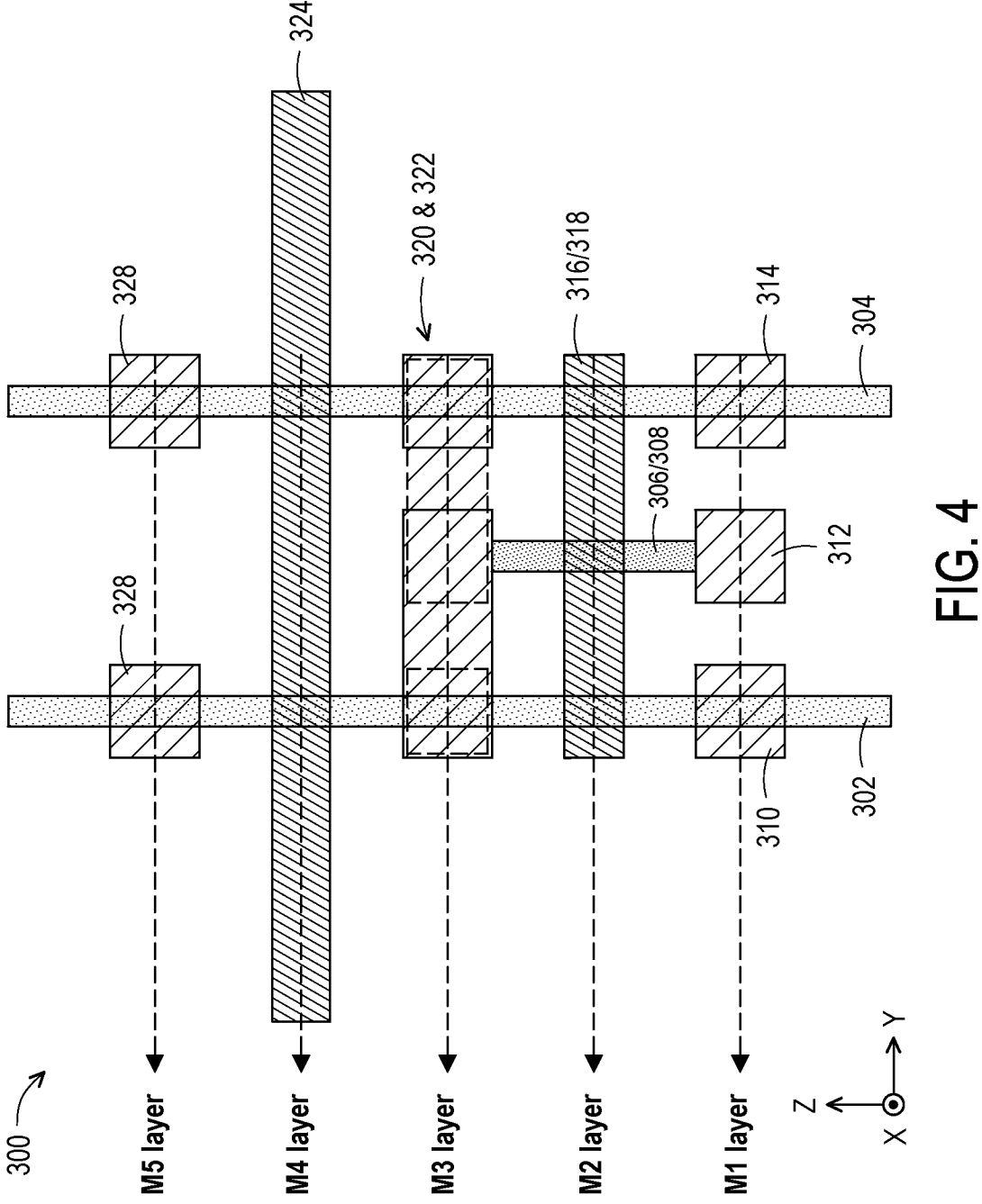
FIG. 4 illustrates a cross-sectional view of the memory cell of FIG. 3, in accordance with some embodiments.

FIG. 4 illustrates a cross-sectional view of the memory device 300 shown in FIG. 3, in accordance with various embodiments. It should be noted that the cross-sectional view of FIG. 4 may include multiple cross-sections cut along the Y direction combined together. For example, the channel 302 extends across the metal tracks 310, 316, 320, 324, and 326 (in a first cross-section cut in the Y direction); and the channel 304 (shifted away from the channel 302 in the X direction) extends across the metal tracks 314, 318, 322, 324, and 328 (in a second cross-section cut in the Y direction). Correspondingly, the channel 306 extends across the metal tracks 312, 316, and 320 (in the first cross-section); and the channel 308 (shifted away from the channel 306 in the X direction) extends across the metal tracks 312, 318, and 322 (in the second cross-section). The metal tracks 310 to 314 are disposed in the M1 layer; the metal tracks 316 and 318 are disposed in the M2 layer; the metal tracks 320 and 322 are disposed in the M3 layer; the metal track 324 is disposed in the M4 layer; and the metal tracks 326 and 328 are disposed in the M5 layer.

FIG. 5 illustrates a flow chart of an example method 500 for fabricating a semiconductor (e.g., memory) device, in accordance with various embodiments. For example, at least some of the operations (or steps) of the method 500 can be used to form the memory device 300 shown in FIG. 3. It is noted that the method 500 is merely an example, and is not intended to limit the present disclosure. Accordingly, it is understood that additional operations may be provided before, during, and after the method 500 of FIG. 5, and that some other operations may only be briefly described herein. In some embodiments, operations of the method 500 may be associated with perspective views, top views, cutaway views, or cross-sectional views of the memory device 300 at various fabrication stages as shown in FIGS. 6A, 6B, 7A, 7B, 8A, 8B, 9A, 9B, 9C, 10A, 10B, 11A, 11B, 12A, 12B, and 12C, respectively, which will be discussed in further detail below.

In brief overview, the method 500 starts with operation 502 of forming first, second, and third metal tracks in a first metallization layer. The method 500 proceeds to operation 504 of forming fourth and fifth metal tracks in a second metallization layer. The method 500 proceeds to operation 506 of forming sixth and seventh metal tracks in a third metallization layer. The method 500 proceeds to operation 508 of forming first and second p-type channels vertically extending through the first to third metallization layers. The method 500 proceeds to operation 510 of forming an eighth metal track in a fourth metallization layer. The method 500 proceeds to operation 512 of forming ninth and tenth metal tracks in a fifth metallization layer. The method 500 proceeds to operation 514 of forming first and second n-type channels vertically extending through the first to fifth metallization layers.

Figures 6A, 6B:
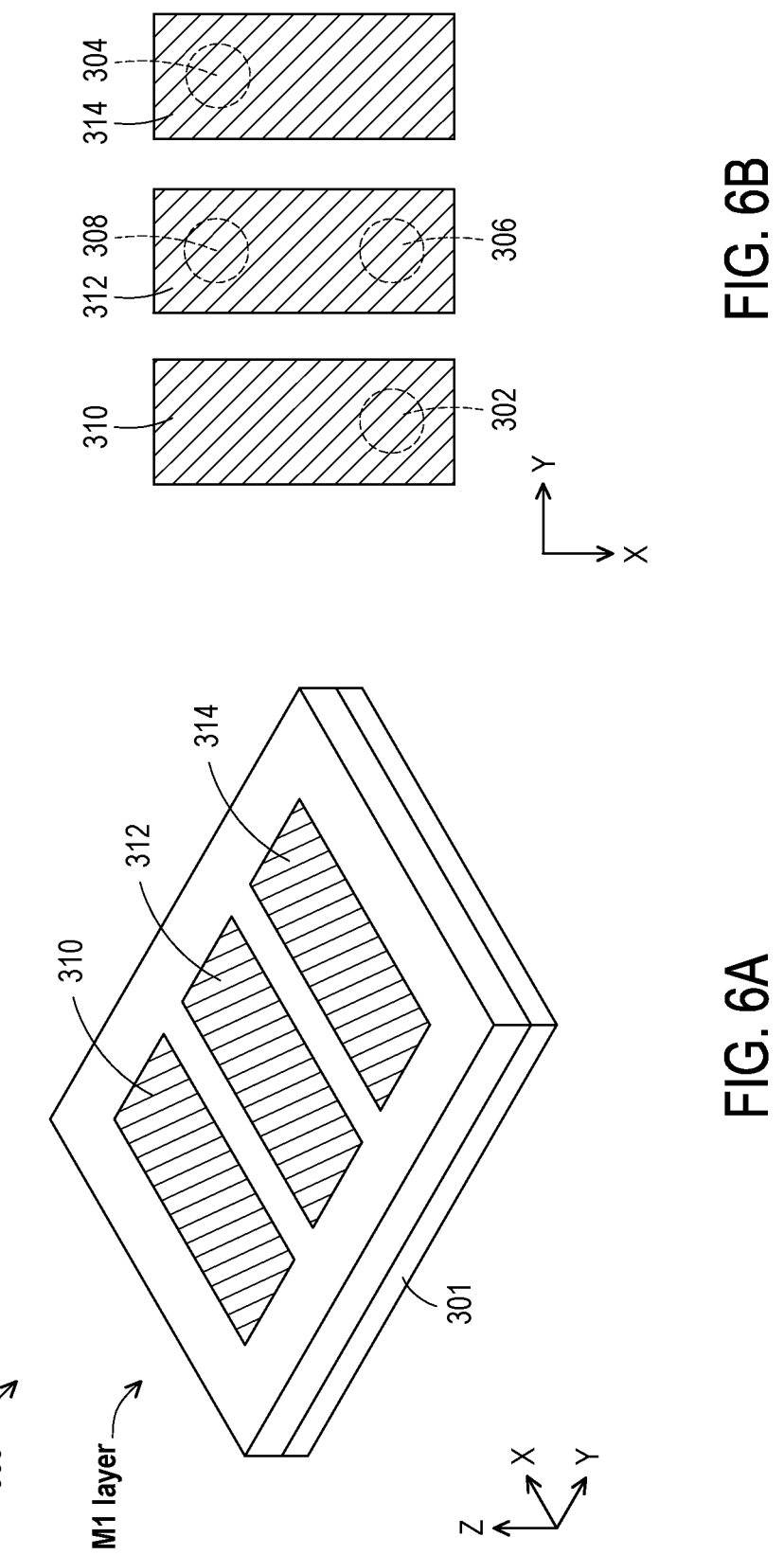
FIGS. 6A, 6B, 7A, 7B, 8A, 8B, 9A, 9B, 9C, 10A, 10B, 11A, 11B, 12A, 12B, and 12C illustrate perspective views, top views, cutaway views, or cross-sectional views of the memory device shown in FIG. 3 during various fabrication stages, in accordance with some embodiments.

Corresponding to operation 502 of FIG. 5, FIG. 6A and FIG. 6B are a perspective view and a top view of the memory device 300 including the metal track 310, 312, and 314 at one of the various stages of fabrication, respectively.

As shown, the metal tracks 310, 312, and 314 are formed in a first metallization layer (sometimes referred to as a first Inter-Metal Dielectric layer, a first Inter-Layer Dielectric layer, or an M1 layer) over a substrate 301. The M1 layer may be a bottommost or any one of a plural number of metallization layers disposed above the substrate 301, in some embodiments. Each of the metallization layers may include a respective set of metal tracks embedded in a dielectric or isolation material. The metal tracks, 310 to 314, are disposed in parallel with each other, and extend along the X direction, as illustrated in the top view of FIG. 6B. Respective footprints of the channels 302, 304, 306, and 308 are also shown in FIG. 6B as a reference. It should be noted that the channels 302, 304, 306, and 308 may have not been formed in the current fabrication stage.

The substrate 301 may be a semiconductor substrate, such as a bulk semiconductor, a semiconductor-on-insulator (SOI) substrate, or the like, which may be doped (e.g., with a p-type or an n-type dopant) or undoped. The substrate 301 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 301 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The metal tracks, 310 to 314, may be formed through any suitable process (such as deposition, damascene, dual damascene, etc.) in a dielectric material of the M1 layer. The metal tracks 310 to 314 may be formed of one or more first metal materials such as, for example, titanium nitride (TiN), tantalum nitride (TaN), or the like. The dielectric material of the M1 layer may have a low dielectric constant (k value) lower than 3.8, lower than about 3.0, or lower than about 2.5, for example. For example, the dielectric material of the M1 layer may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), Methyl SilsesQuioxane (MSQ), or the like.

Figures 7A, 7B:
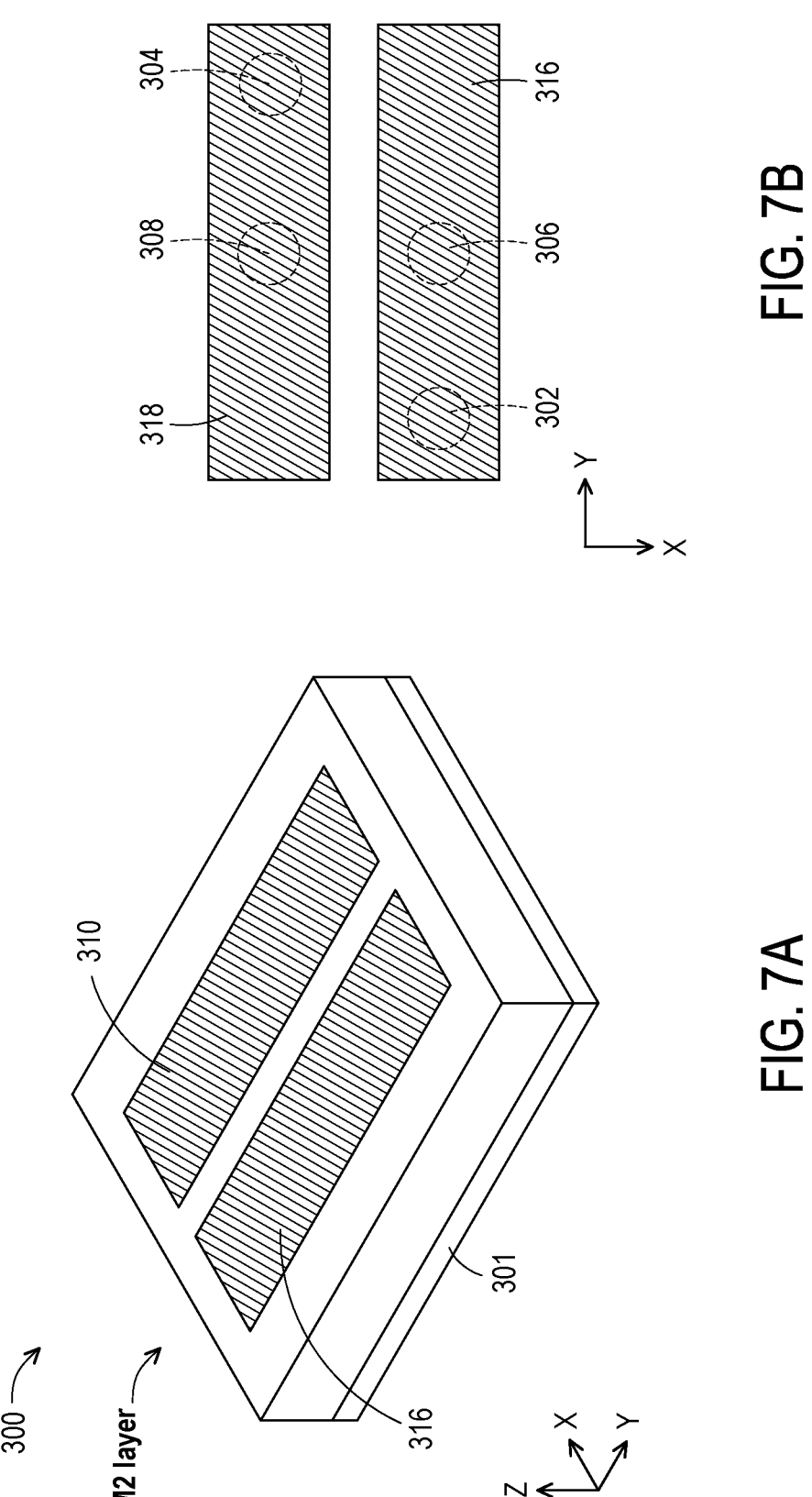

Corresponding to operation 504 of FIG. 5, FIG. 7A and FIG. 7B are a perspective view and a top view of the memory device 300 including the metal tracks 316 and 318 at one of the various stages of fabrication, respectively.

As shown, the metal tracks 316 and 318 are formed in a second metallization layer (sometimes referred to as a second Inter-Metal Dielectric layer, a second Inter-Layer Dielectric layer, or an M2 layer) over the M1 layer (FIG. 6A). The M2 layer may be the next upper layer with respect to the M1 layer. The metal tracks, 316 to 318, are disposed in parallel with each other, and extend along the Y direction, as illustrated in the top view of FIG. 7B. Respective footprints of the channels 302, 304, 306, and 308 are also shown in FIG. 7B as a reference. It should be noted that the channels 302, 304, 306, and 308 may have not been formed in the current fabrication stage.

The metal tracks, 316 to 318, may be formed through any suitable process (such as deposition, damascene, dual damascene, etc.) in a dielectric material of the M2 layer. The metal tracks 316 to 318 may be formed of one or more second metal materials (different from the first metal material of the metal tracks 310 to 314) such as, for example, nickel (Ni), ruthenium (Ru), or the like. However, the metal tracks 316 to 318 may include other metal materials (e.g., tungsten (W), copper (Cu), aluminum (Al), iron (Fe), zinc (Zn), cobalt (Co), lead (Pb), gold (Au), platinum (Pt), etc.), while remaining within the scope of the present disclosure. The dielectric material of the M2 layer may have a low dielectric constant (k value) lower than 3.8, lower than about 3.0, or lower than about 2.5, for example. For example, the dielectric material of the M2 layer may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), Methyl SilsesQuioxane (MSQ), or the like.

Figures 8A, 8B:
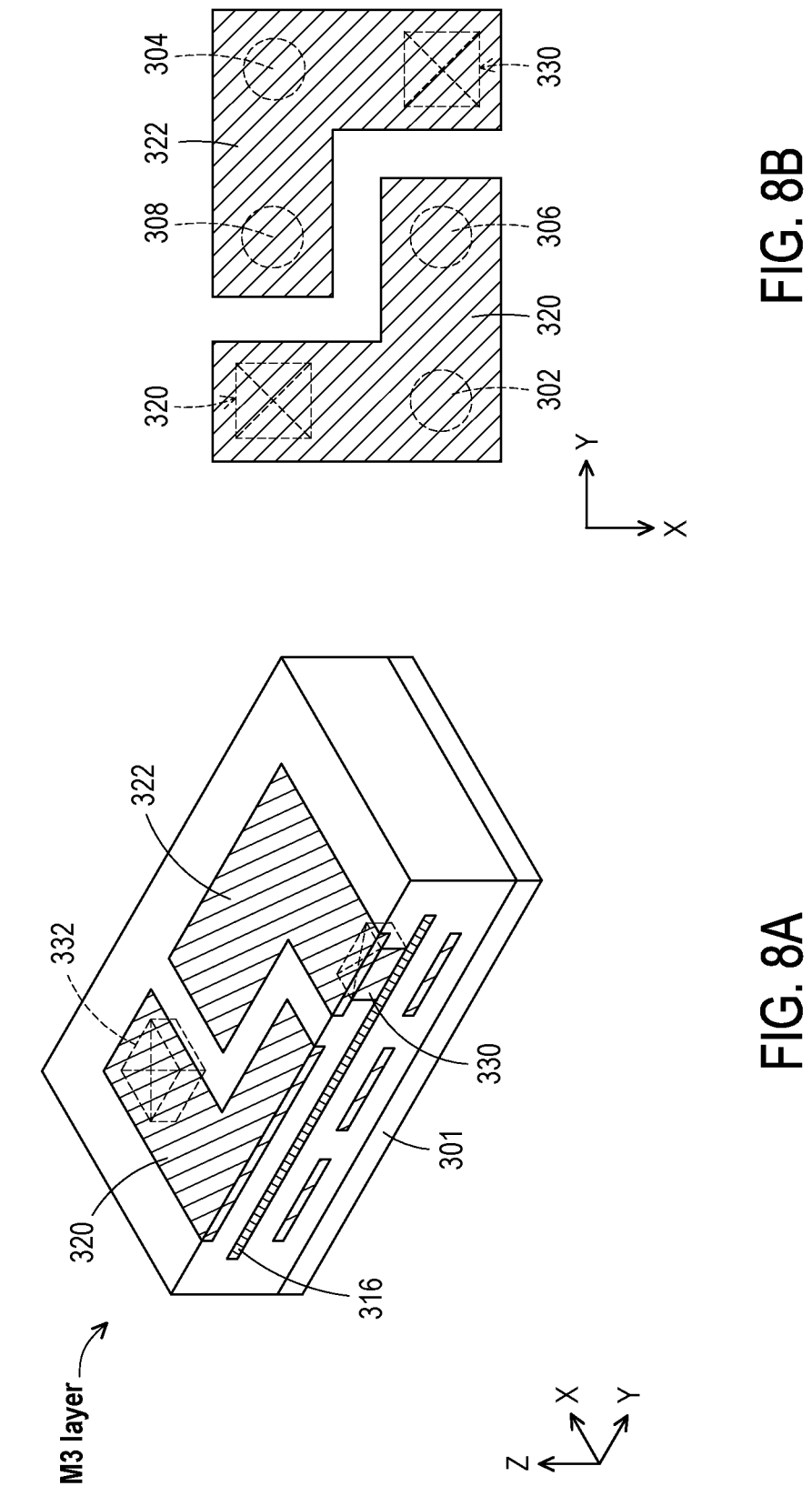

Corresponding to operation 506 of FIG. 5, FIG. 8A and FIG. 8B are a cutaway view and a top view of the memory device 300 including the metal tracks 320 and 322 at one of the various stages of fabrication, respectively. Further, prior to or concurrently with forming the metal tracks 320 and 322, the via structures 330 and 332 may be formed, respective footprints of which are marked as "X" in FIGS. 8A-B.

As shown, the metal tracks 320 and 322 are formed in a third metallization layer (sometimes referred to as a third Inter-Metal Dielectric layer, a third Inter-Layer Dielectric layer, or an M3 layer) over the M2 layer. The M3 layer may be the next upper layer with respect to the M2 layer. The metal tracks, 320 to 322, are each formed in an L-shape, as illustrated in the top view of FIG. 8B. Specifically, the metal tracks 320 and 322 each include a first portion extending in the X direction and a second portion extending in the Y direction, where the first portion of the metal track 320 is aligned with the second portion of the metal track 322 along the Y direction and the second portion of the metal track 320 is aligned with the first portion of the metal track 322 along the Y direction. Respective footprints of the channels 302, 304, 306, and 308 are also shown in FIG. 8B as a reference. It should be noted that the channels 302, 304, 306, and 308 may have not been formed in the current fabrication stage.

The metal tracks, 320 to 322, and the corresponding via structures, 332 and 330, may be formed through any suitable process (such as deposition, damascene, dual damascene, etc.) in a dielectric material of the M3 layer. The metal tracks 320 to 322 and the via structures 330 to 332 may be formed of one or more of the first metal materials such as, for example, titanium nitride (TiN), tantalum nitride (TaN), or the like. The dielectric material of the M3 layer may have a low dielectric constant (k value) lower than 3.8, lower than about 3.0, or lower than about 2.5, for example. For example, the dielectric material of the M3 layer may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), Methyl SilsesQuioxane (MSQ), or the like.

Corresponding to operation 508 of FIG. 5, FIG. 9A, FIG. 9B, and FIG. 9C are a perspective view, a top view, and a cutaway view of the memory device 300 including the channels 306 and 308 at one of the various stages of fabrication, respectively.

Figures 9A, 9B:
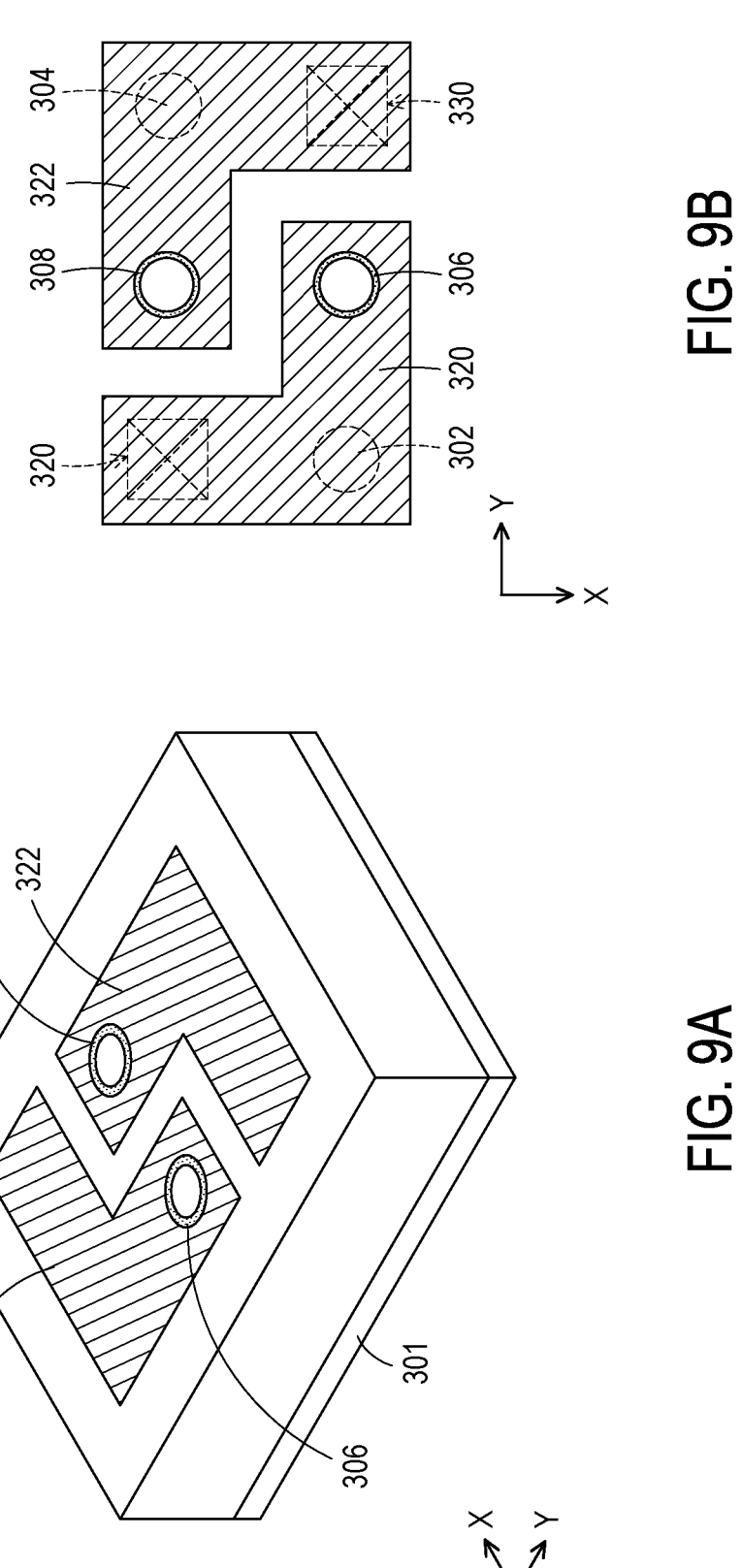
Figure 9C:
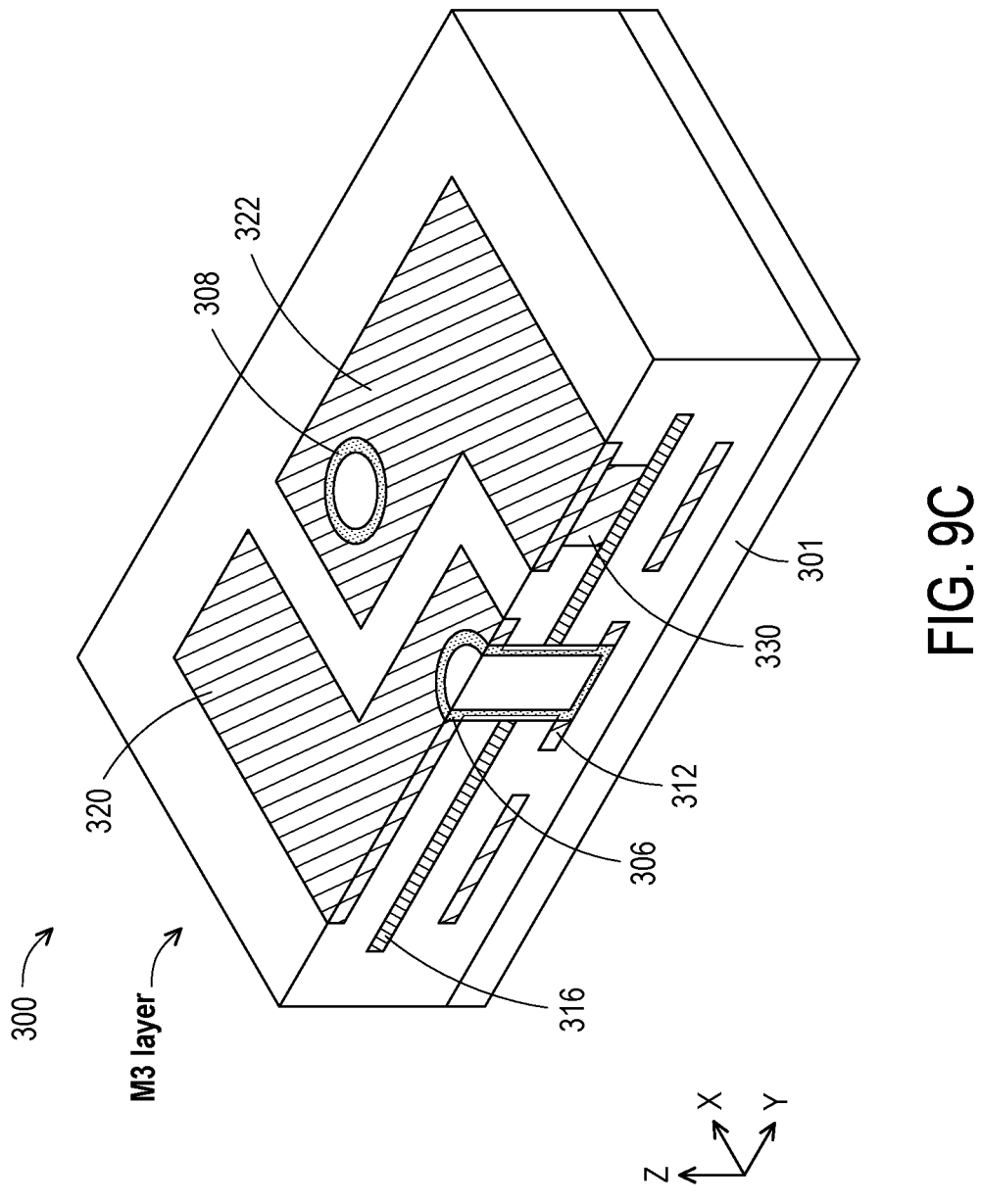

As shown in the example of FIGS. 9A-C, the channels 306 and 308 are each formed as a tube-like structure. Specifically, the channel 306 is formed as a relatively thin layer surrounding the inner sidewall of a vertical opening extending from the metal track 312, through the metal track 316, and to the metal track 320; and the channel 308 is also formed as a relatively thin layer surrounding the inner sidewall of a vertical opening extending from the metal track 312, through the metal track 318, and to the metal track 322. In other words, the channels 306 and 308 each vertically extend across the M1 layer, M2 layer, and M3 layer. In some embodiments, an inner opening of each of such tube-like channels 306 and 308 may be filled with the same dielectric material of the M1 to M3 layers. In some other embodiments, the channels 306 and 308 may each be formed as a pillar-like structure, i.e., without an inner opening. Respective footprints of the channels 302 and 304 are also shown in FIG. 9B as a reference. It should be noted that the channels 302 and 304 may have not been formed in the current fabrication stage.

In some embodiments, prior to forming the channels 306 and 308, the inner sidewall of each of the vertical openings may be first lined with a high-k dielectric material. The high-k dielectric material may serve as a gate dielectric of the corresponding VGAA transistor (e.g., the transistors M2 and M4 shown in FIG. 3). Examples of the high-k dielectric material include $HfO_2$, $Al_2O_3$, $Ln_2O_3$, $TiO_2$, $HfZrO$, $Ta_2O_3$, $HfSiO_4$, $ZrO_2$, $ZrSiO_2$, combinations thereof, or other suitable material. The high-k dielectric material may be formed by atomic layer deposition (ALD) and/or other suitable methods.

To form the channels 306 and 308, an anisotropic etching process may be performed to form the respective vertical openings based on the footprints of the channels 306 and 308. Such footprints can be defined by one or more patterned layers (e.g., a hardmask layer, a photoresist layer, etc.). The etching process may include, for example, a reactive ion etch (RIE) process, a neutral beam etch (NBE) process, combinations thereof, or any other suitable process. The etching process may not stop until at least some portions of the metal track 312 have been etched or at least exposed. In some embodiments, the metal track 312 may be etched through the etching process. After forming the vertical openings, the high-k dielectric material may be first formed, followed by the deposition of the channels 306 and 308. In one embodiment, the channels 306 and 308 may be formed through ALD, resulting in the tube-like structures. In another embodiment, the channels 306 and 308 may be formed through chemical vapor deposition (CVD) or physical vapor deposition (PVD), resulting in the pillar-like structures.

The channels 306 and 308 are each formed with a p-type conductivity. In some embodiments, the channels 306 and 308 may be formed of one or more p-type semiconductive-behaving oxide materials such as, for example, CuO, SnO, oxides of the Delafossite group Cu—X—O with or without doping, etc. In some other embodiments, the channels 306 and 308 may be formed of one or more p-type 2D materials such as, for example, transition metal dichalcogenide (TMD) material, graphene, etc. The 2D material generally refers to crystalline solids consisting of a single layer of atoms. The single layer of atoms can be derived from single elements or multiple elements. The 2D material may include a compound of transition metal atoms (Mo, W, Ti, or the like) and chalcogen atoms (S, Se, Te, or the like) such as, for example, $WS_2$, $WSe_2$, $WTe_2$, $MoS_2$, $MoSe_2$, $MoTe_2$, $HfS_2$, $ZrS_2$, and $TiS_2$, GaSe, InSe, phosphorene, and other similar materials.

Figures 10A, 10B:
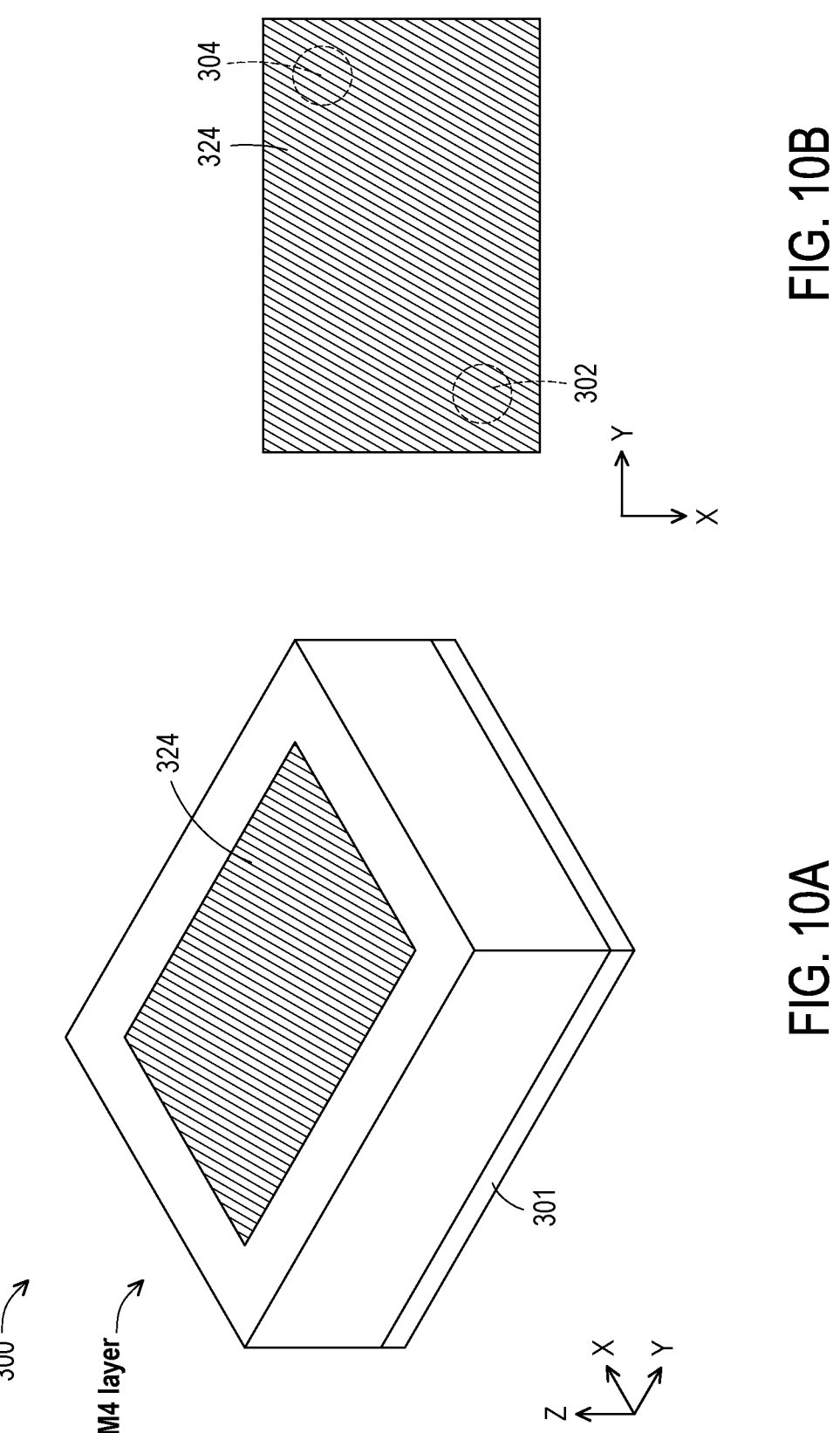

Corresponding to operation 510 of FIG. 5, FIG. 10A and FIG. 10B are a perspective view and a top view of the memory device 300 including the metal track 324 at one of the various stages of fabrication, respectively.

As shown, the metal track 324 is formed in a fourth metallization layer (sometimes referred to as a fourth Inter-Metal Dielectric layer, a fourth Inter-Layer Dielectric layer, or an M4 layer) over the M3 layer (FIG. 8A). The M4 layer may be the next upper layer with respect to the M3 layer. The metal track 324 extends along the Y direction, as illustrated in the top view of FIG. 10B. Respective footprints of the channels 302 and 304 are also shown in FIG. 10B as a reference. It should be noted that the channels 302 and 304 may have not been formed in the current fabrication stage.

The metal track 324 may be formed through any suitable process (such as deposition, damascene, dual damascene, etc.) in a dielectric material of the M4 layer. The metal track 324 may be formed of one or more of the second metal materials such as, for example, nickel (Ni), ruthenium (Ru), or the like. However, the metal track 334 may include other metal materials (e.g., tungsten (W), copper (Cu), aluminum (Al), iron (Fe), zinc (Zn), cobalt (Co), lead (Pb), gold (Au), platinum (Pt), etc.), while remaining within the scope of the present disclosure. The dielectric material of the M4 layer may have a low dielectric constant (k value) lower than 3.8, lower than about 3.0, or lower than about 2.5, for example. For example, the dielectric material of the M4 layer may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), Methyl SilsesQuioxane (MSQ), or the like.

Figures 11A, 11B:
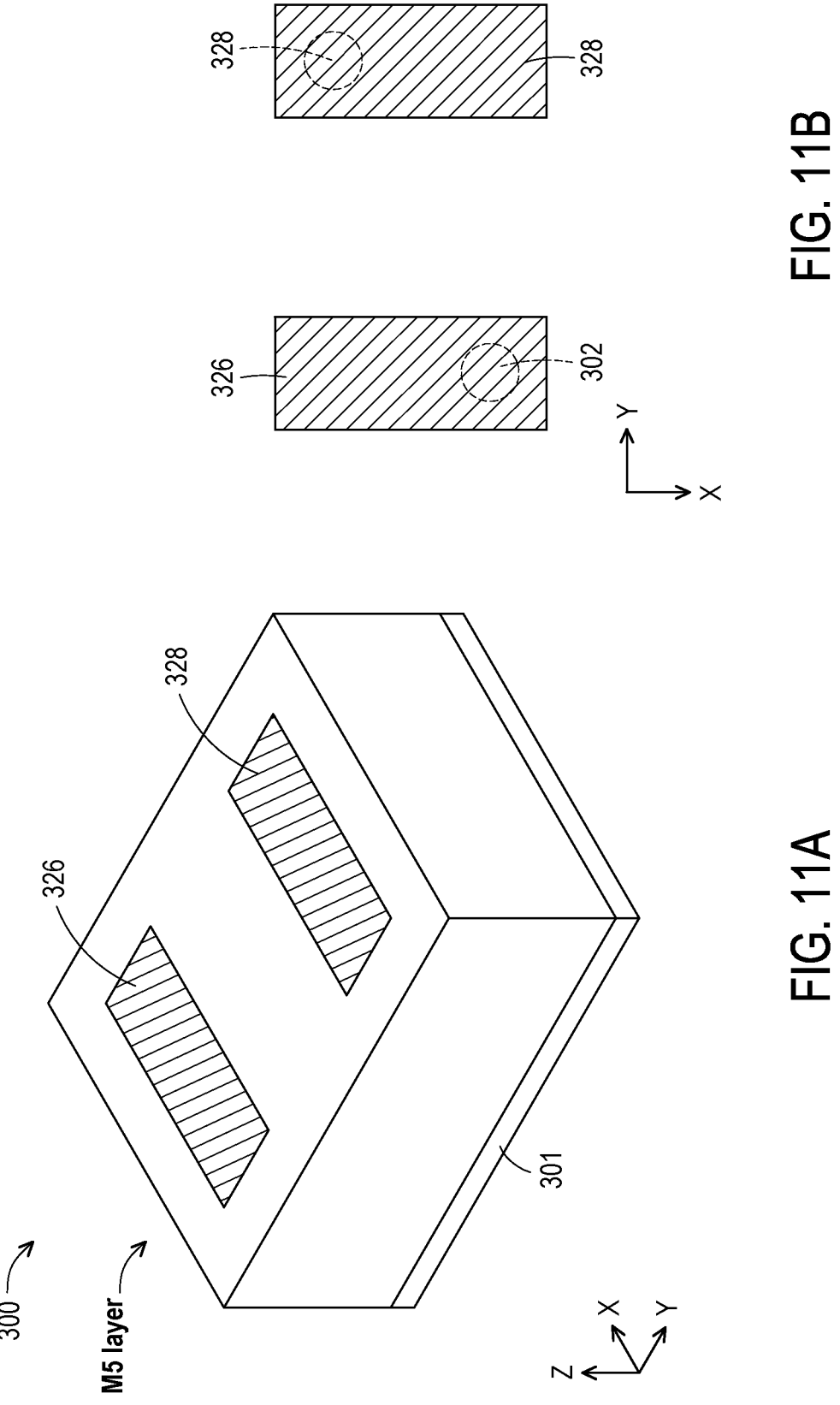

Corresponding to operation 512 of FIG. 5, FIG. 11A and FIG. 11B are a perspective view and a top view of the memory device 300 including the metal tracks 326 and 328 at one of the various stages of fabrication, respectively.

As shown, the metal tracks 326 and 328 are formed in a fifth metallization layer (sometimes referred to as a fifth Inter-Metal Dielectric layer, a fifth Inter-Layer Dielectric layer, or an M5 layer) over the M4 layer (FIG. 10A). The M5 layer may be the next upper layer with respect to the M4 layer. The metal tracks, 326 to 328, are disposed in parallel with each other, and extend along the X direction, as illustrated in the top view of FIG. 11B. Respective footprints of the channels 302 and 304 are also shown in FIG. 11B as a reference. It should be noted that the channels 302 and 304 may have not been formed in the current fabrication stage.

The metal tracks, 326 to 328, may be formed through any suitable process (such as deposition, damascene, dual damascene, etc.) in a dielectric material of the M5 layer. The metal tracks 326 to 328 may be formed of one or more of the first metal materials such as, for example, titanium nitride (TiN), tantalum nitride (TaN), or the like. The dielectric material of the M5 layer may have a low dielectric constant (k value) lower than 3.8, lower than about 3.0, or lower than about 2.5, for example. For example, the dielectric material of the M5 layer may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), Methyl SilsesQuioxane (MSQ), or the like.

Corresponding to operation 514 of FIG. 5, FIG. 12A, FIG. 12B, and FIG. 12C are a cutaway view, a top view, and a cross-sectional view of the memory device 300 including the channels 302 and 304 at one of the various stages of fabrication, respectively.

Figure 12A:
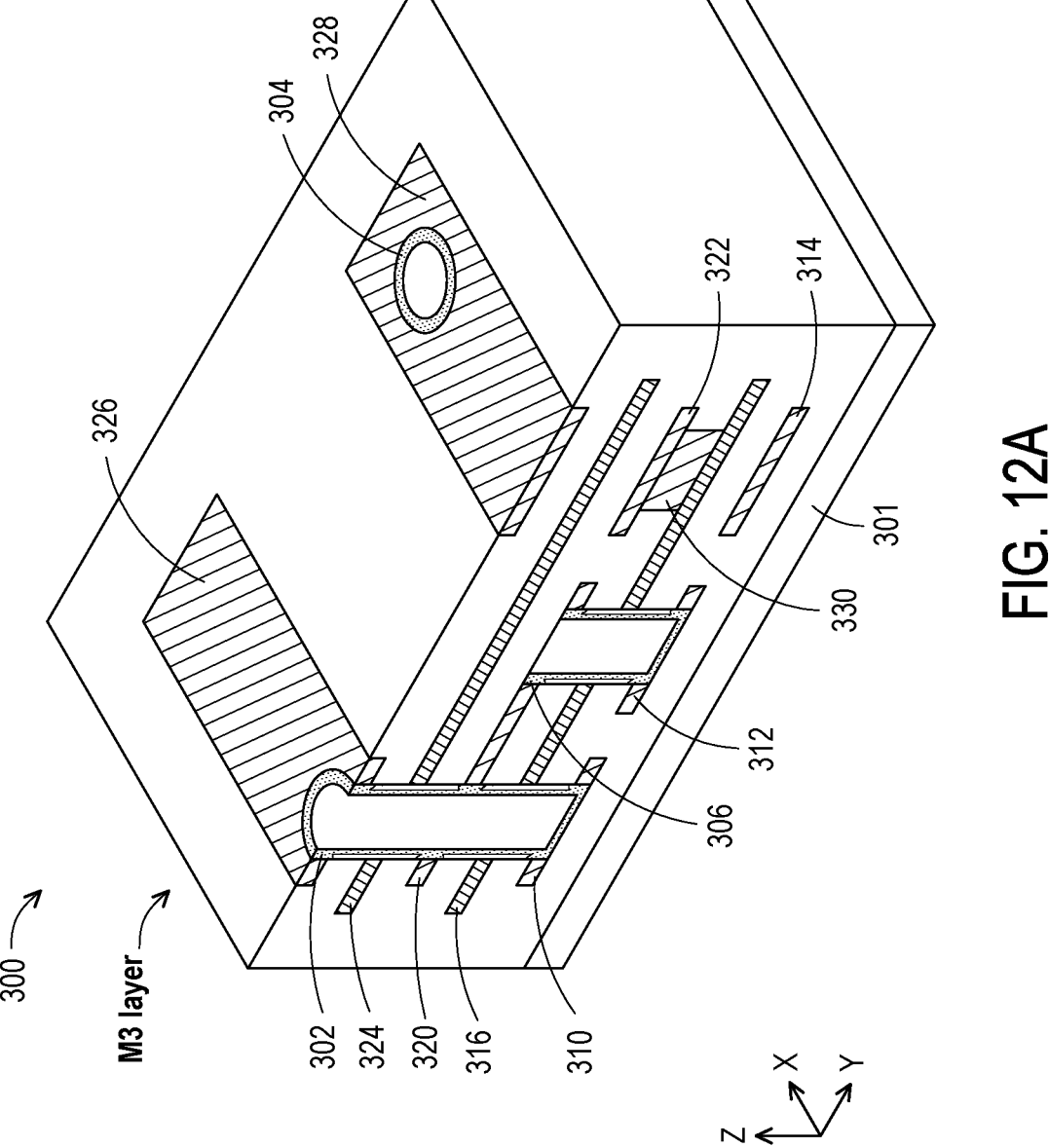
Figure 12B:
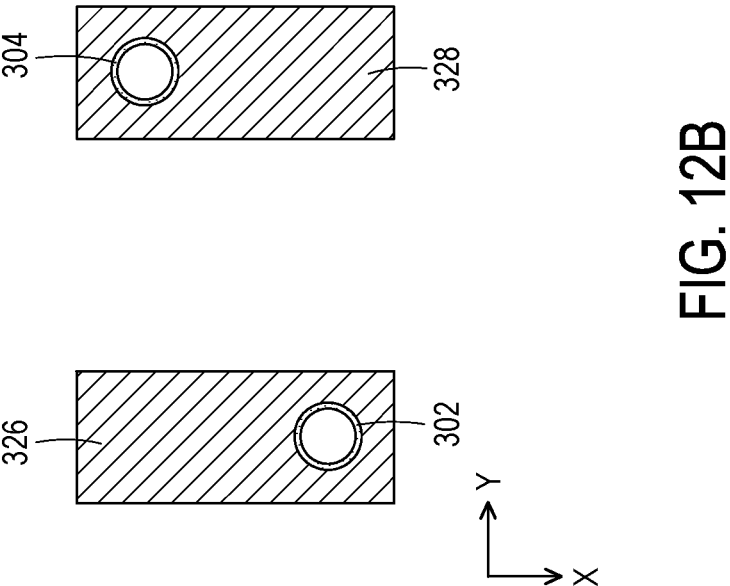
Figure 12C:
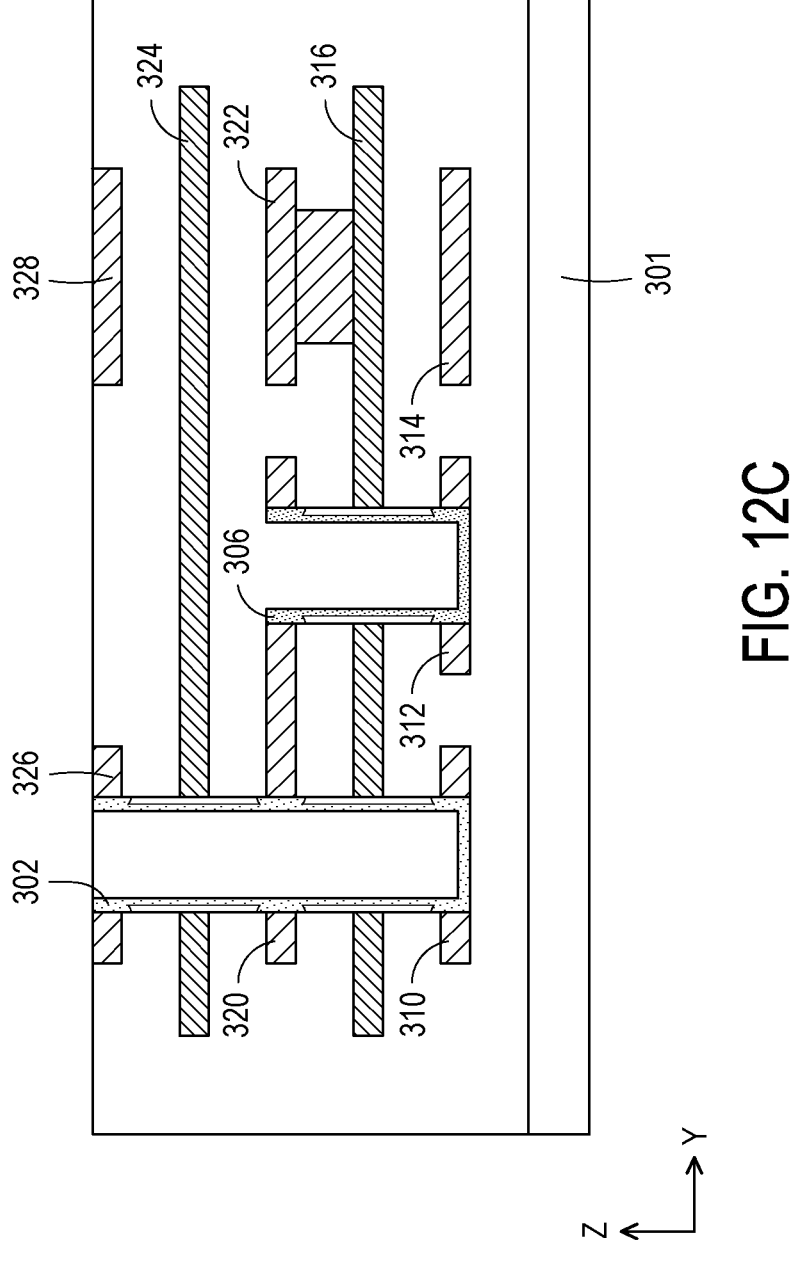

As shown in the example of FIGS. 12A-C, the channels 302 and 304 are each formed as a tube-like structure. Specifically, the channel 302 is formed as a relatively thin layer surrounding the inner sidewall of a vertical opening extending from the metal track 310, through the metal tracks 316, 320, and 324, and to the metal track 326; and the channel 304 is also formed as a relatively thin layer surrounding the inner sidewall of a vertical opening extending from the metal track 314, through the metal tracks 318, 322, and 324, and to the metal track 328. In other words, the channels 302 and 304 each vertically extend across the M1 layer, M2 layer, M3 layer, M4 layer, and M5 layer. In some embodiments, an inner opening of each of such tube-like channels 302 and 304 may be filled with the same dielectric material of the M1 to M5 layers. In some other embodiments, the channels 302 and 304 may each be formed as a pillar-like structure, i.e., without an inner opening.

Similar to the formation of the channels 306 and 308, prior to forming the channels 302 and 304, the inner sidewall of each of the vertical openings may be first lined with a high-k dielectric material. The high-k dielectric material may serve as a gate dielectric of the corresponding VGAA transistor (e.g., the transistors M1, M5, M3, and M6 shown in FIG. 3). Examples of the high-k dielectric material include $HfO_2$, $Al_2O_3$, $Ln_2O_3$, $TiO_2$, HfZrO, $Ta_2O_3$, $HfSiO_4$, $ZrO_2$, $ZrSiO_2$, combinations thereof, or other suitable material. The high-k dielectric material may be formed by atomic layer deposition (ALD) and/or other suitable methods.

To form the channels 302 and 304, an anisotropic etching process may be performed to form the respective vertical openings based on the footprints of the channels 302 and 304. Such footprints can be defined by one or more patterned layers (e.g., a hardmask layer, a photoresist layer, etc.). The etching process may include, for example, a reactive ion etch (RIE) process, a neutral beam etch (NBE) process, combinations thereof, or any other suitable process. The etching process may not stop until at least some portions of the metal tracks 310 and 314 have been etched or at least exposed. In some embodiments, the metal tracks 310 and 314 may be etched through the etching process. After forming the vertical openings, the high-k dielectric material may be first formed, followed by the deposition of the channels 302 and 304. In one embodiment, the channels 302 and 304 may be formed through ALD, resulting in the tube-like structures. In another embodiment, the channels 302 and 304 may be formed through chemical vapor deposition (CVD) or physical vapor deposition (PVD), resulting in the pillar-like structures.

The channels 302 and 304 are each formed with an n-type conductivity. In some embodiments, the channels 302 and 304 may be formed of one or more n-type semiconductive-behaving oxide materials such as, for example, IGZO, InZnO, InSnO, $SnO_2$, MgAlZnO, etc. In some other embodiments, the channels 302 and 304 may be formed of one or more n-type 2D materials such as, for example, transition metal dichalcogenide (TMD) material, graphene, etc. The 2D material generally refers to crystalline solids consisting of a single layer of atoms. The single layer of atoms can be derived from single elements or multiple elements. The 2D material may include a compound of transition metal atoms (Mo, W, Ti, or the like) and chalcogen atoms (S, Se, Te, or the like) such as, for example, $WS_2$, $WSe_2$, $WTe_2$, $MoS_2$, $MoSe_2$, $MoTe_2$, $HfS_2$, $ZrS_2$, and $TiS_2$, GaSe, InSe, phosphorene, and other similar materials.

Figure 13:
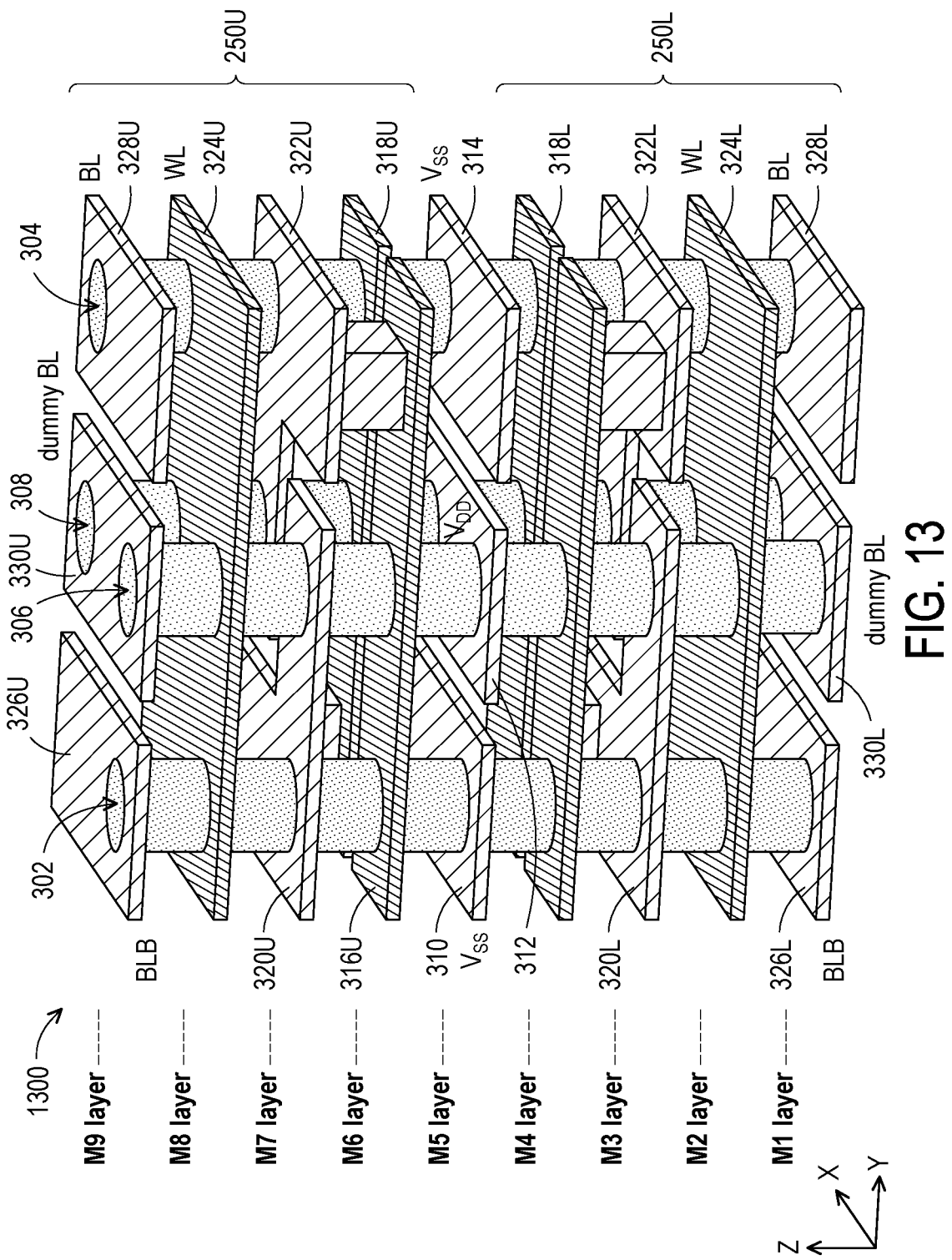
FIG. 13 illustrates a perspective view of a memory device including two of the memory cells of FIG. 2, in accordance with some embodiments.

Based on the method 500 of FIG. 5, a memory device including a plural number of the memory cells 250 (FIG. 2) can be formed. Further, without disadvantageously increasing area occupied, such multiple memory cells 250 can be vertically stacked on top of one another. FIG. 13 illustrates a perspective view of a memory device 1300 including multiple (e.g., 2) memory cells 250 stacked on top of one another, in accordance with various embodiments. Each of the memory cells 250, when being formed, is substantially similar to the memory device 300 shown in FIG. 3, except that one of the memory cells 250 is turned upside-down.

For example, an upper one of the two memory cells 250 (hereinafter "memory cell 250U") is formed almost identically to the memory device 300, while the lower one of the two memory cells 250 (hereinafter "memory cell 250L") is formed similarly the memory device 300 but being upside-down. In some embodiments, the upper memory cell 250U and the lower memory cell 250L may share the metal tracks that are configured to carry the supply voltage (e.g., VDD and VSS). Accordingly, in the following discussion of the memory device 1300, some of the reference numerals of the memory device 300 will again be used, but ended with "U" and "L" representing the upper memory cell 250U and the lower memory cell 250L, respectively.

As shown, the upper memory cell 250U and the lower memory cell 250L share the metal tracks 310, 312, and 314 that are configured to carry VSS, VDD, and VSS, respectively. Similar to the memory device 300 shown in FIG. 3, with respect to the (shared) metal tracks 310 to 314 along a positive way of the Z direction, the upper memory cell 250U includes metal tracks 316U, 318U, 320U, 322U, 324U, 326U, and 328U; and, along a negative way of the Z direction, the lower memory cell 250L includes metal tracks 316L, 318L, 320L, 322L, 324L, 326L, and 328L. In some embodiments, the metal tracks 326L and 328L may be disposed in an M1 layer; the metal track 324L may be disposed in an M2 layer; the metal tracks 320L and 322L may be disposed in an M3 layer; the metal tracks 316L and 318L may be disposed in an M4 layer; the shared metal tracks 310 to 314 may be disposed in an M5 layer; the metal tracks 316U and 318U may be disposed in an M6 layer; the metal tracks 320U and 322U may be disposed in an M7 layer; the metal track 324U may be disposed in an M8 layer; and the metal tracks 326U and 328U may be disposed in an M9 layer. In other words, such metal tracks of the lower memory cell 250L and the upper memory cell 250U are disposed across multiple metallization layers, as illustrated in FIG. 13.

The metal tracks 324U and 324L may operatively serve as the WLs of the upper memory cell 250U and the lower memory cell 250L, respectively. The metal track 316L may operatively serve as gate terminals of the pull-down transistor (transistor M1) and pull-up transistor (transistor M2) of the lower memory cell 250L; the metal track 318L may operatively serve as gate terminals of the pull-down transistor (transistor M3) and pull-up transistor (transistor M4) of the lower memory cell 250L; the metal track 316U may operatively serve as gate terminals of the pull-down transistor (transistor M1) and pull-up transistor (transistor M2) of the upper memory cell 250U; and the metal track 318U may operatively serve as gate terminals of the pull-down transistor (transistor M3) and pull-up transistor (transistor M4) of the upper memory cell 250U.

Different from the memory device 300 shown in FIG. 3, the upper memory cell 250U further includes a metal track 330U interposed between the metal tracks 326U and 328U; and the lower memory cell 250L further includes a metal track 330L interposed between the metal tracks 326L and 328L. With the metal tracks 310 to 314 configured to provide supply voltage to both of the lower memory cell 250L and upper memory cell 250U, the metal tracks 326U and 328U may operatively serve as the BLB and BL of the upper memory cell 250U; and the metal tracks 326L and 328L may operatively serve as the BLB and BL of the lower memory cell 250L. The metal tracks 330U and 330L may serve as dummy BLs (i.e., not electrically coupled to any active components of the memory cell 250U or 250L).

The channels 302 to 308 may each extend across the M1-M9 layers. Specifically, the n-type channel 302 may extend from the metal track 326L, through the metal tracks 324L, 320L, 316L, 310, 316U, 320U, and 324U, and to the metal track 326U; the n-type channel 304 may extend from the metal track 328L, through the metal tracks 324L, 322L, 318L, 314, 318U, 322U, and 324U, and to the metal track 328U; the p-type channel 306 may extend from the metal track 330L, through the metal tracks 324L, 320L, 316L, 312, 316U, 320U, and 324U, and to the metal track 330U; and the p-type channel 308 may extend from the metal track 330L, through the metal tracks 324L, 322L, 318L, 312, 318U, 322U, and 324U, and to the metal track 330U.

Figure 14:
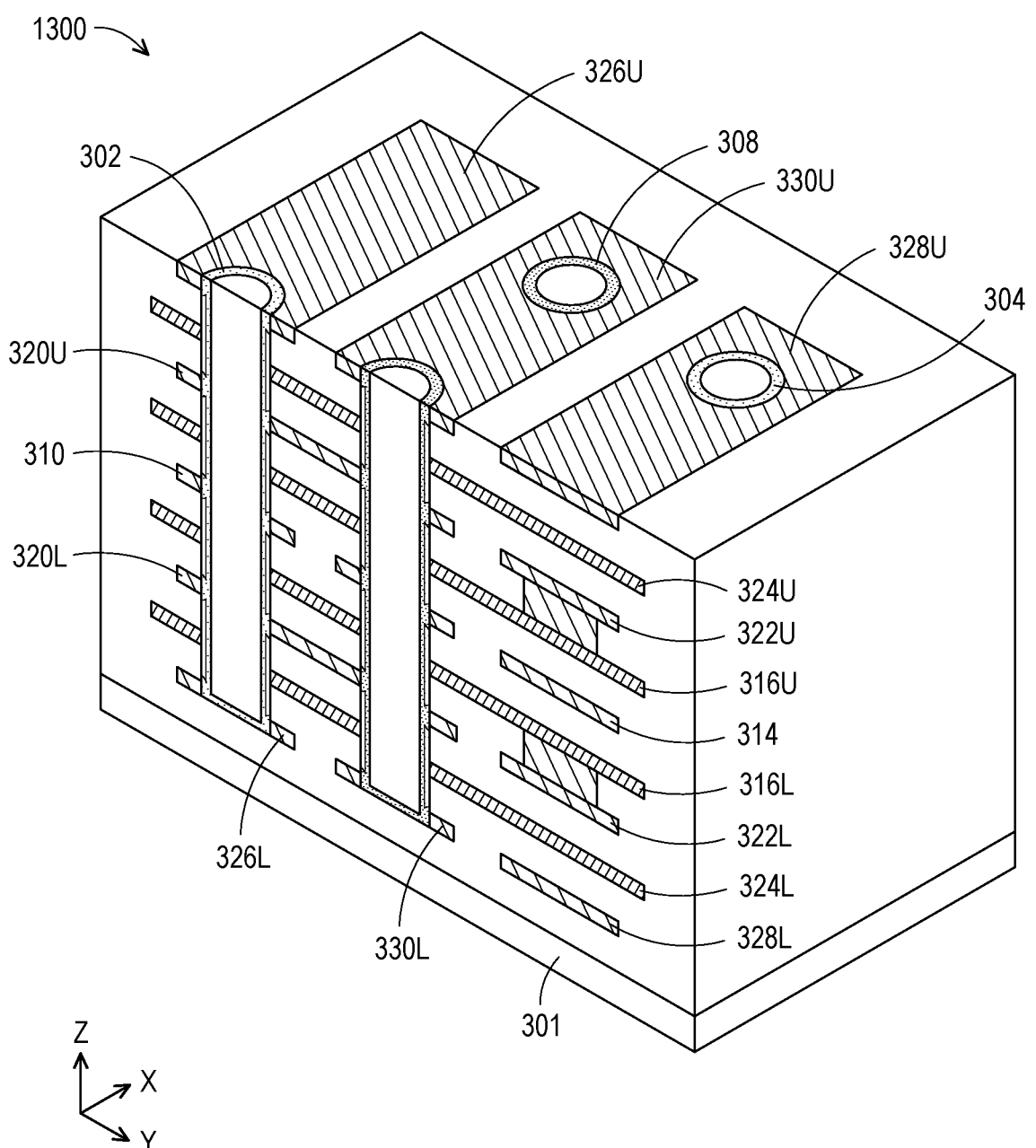
FIG. 14 illustrates a cutaway view of the two memory cells of FIG. 13, accordance with some embodiments.
Figure 15:
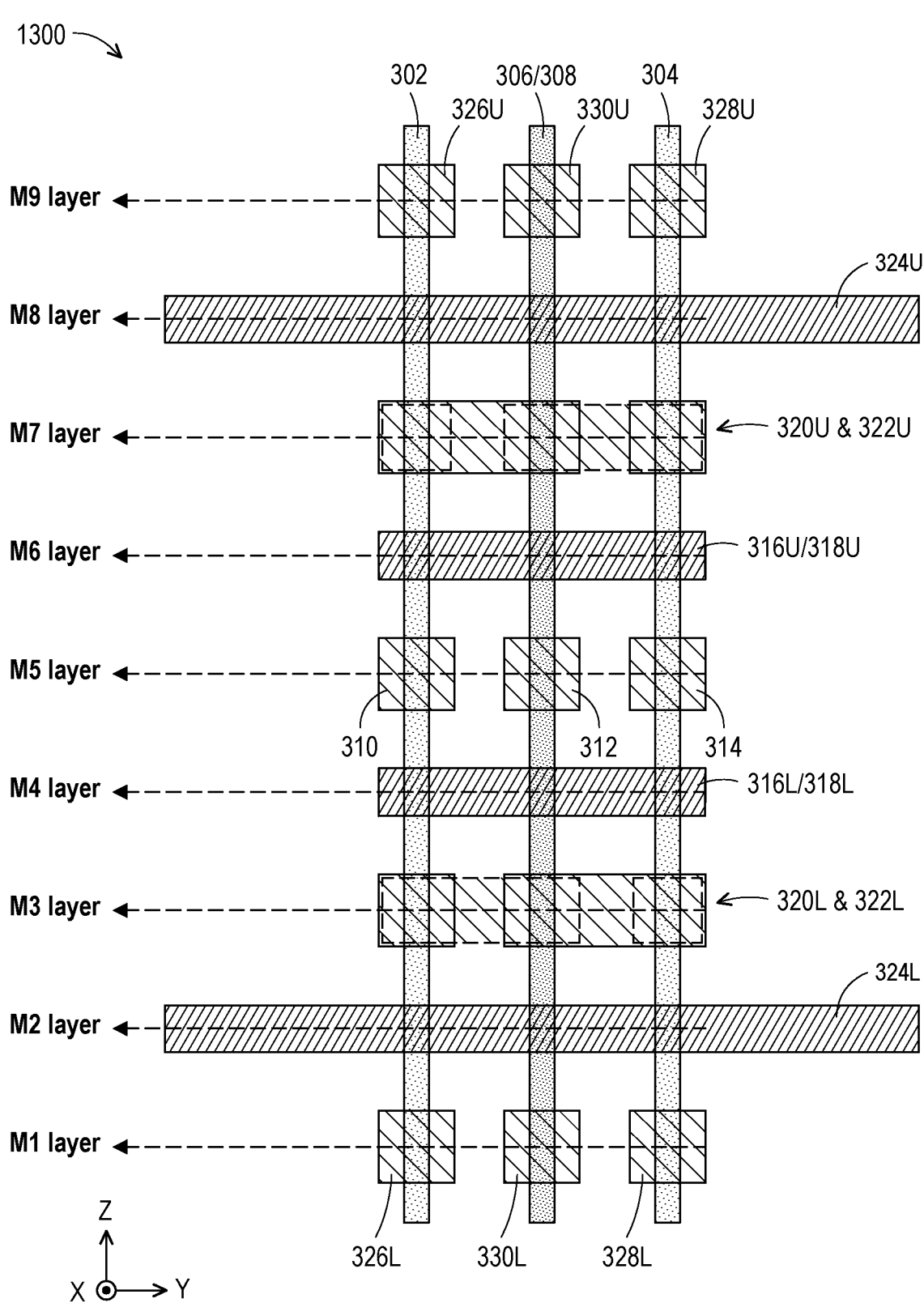
FIG. 15 illustrates a cross-sectional view of the two memory cells of FIG. 13, accordance with some embodiments.
Figures 17A, 17B:
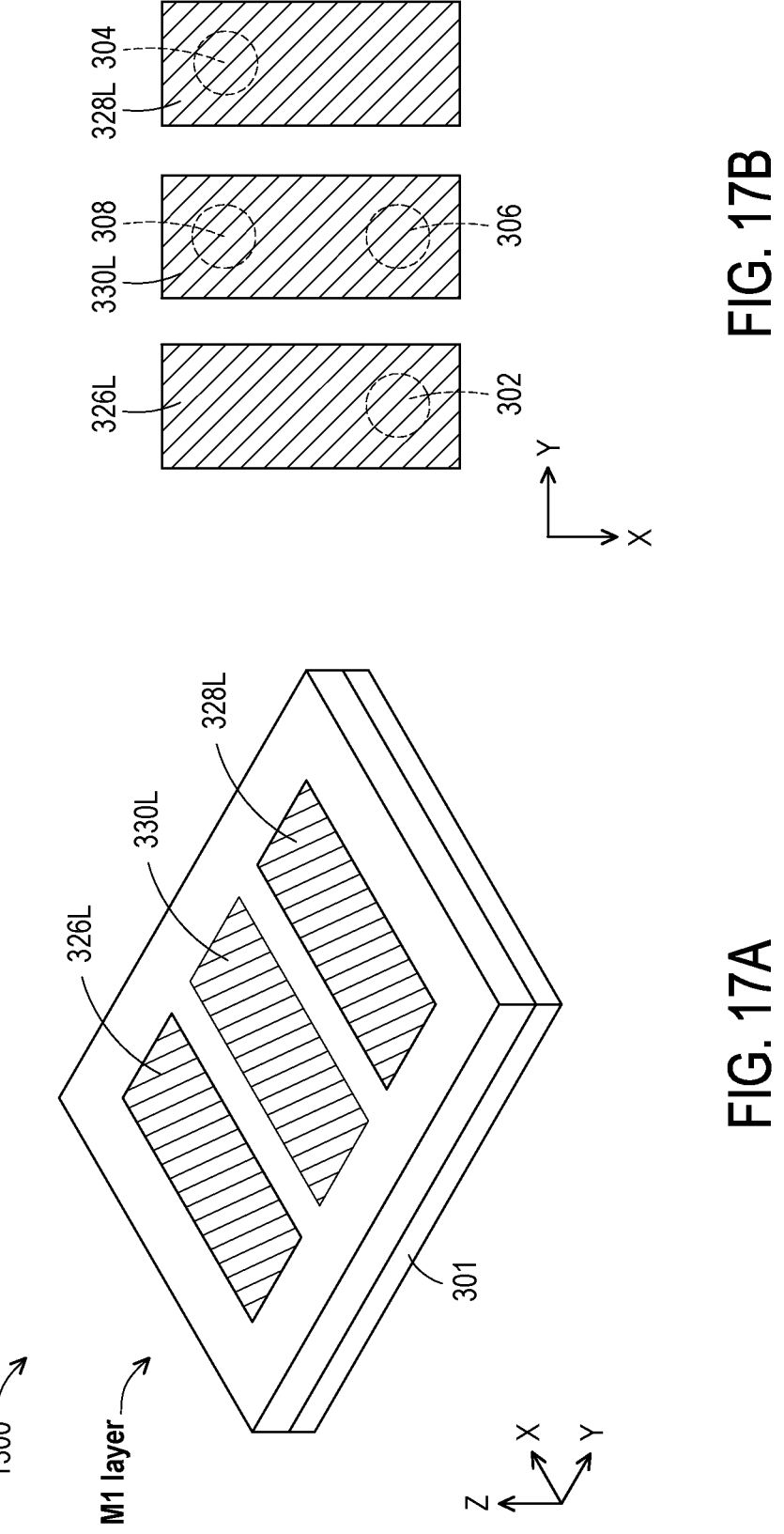
Figure 18B:
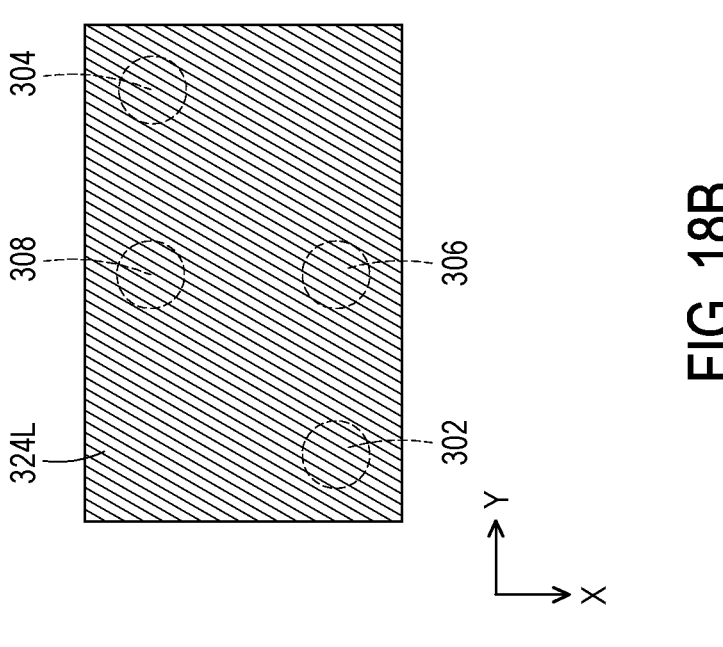
Figure 18A:
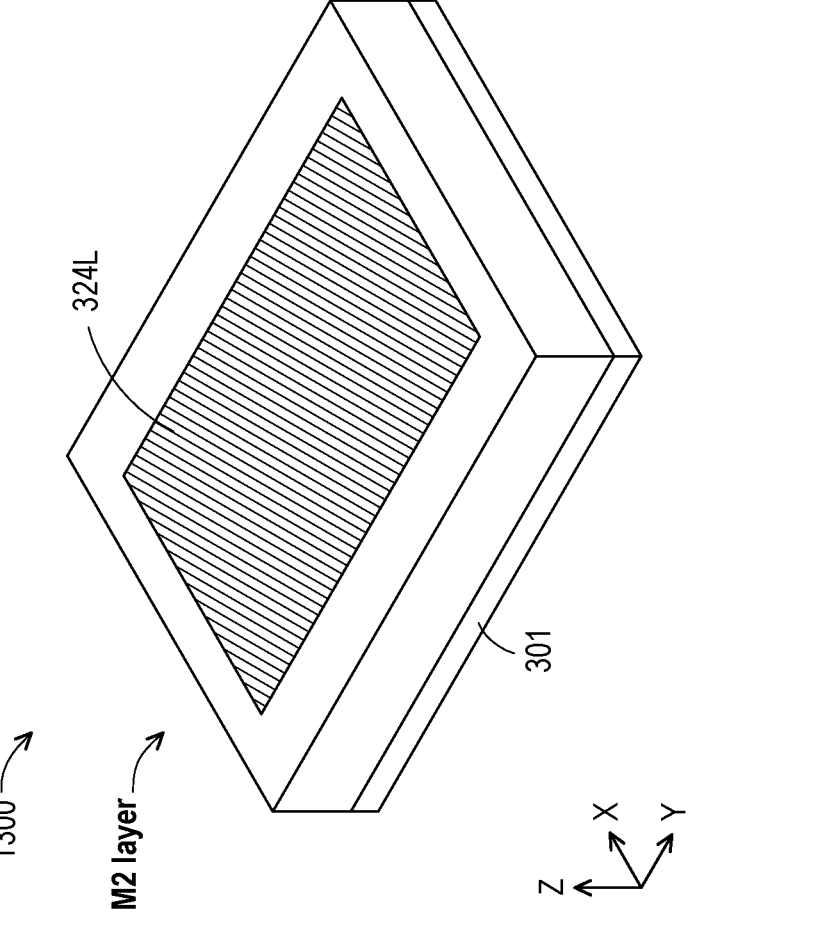
Figures 19A, 19B:
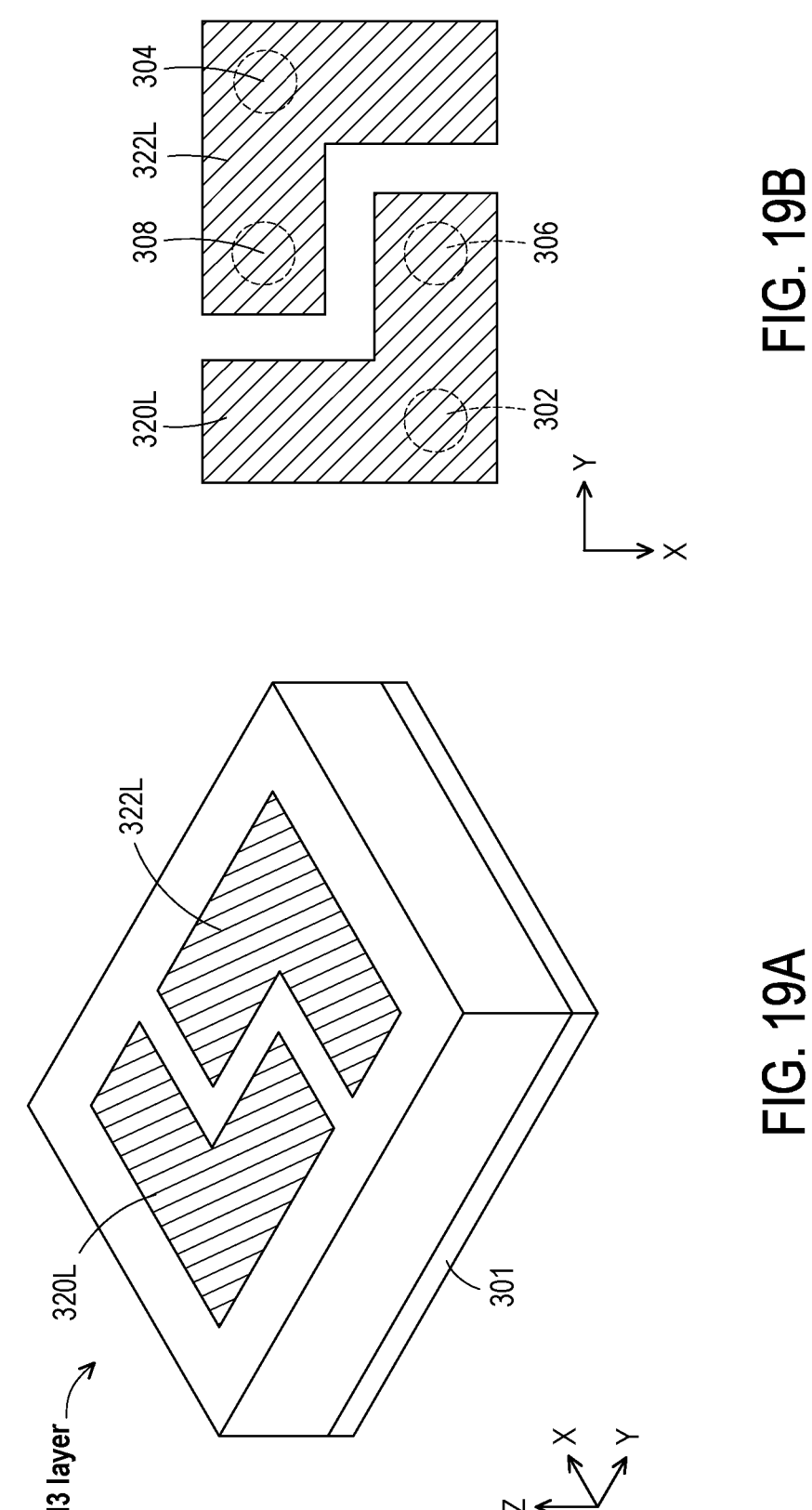
Figures 20A, 20B:
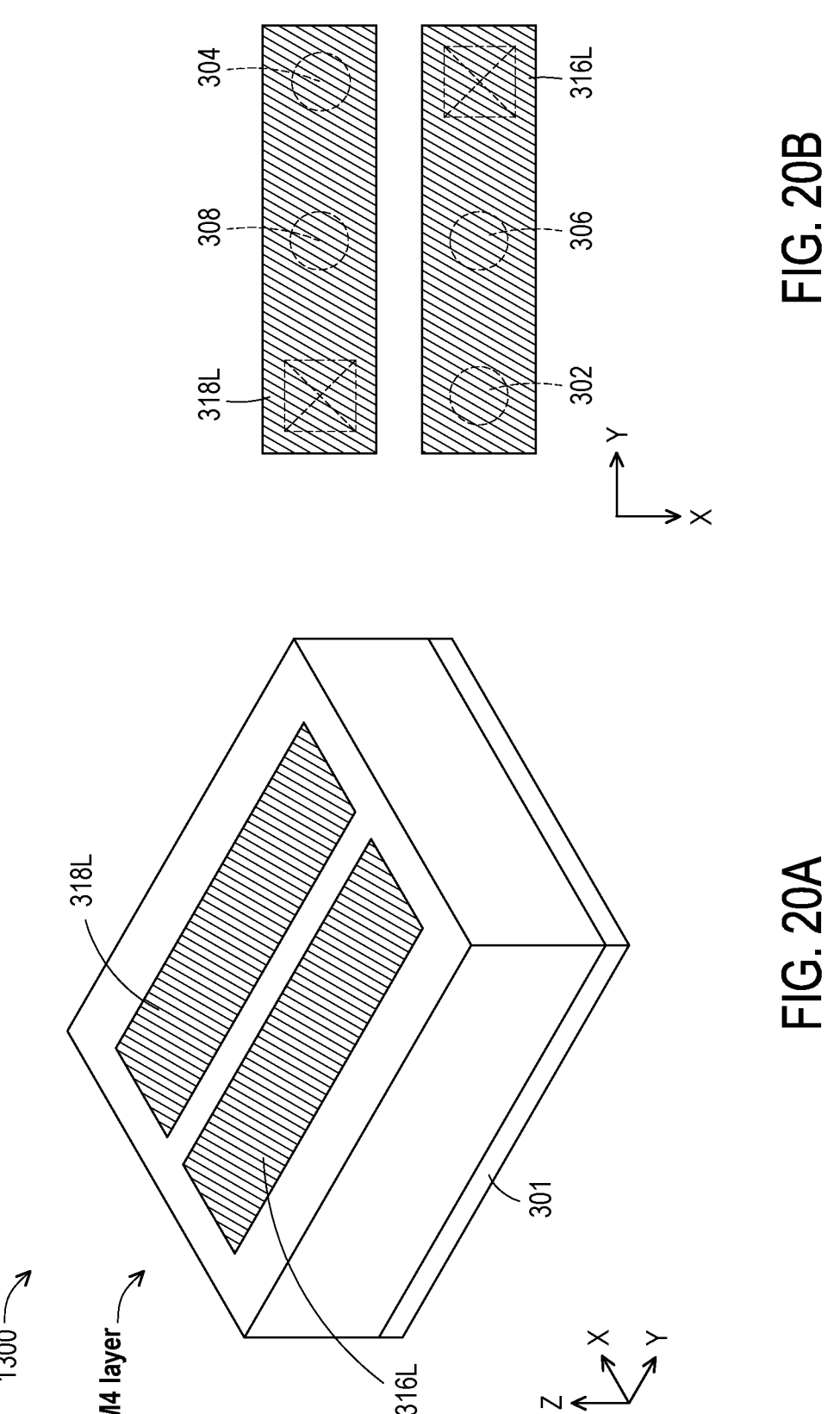
Figures 21A, 21B:
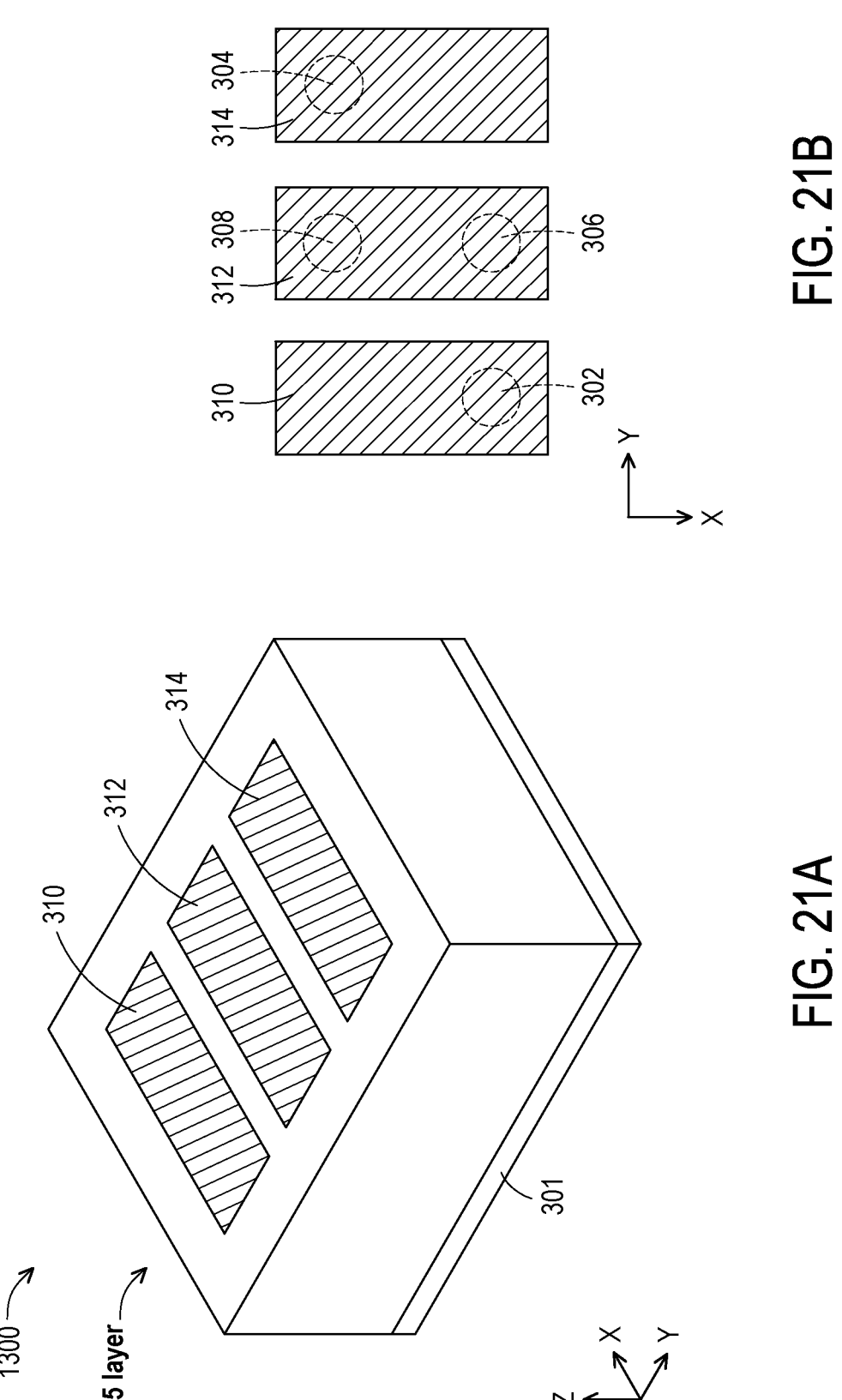
Figures 22A, 22B:
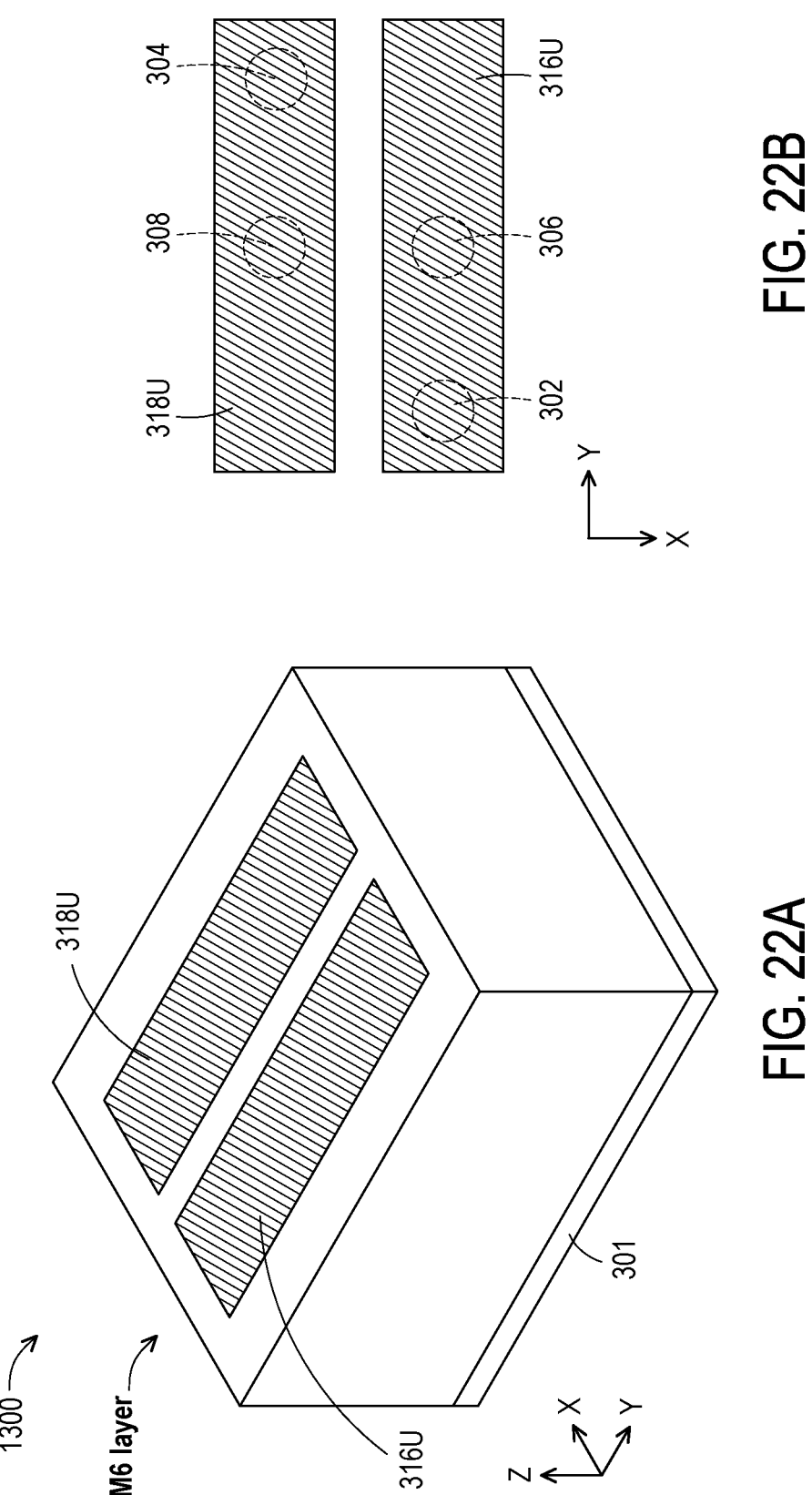
Figures 23A, 23B:
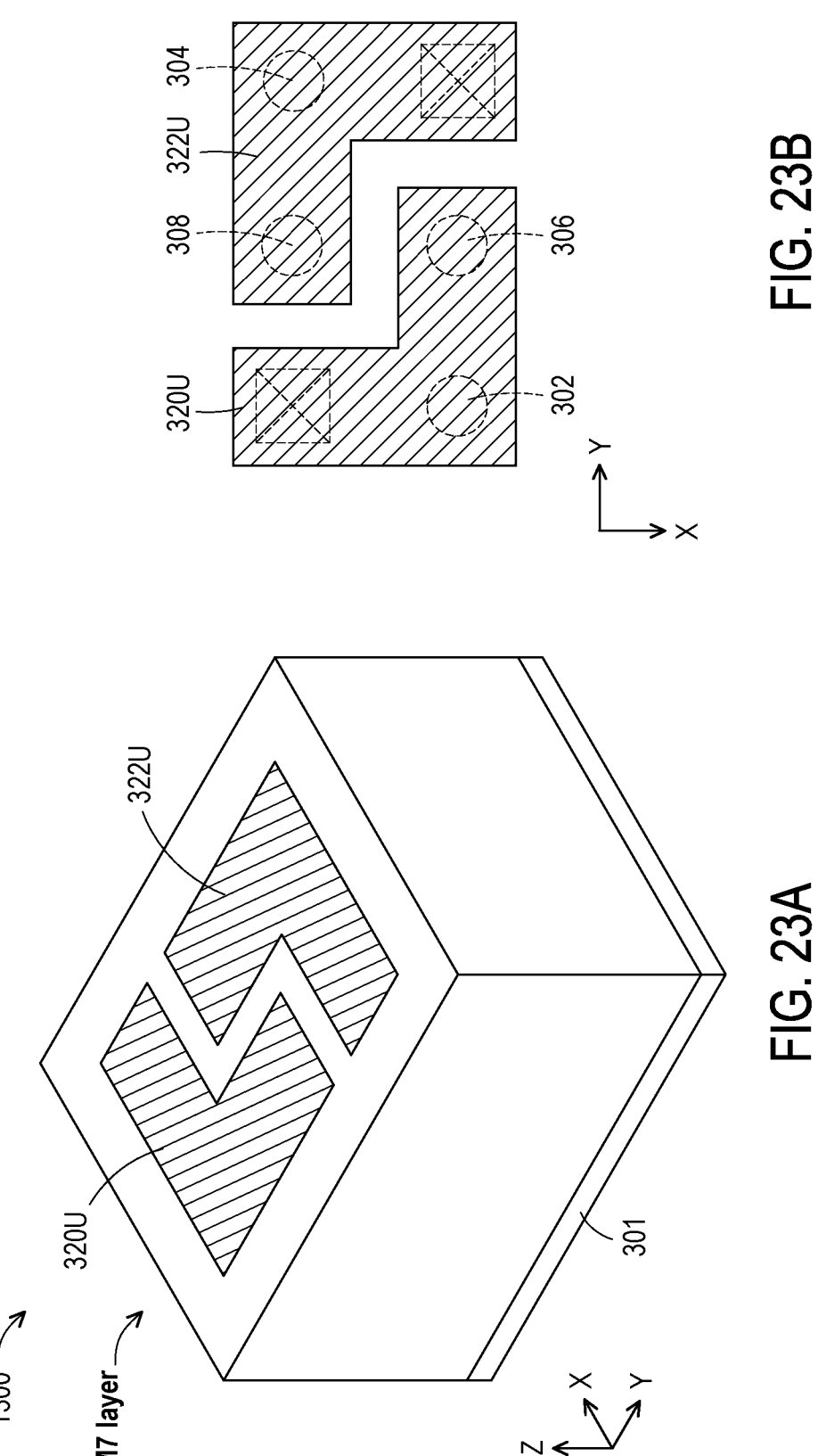
Figures 24A, 24B:
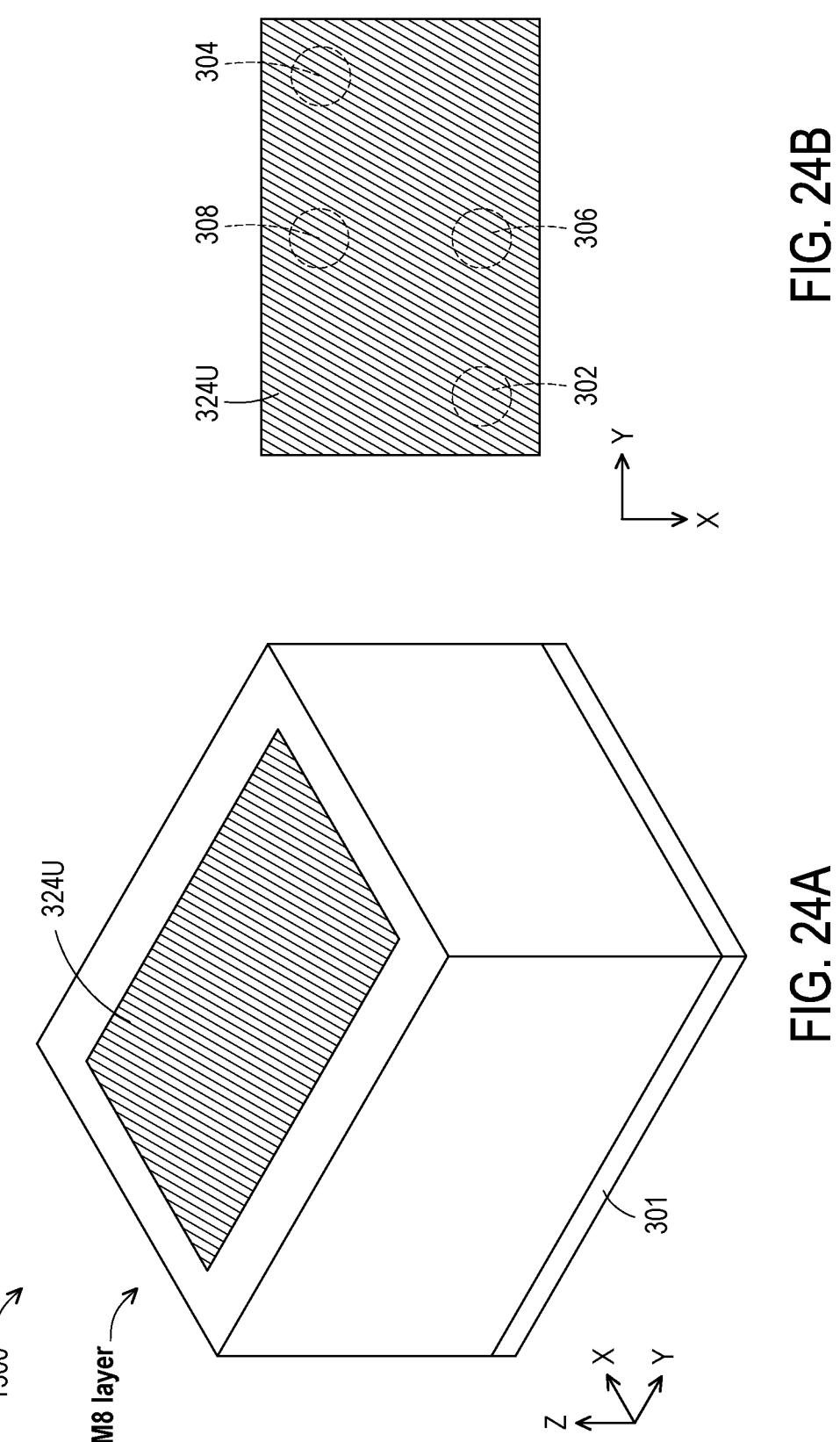
Figures 24A, 25B:
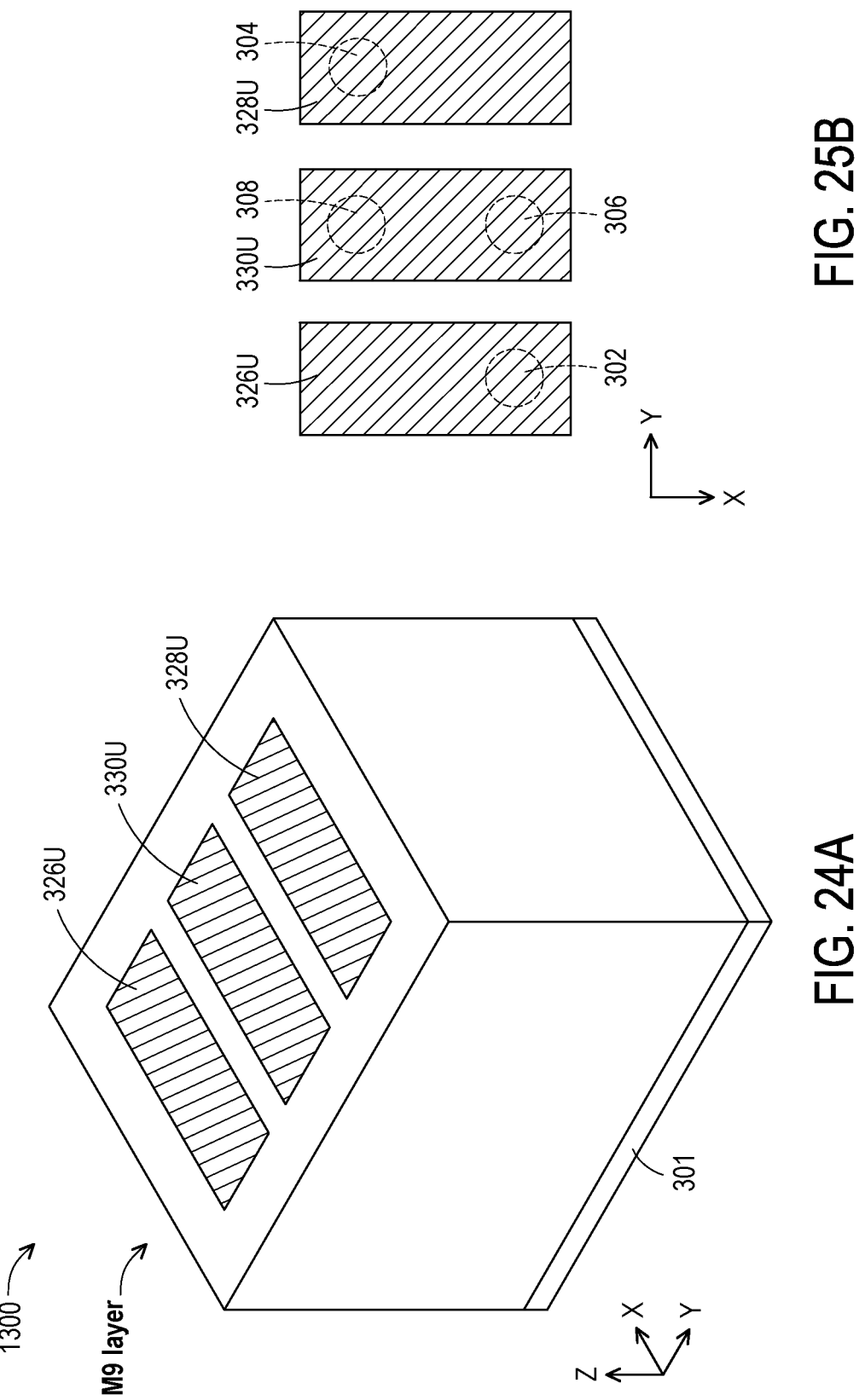
Figure 26:
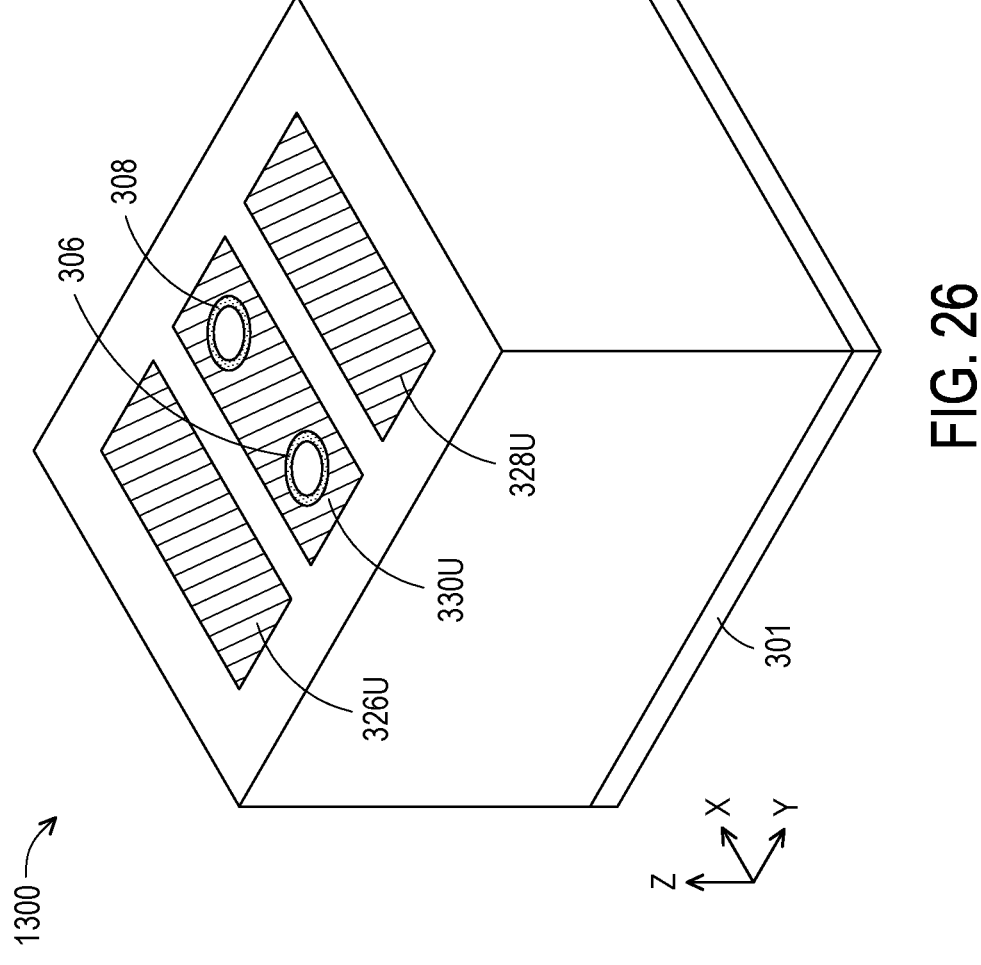
Figure 27A:
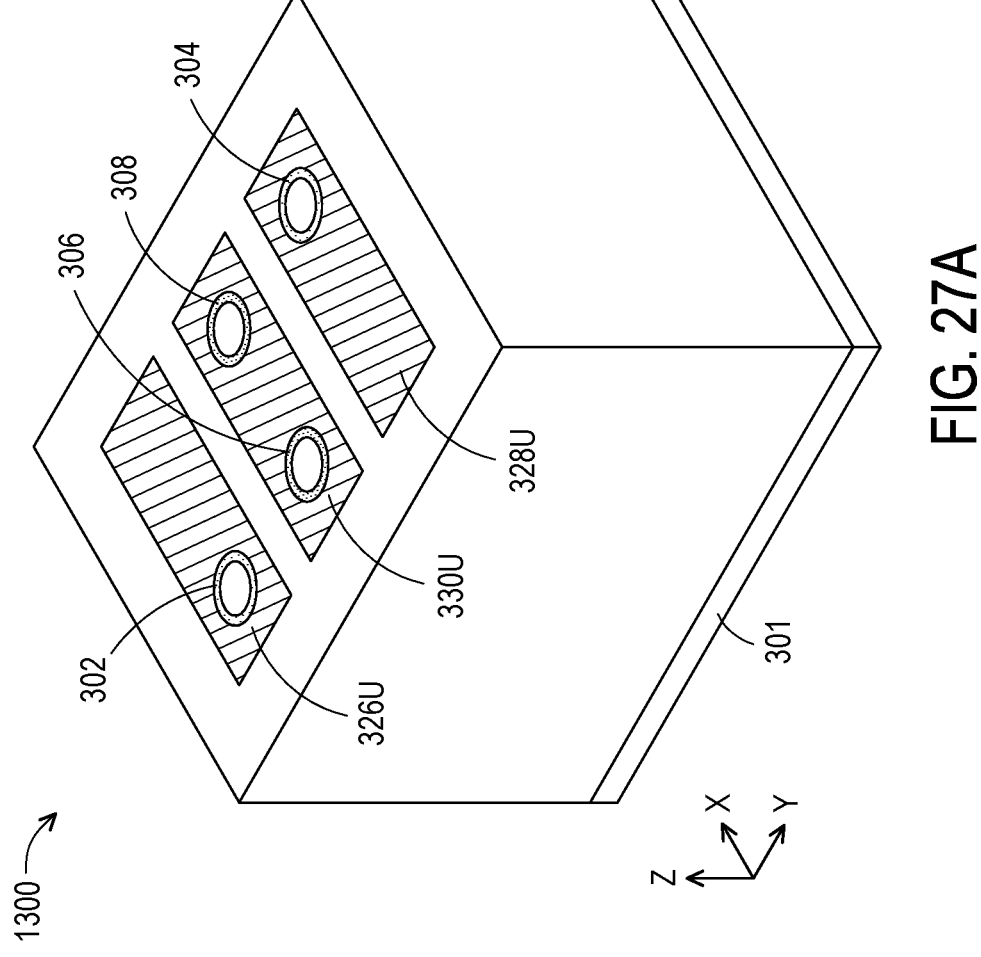
Figure 27B:
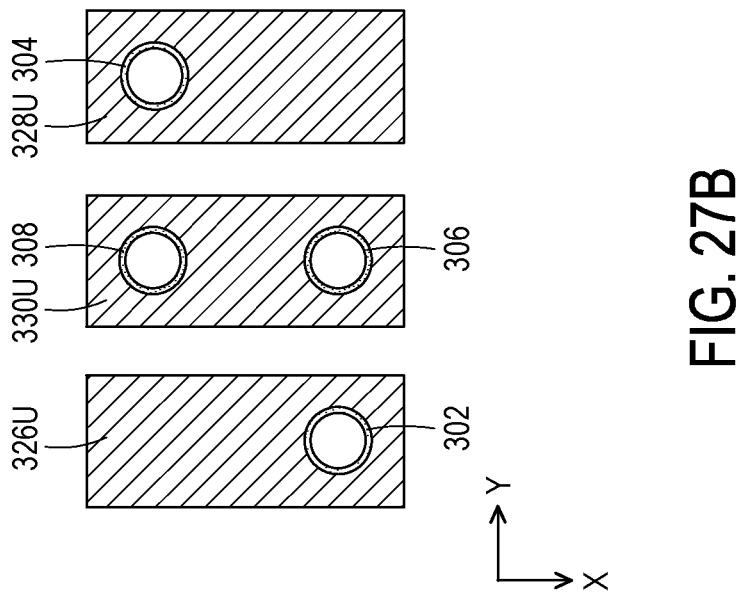

FIG. 14 and FIG. 15 illustrate a cutaway view and a cross-sectional view of the memory device 1300 shown in FIG. 13, respectively, in accordance with various embodiments. It should be noted that the cross-sectional view of FIG. 15 may include multiple cross-sections cut along the Y direction combined together. For example, the channel 302 extends across the metal tracks 326L, 324L, 320L, 316L, 310, 316U, 320U, 324U, and 326U (in a first cross-section cut in the Y direction); and the channel 304 (shifted away from the channel 302 in the X direction) extends across the metal tracks 328L, 324L, 322L, 318L, 314, 318U, 322U, 324U, and 328U (in a second cross-section cut in the Y direction). Correspondingly, the channel 306 extends across the metal tracks 330L, 324L, 320L, 316L, 312, 316U, 320U, 324U, and 330U (in the first cross-section); and the channel 308 (shifted away from the channel 306 in the X direction) extends across the metal tracks 330L, 324L, 322L, 318L, 312, 318U, 322U, 324U, and 330U (in the second cross-section).

FIG. 16 illustrates a flow chart of an example method 1600 for fabricating a semiconductor (e.g., memory) device, in accordance with various embodiments. For example, at least some of the operations (or steps) of the method 1600 can be used to form the memory device 1300 shown in FIG. 13. It is noted that the method 1600 is merely an example, and is not intended to limit the present disclosure. Accordingly, it is understood that additional operations may be provided before, during, and after the method 1600 of FIG. 16, and that some other operations may only be briefly described herein.

Further, operations of the method 1600 may be associated with perspective views or top views of the memory device 1300 at various fabrication stages as shown in FIGS. 17A, 17B, 18A, 18B, 19A, 19B, 20A, 20B, 21A, 21B, 22A, 22B, 23A, 23B, 24A, 24B, 25A, 25B, 26, 27A, and 27B, respectively. In some embodiments, the method 1600 is substantially similar to the method 500 except that the method 1600 includes multiple additional steps to form the respective metallization layers, an thus, the method 1600 and corresponding perspective/top views of the memory device 1300 will be briefly as follows.

For example, the method 1600 starts with operation 1602 of forming first, second, and third metal tracks in a first metallization layer. Implementations of the first, second, and third metal tracks may be the metal tracks 326L, 330L, and 328L formed in the first metallization layer (M1 layer), respectively, as illustrated in the perspective view of FIG. 17A and the top view of FIG. 17B. The method 1600 proceeds to operation 1604 of forming a fourth track in a second metallization layer. Implementations of the fourth metal track may be the metal track 324L formed in the second metallization layer (M2 layer), as illustrated in the perspective view of FIG. 18A and the top view of FIG. 18B. The method 1600 proceeds to operation 1606 of forming fifth and sixth metal tracks in a third metallization layer. Implementations of the fifth and sixth metal tracks may be the metal tracks 320L and 322L formed in the third metallization layer (M3 layer), respectively, as illustrated in the perspective view of FIG. 19A and the top view of FIG. 19B.

Next, the method 1600 proceeds to operation 1608 of forming seventh and eighth metal tracks in a fourth metallization layer. Implementations of the seventh and eighth metal tracks may be the metal tracks 316L and 318L formed in the fourth metallization layer (M4 layer), respectively, as illustrated in the perspective view of FIG. 20A and the top view of FIG. 20B. The method 1600 proceeds to operation 1610 of forming ninth, tenth, and eleventh metal tracks in a fifth metallization layer. Implementations of the ninth, tenth, and eleventh metal tracks may be the metal tracks 310, 312, and 314 formed in the fifth metallization layer (M5 layer), respectively, as illustrated in the perspective view of FIG. 21A and the top view of FIG. 21B. The method 1600 proceeds to operation 1612 of forming twelfth and thirteenth metal tracks in a sixth metallization layer. Implementations of the twelfth and thirteenth metal tracks may be the metal tracks 316U and 318U formed in the sixth metallization layer (M6 layer), respectively, as illustrated in the perspective view of FIG. 22A and the top view of FIG. 22B.

Next, the method 1600 proceeds to operation 1614 of forming fourteenth and fifteenth metal tracks in a seventh metallization layer. Implementations of the fourteenth and fifteenth metal tracks may be the metal tracks 320U and 322U formed in the seventh metallization layer (M7 layer), respectively, as illustrated in the perspective view of FIG. 23A and the top view of FIG. 23B. The method 1600 proceeds to operation 1616 of forming a sixteenth metal track in an eighth metallization layer. Implementations of the sixteenth metal track may be the metal track 324U formed in the eighth metallization layer (M8 layer), respectively, as illustrated in the perspective view of FIG. 24A and the top view of FIG. 24B. The method 1600 proceeds to operation 1618 of forming seventeenth, eighteenth, and nineteenth metal tracks in a ninth metallization layer. Implementations of the seventeenth, eighteenth, and nineteenth metal tracks may be the metal tracks 326U, 330U, and 328U formed in the ninth metallization layer (M9 layer), respectively, as illustrated in the perspective view of FIG. 25A and the top view of FIG. 25B. The method 1600 proceeds to operation 1620 of forming first and second p-type channels vertically extending through the first to ninth metallization layers. Implementations of first and second p-type channels may be the channels 306 and 308, as illustrated in the perspective view of FIG. 26. The method 1600 proceeds to operation 1622 of forming first and second n-type channels vertically extending through the first to ninth metallization layers. Implementations of first and second n-type channels may be the channels 302 and 304, as illustrated in the perspective view of FIG. 27A and the top view of FIG. 27B.

Figure 28:
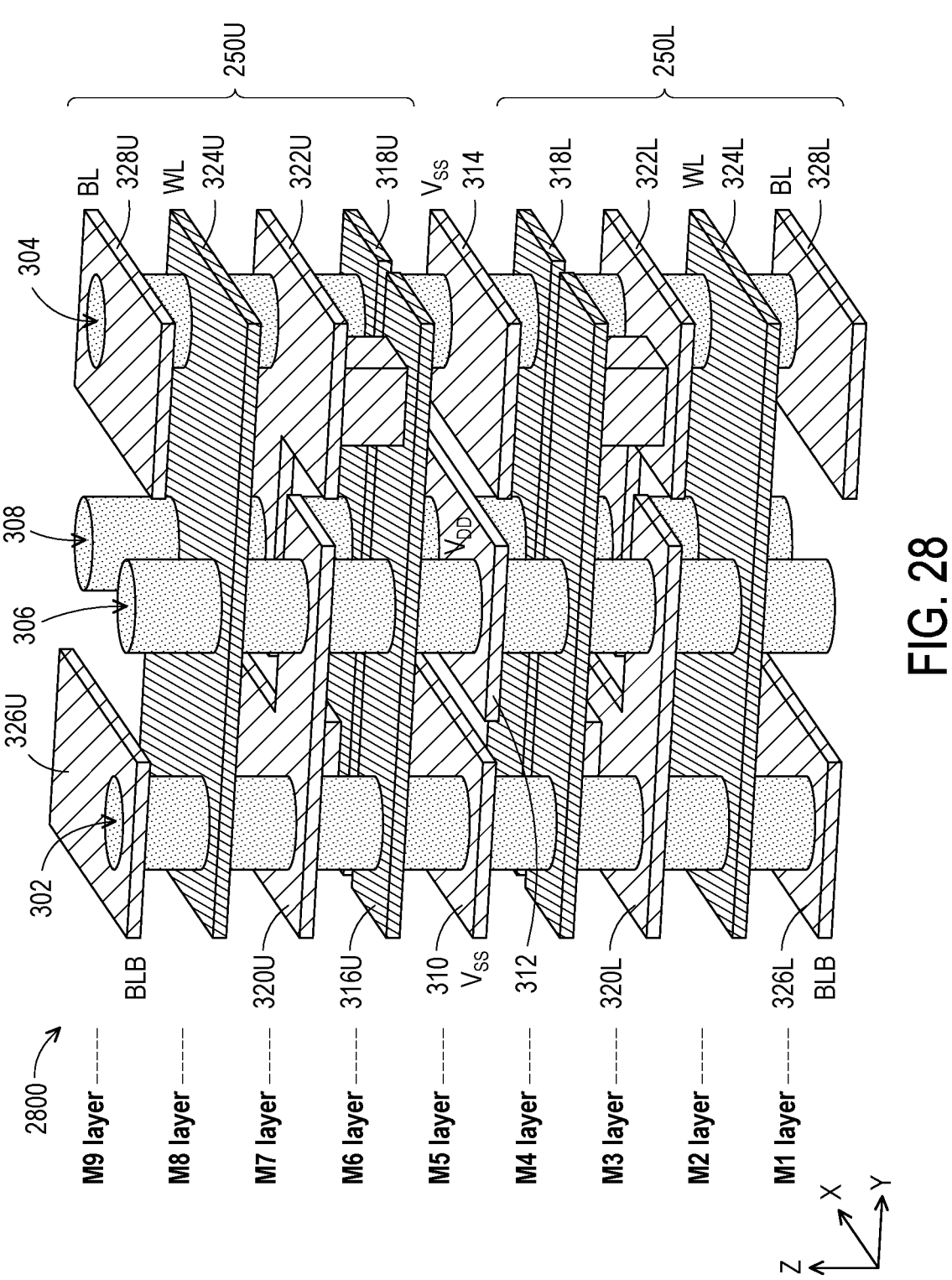
FIG. 28 illustrates a perspective view of another memory device including two of the memory cells of FIG. 2, in accordance with some embodiments.

FIG. 28 illustrates a perspective view of a memory device 2800 including multiple (e.g., 2) memory cells 250U and 250L stacked on top of one another, in accordance with various embodiments. The memory device 2800 is substantially similar to the memory device 1300 of FIG. 13, except that the metal tracks 330L and 330U (dummy BL) are omitted in the memory device 2800. Accordingly, the corresponding description of the memory device 2800 will not be repeated.

As mentioned above, prior to forming the channels 302-308, a high-k dielectric material is formed to surround the inner sidewall of each of the vertical openings that are defined by the footprints of the channels 302-308. The high-k dielectric material may serve as a gate dielectric of the corresponding VGAA transistor (e.g., the transistors M1 to M6 of the memory cell 250). Below are three embodiments illustrating the formation of such a gate dielectric and the corresponding channel, where the semiconductor device 300 (FIG. 3) and the channel 302 (FIG. 3) are selected as a representative example.

Figure 29A:
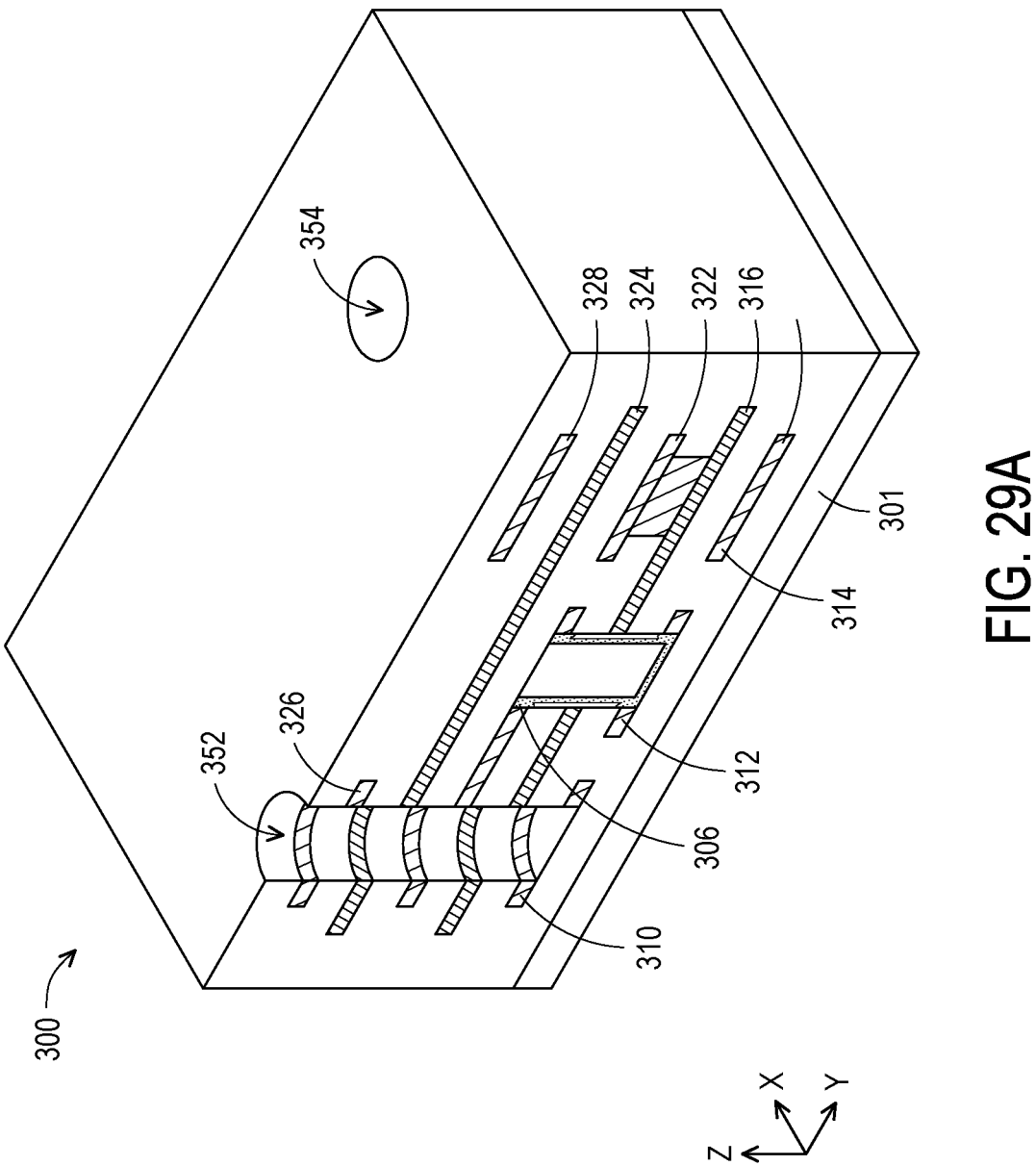
FIGS. 29A to 29F illustrate cutaway or cross-sectional views of a memory device during various fabrication stages, in accordance with some embodiments.
Figure 29B:
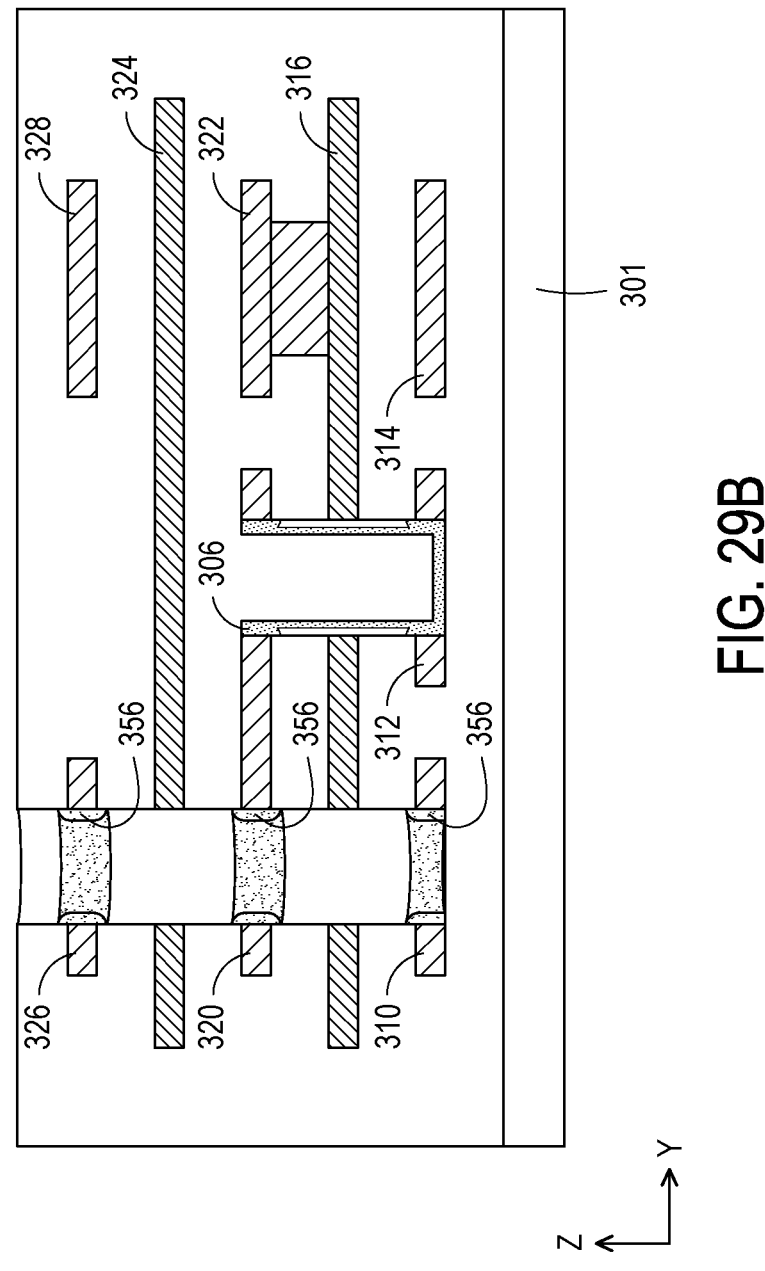
Figure 29C:
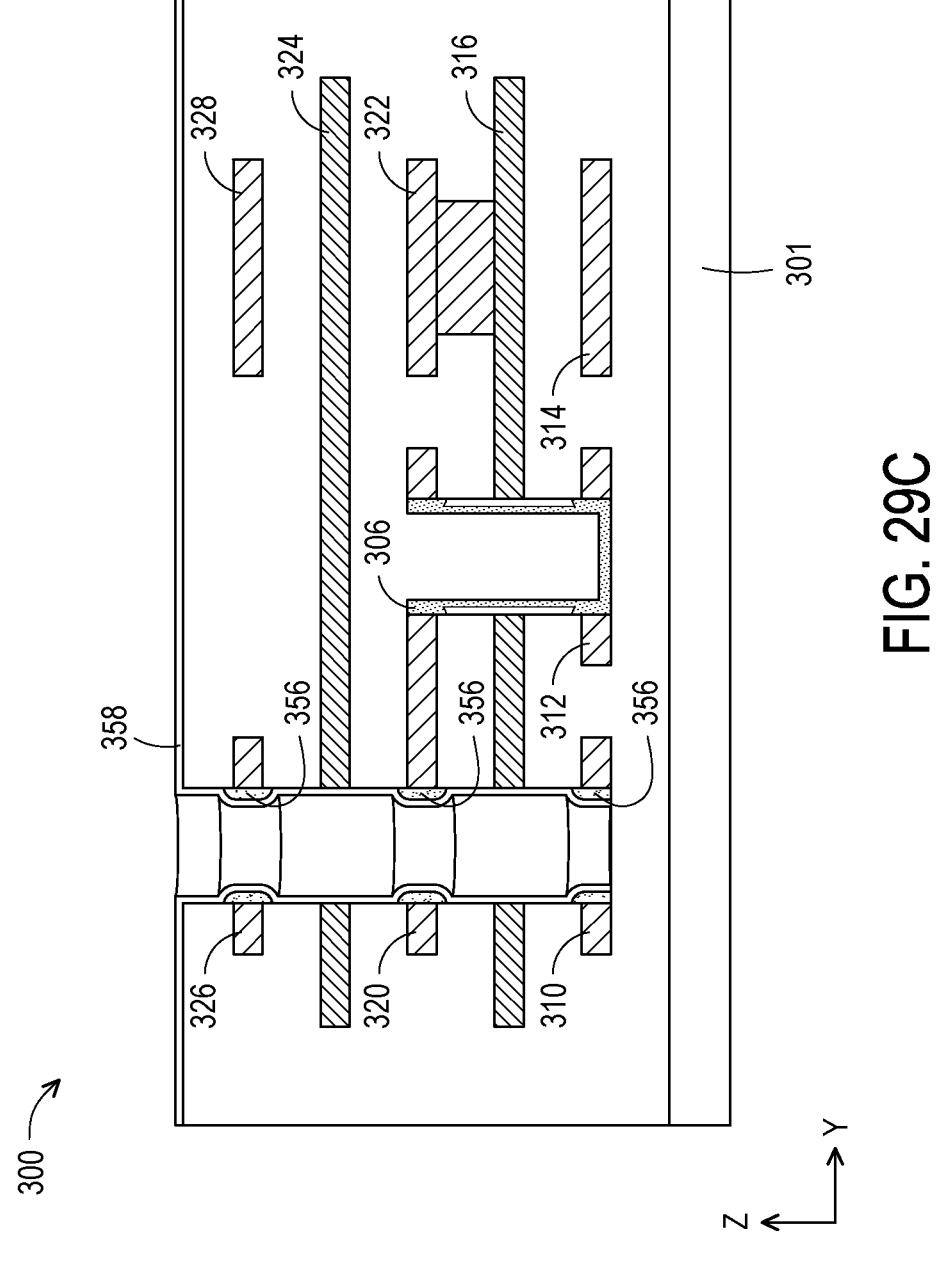
Figure 29D:
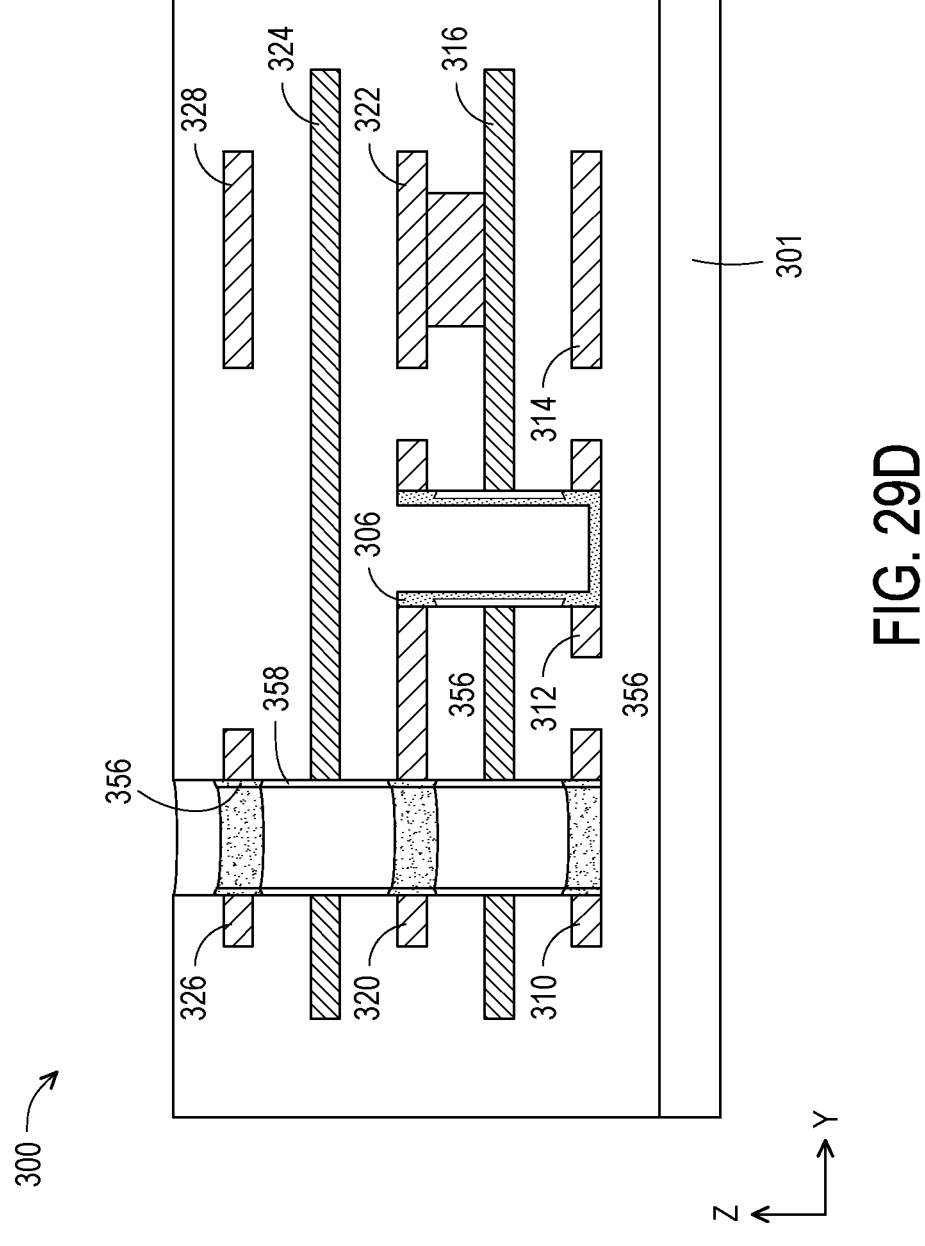
Figure 29E:
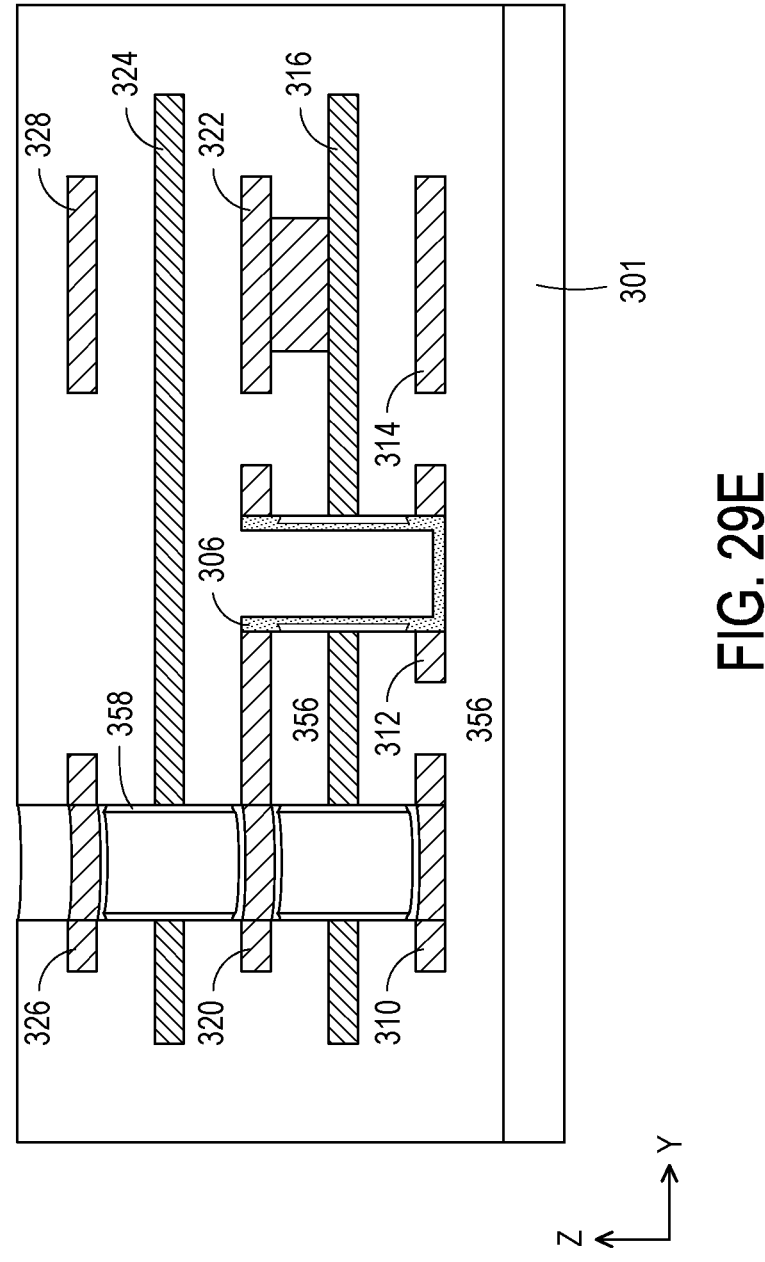
Figure 29F:
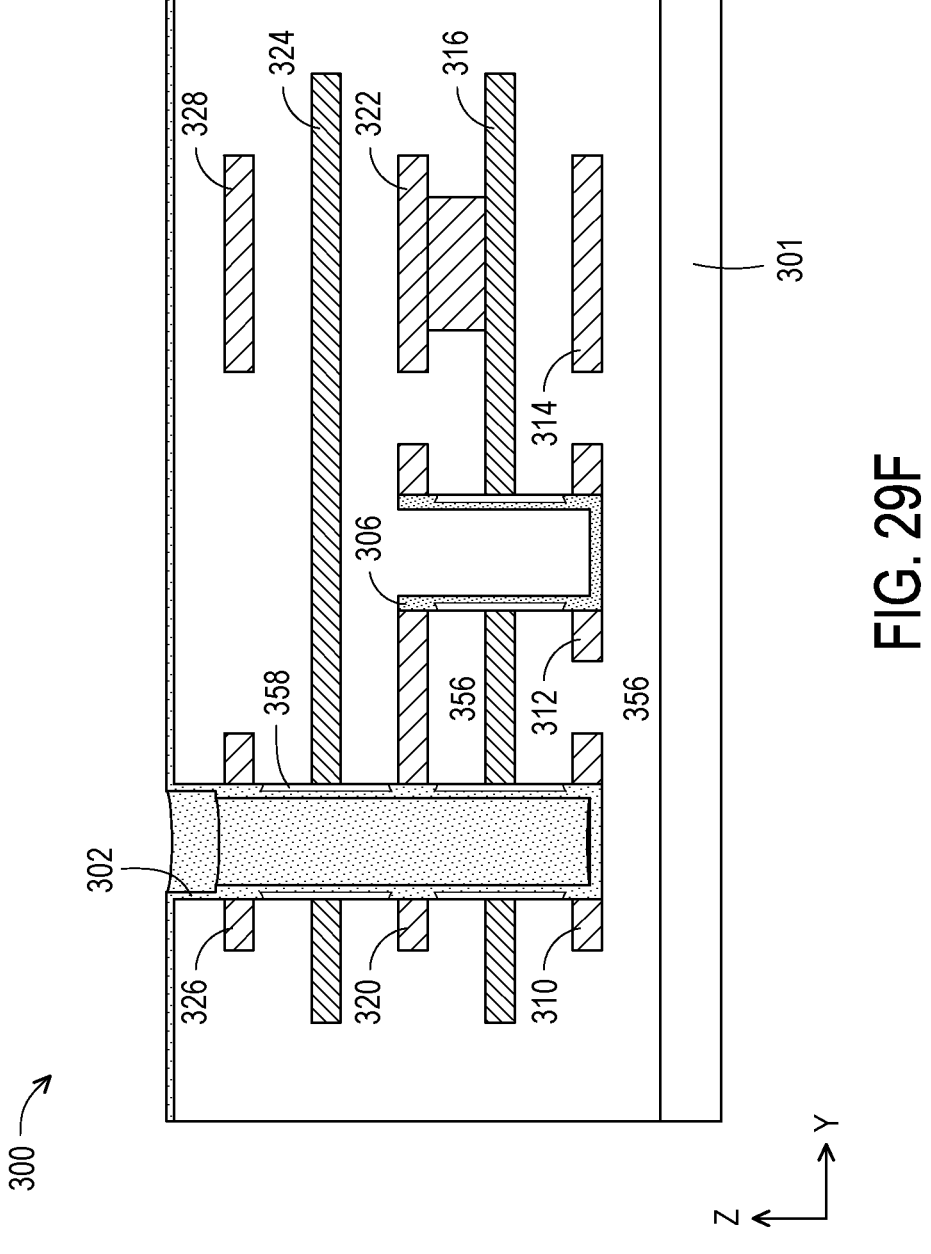

FIGS. 29A, 29B, 29C, 29D, 29E, and 29F illustrate various fabrication stages of the semiconductor device 300, in accordance with some embodiments. FIG. 29A illustrates a cutaway view of the semiconductor device 300 at the stage in which the metal stacks 326 and 328 have been formed, and FIGS. 29B to 29F illustrate respective cross-sectional views of the semiconductor device 300 at the following stages in which a gate dielectric 358 and the channel 302 are sequentially formed.

Specifically, in FIG. 29A, upon forming the metal stacks 326 and 328 in the M5 layer, vertical openings 352 and 354, corresponding to the footprints of the channels 302 and 304, respectively, are formed through at least one anisotropic etching process. As a result, one or more inner sidewalls of each of the metal stacks 310-328 are exposed. Next, in FIG. 29B, an oxide layer 356 is selectively formed only around the inner sidewalls of the metal stacks 310, 320, and 326 (as shown) and around the inner sidewalls of the metal stacks 314, 322, and 328 (not shown in such a cross-section). This oxide layer 356 may be formed through an oxidation process selectively occurring on the metal stacks 310, 314, 320, 322, 326, and 328. In other words, the inner sidewalls of the metal stacks 316, 318, and 324 may remain substantially intact. Next, in FIG. 29C, the gate dielectric 358 (e.g., a high-k dielectric material) may be (e.g., conformally) deposited over the workpiece, e.g., extending the whole inner sidewall of the vertical opening 352.

With the oxide layer 356 interposed between the gate dielectric 358 and each of the metal stacks 310, 314, 320, 322, 326, and 328, the gate dielectric 358 may have first portions (that correspond to the positions of the metal stacks 310, 314, 320, 322, 326, and 328) protruding radially inwardly toward a central point of the vertical opening more than other, second portions. Next, in FIG. 29D, an anisotropic etching process is performed to remove such protruding portions, thereby exposing the oxide layer 356 while keeping the second portions of the gate dielectric 358. Next, in FIG. 29E, the oxide layer 356 is selectively etched with respect to the second portions of the gate dielectric 358, which again exposes the inner sidewalls of the metal stacks 310, 314, 320, 322, 326, and 328. Next, in FIG. 29F, the channel 302 (as shown) and the channel 304 (not shown in such a cross-section) can be deposited to surround the inner sidewall of the vertical opening 352 and the inner sidewall of the vertical opening 354, respectively. In some other embodiments, the channels 302 and 304 may be deposited to fill the vertical opening 352 and the vertical opening 354, respectively.

Figure 30A:
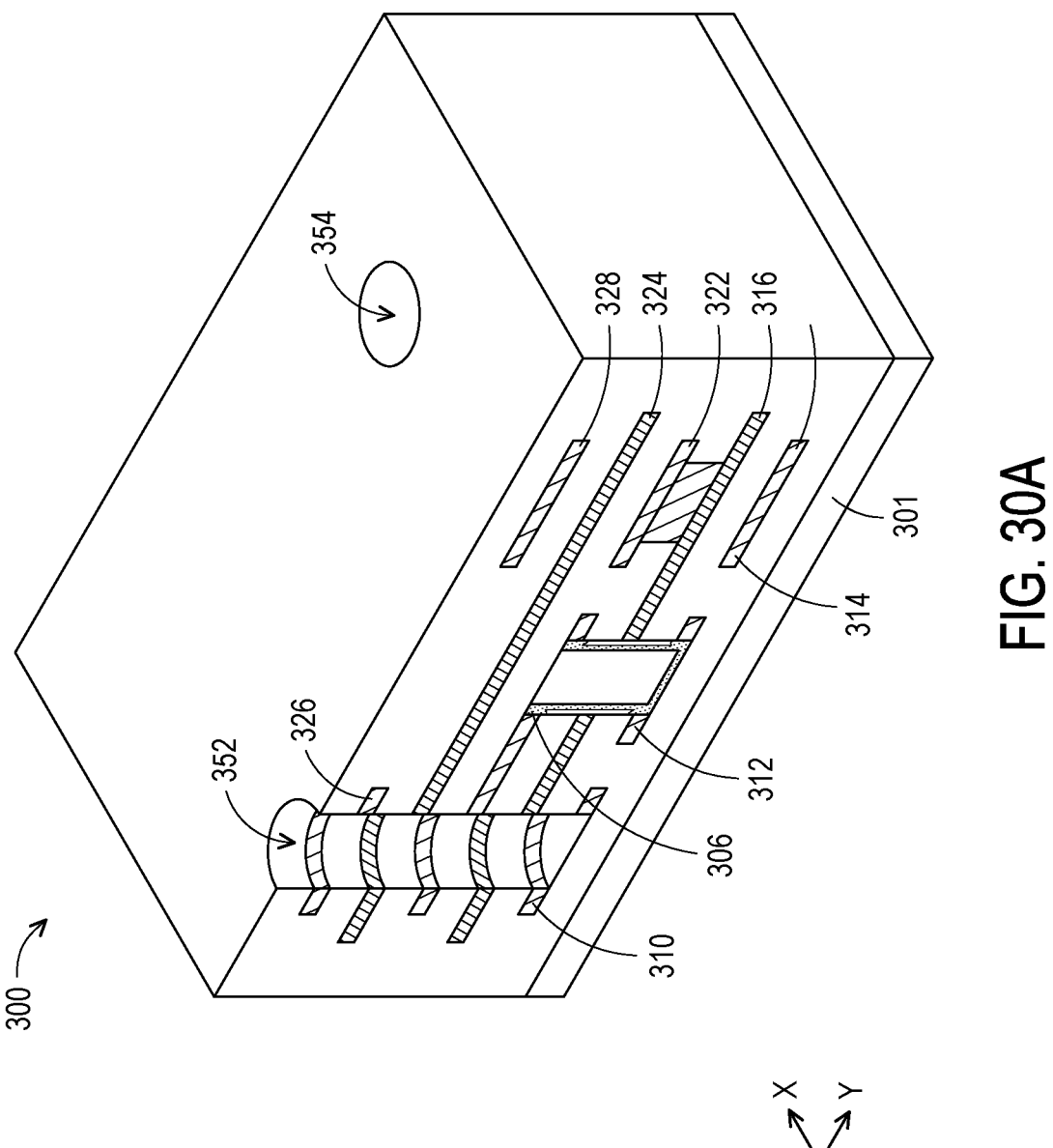
FIGS. 30A to 30F illustrate cutaway or cross-sectional views of a memory device during various fabrication stages, in accordance with some embodiments.
Figure 30B:
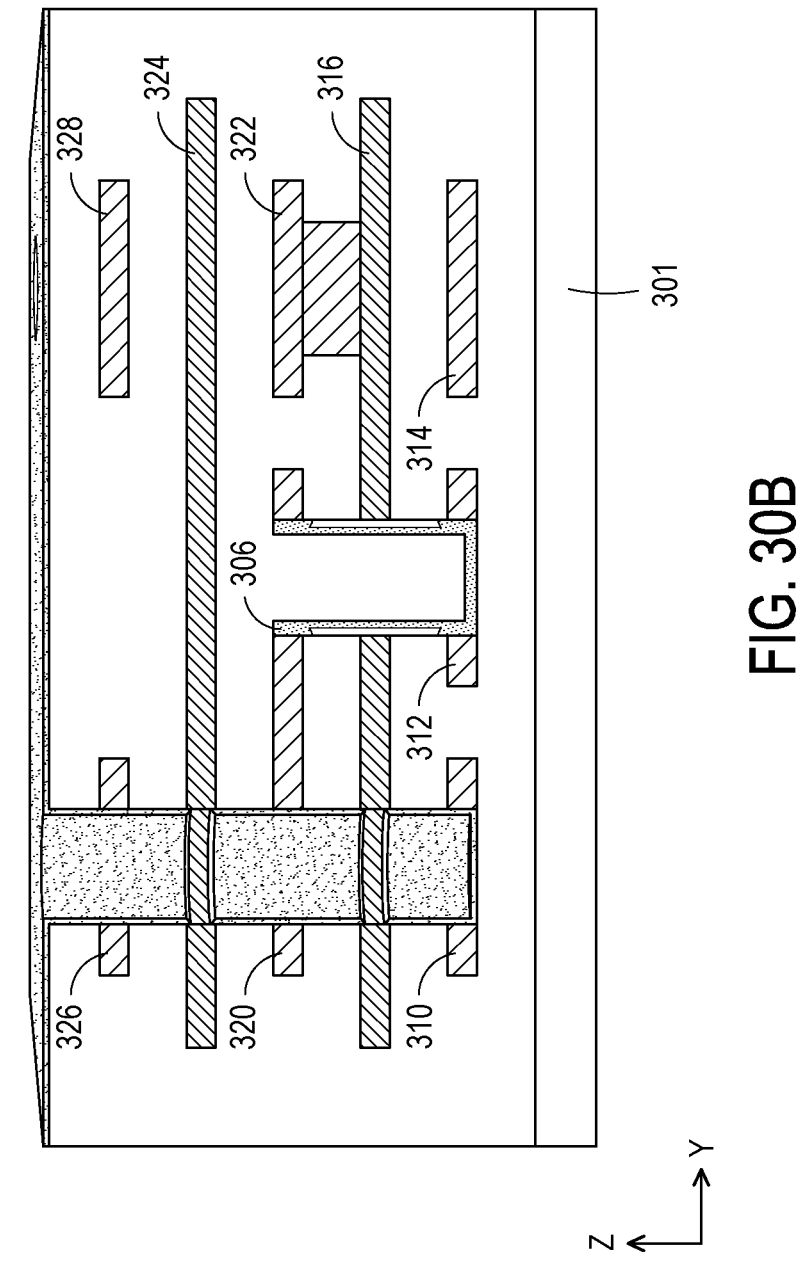
Figure 30C:
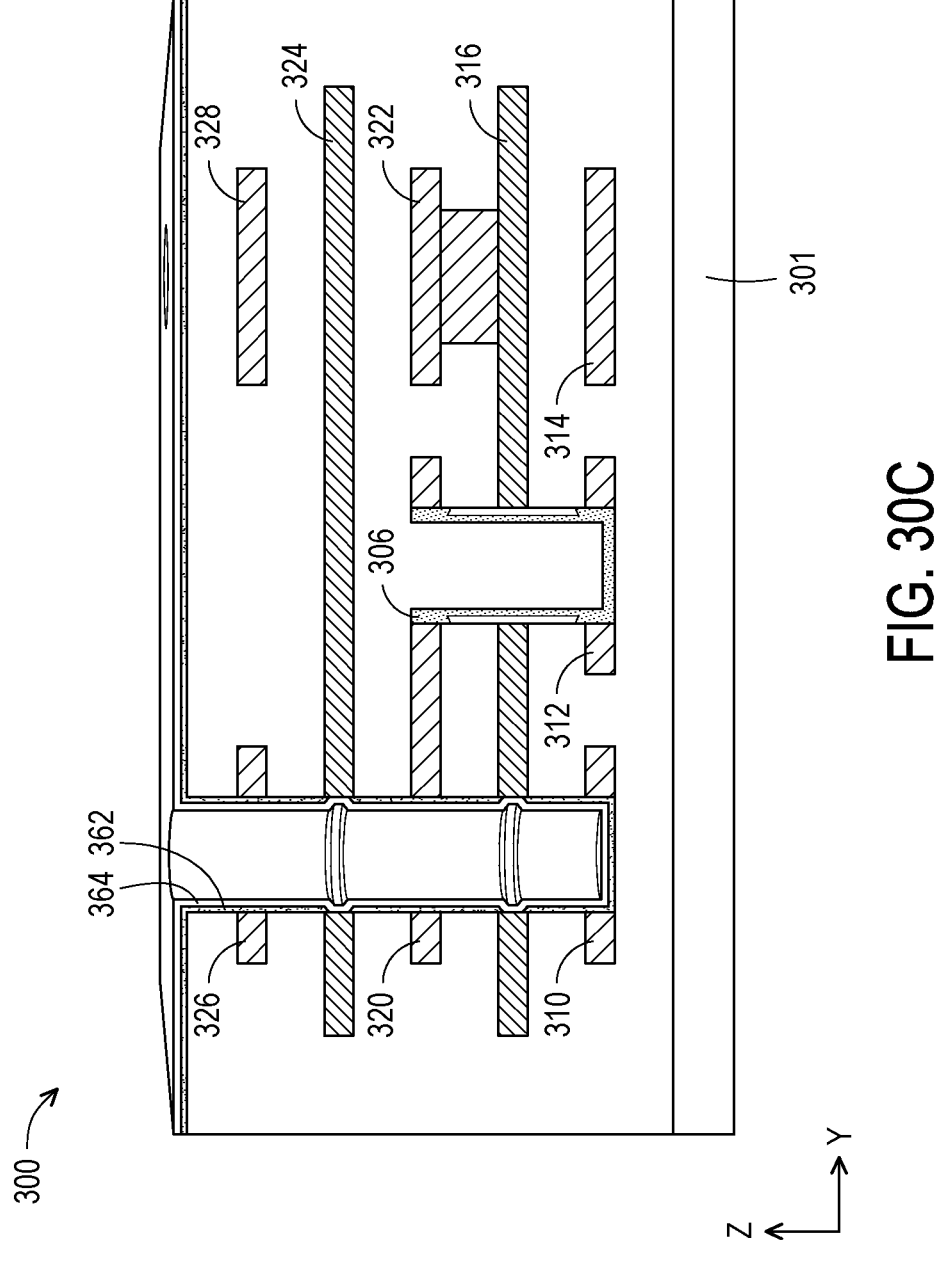
Figure 30D:
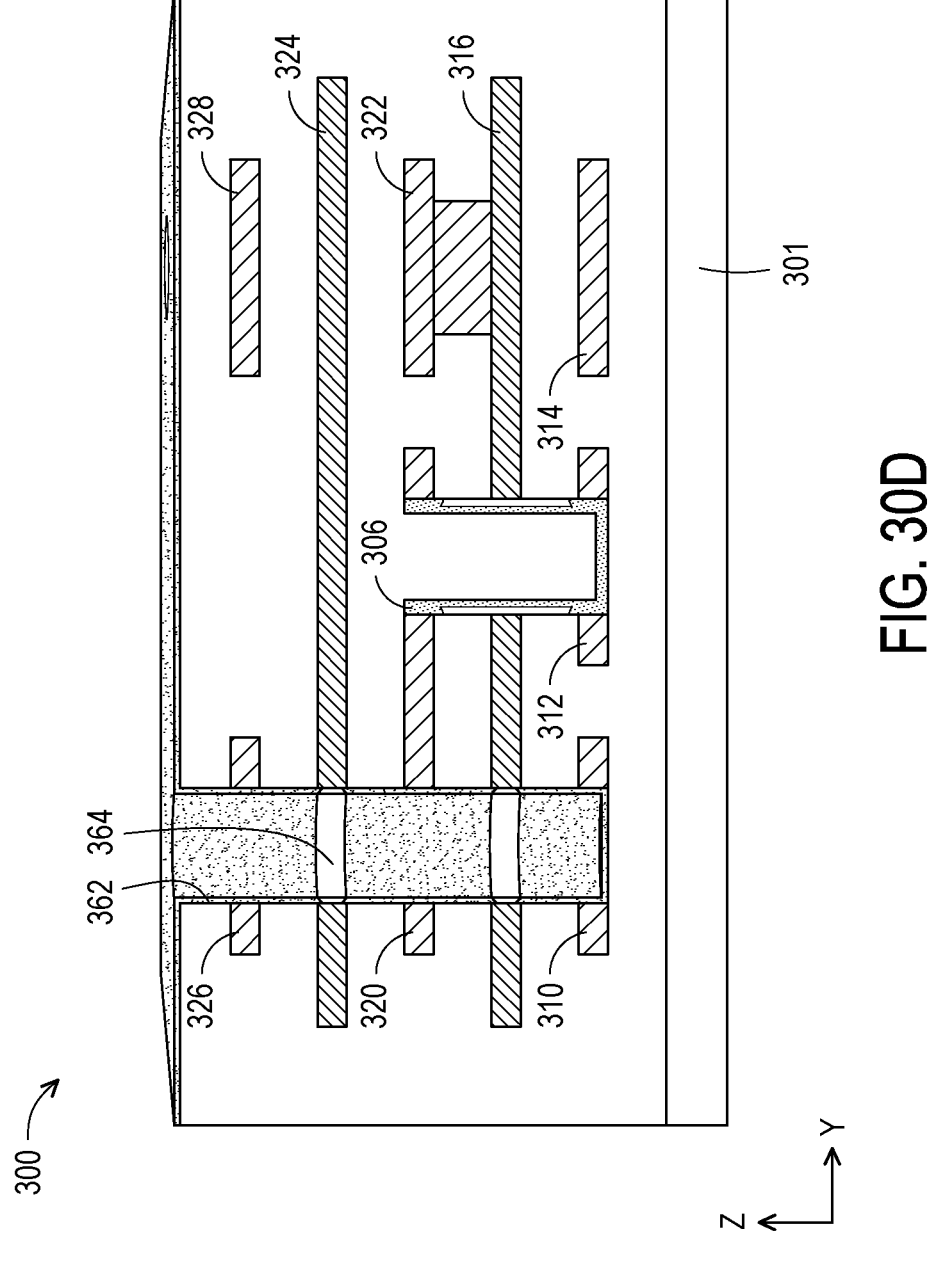
Figure 30E:
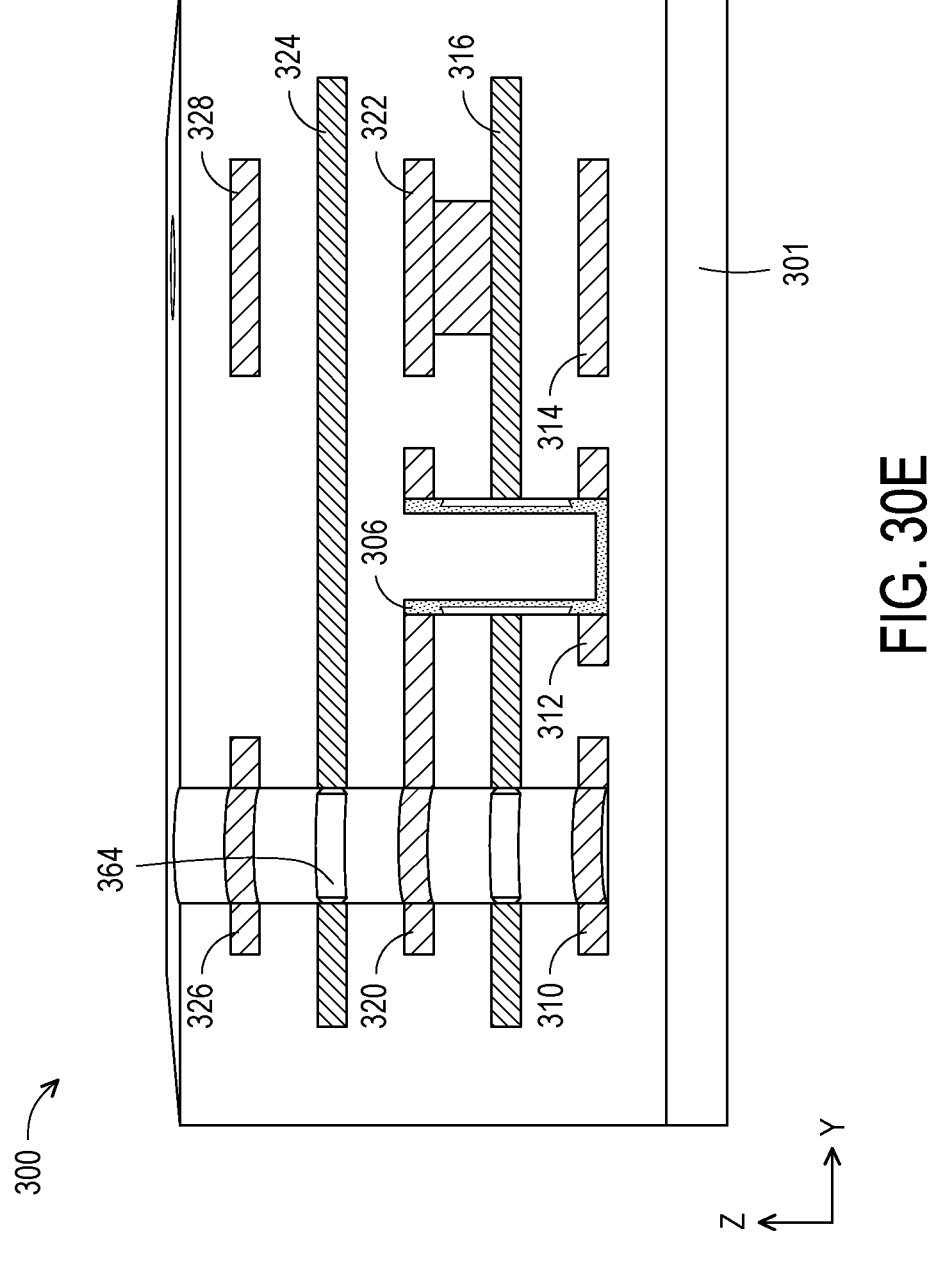
Figure 30F:
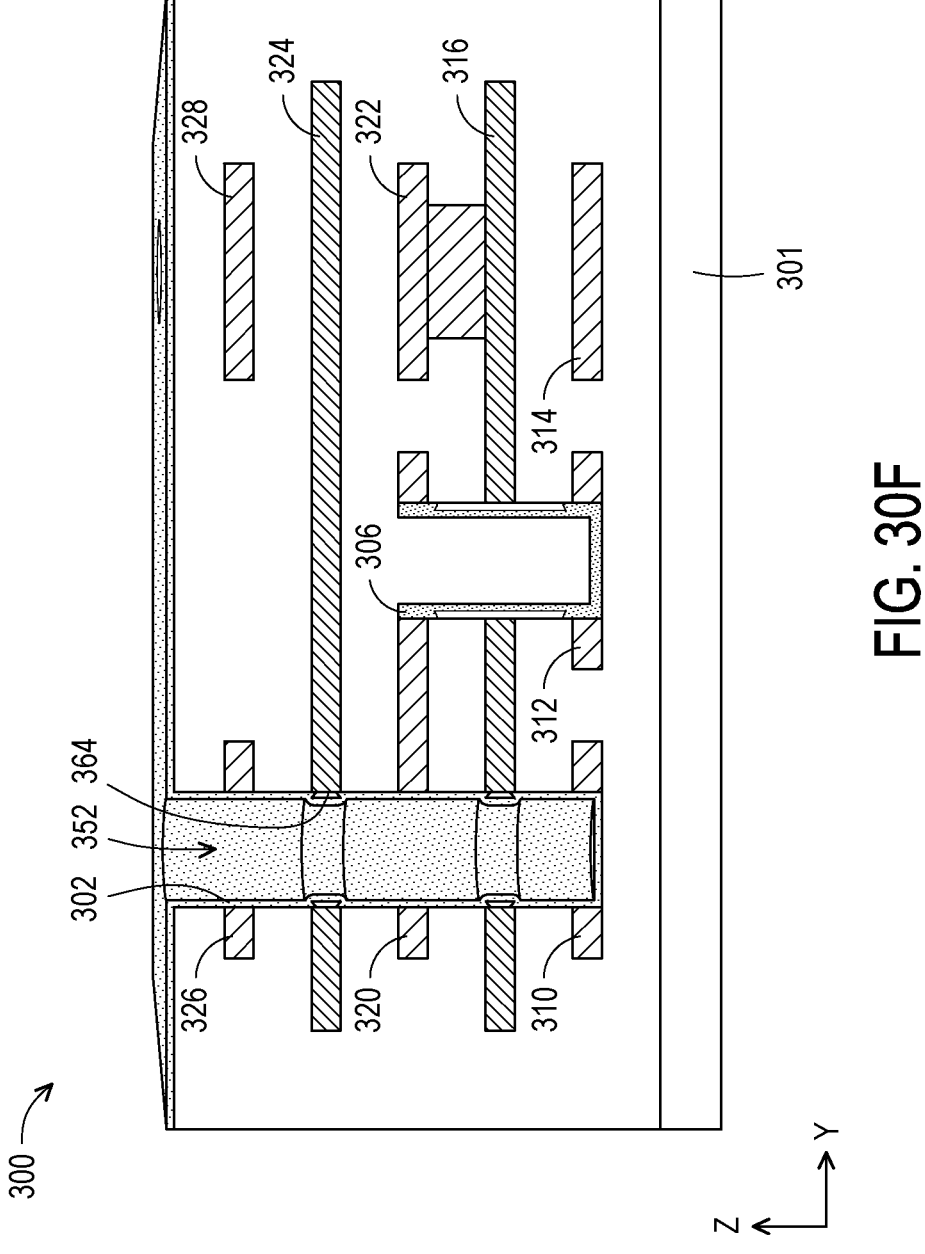

FIGS. 30A, 30B, 30C, 30D, 30E, and 30F illustrate various fabrication stages of the semiconductor device 300, in accordance with some embodiments. FIG. 30A illustrates a cutaway view of the semiconductor device 300 at the stage in which the metal stacks 326 and 328 have been formed, and FIGS. 30B to 30F illustrate respective cross-sectional views of the semiconductor device 300 at the following stages in which a gate dielectric 364 and the channel 302 are sequentially formed.

Specifically, in FIG. 30A, upon forming the metal stacks 326 and 328 in the M5 layer, vertical openings 352 and 354, corresponding to the footprints of the channels 302 and 304, respectively, are formed through at least one anisotropic etching process. As a result, one or more inner sidewalls of each of the metal stacks 310-328 are exposed. Next, in FIG. 30B, an oxide layer 362 is selectively formed around the inner sidewall of the vertical opening 352 (as shown) and the inner sidewall of the vertical opening 354 (not shown in such a cross-section) except for the inner sidewall of the metal stacks 316, 318, and 324. This oxide layer 362 may be formed through an oxidation process selectively occurring on the metal stacks 310, 314, 320, 322, 326, and 328 and on the dielectric material of the metallization layers. In other words, the inner sidewalls of the metal stacks 316, 318, and 324 may remain substantially intact. Next, in FIG. 30C, the gate dielectric 364 (e.g., a high-k dielectric material) may be (e.g., conformally) deposited over the workpiece, e.g., extending the whole inner sidewall of the vertical opening 352.

With the oxide layer 362 absent around the inner sidewalls of the metal stacks 316, 318, and 324, the gate dielectric 364 may have first portions (that correspond to the positions of the metal stacks 316, 318, and 324) protruding radially outwardly from a central point of the vertical opening more than other, second portions. That is, the first portions are indented with respect to the second portions. Next, in FIG. 30D, an anisotropic etching process is performed to remove such non-indented portions (second portions), thereby exposing the oxide layer 362 while keeping the first portions of the gate dielectric 364. Next, in FIG. 30E, the oxide layer 362 is selectively etched with respect to the second portions of the gate dielectric 364, which again exposes the inner sidewalls of the metal stacks 310, 314, 320, 322, 326, and 328. Next, in FIG. 30F, the channel 302 (as shown) and the channel 304 (not shown in such a cross-section) can be deposited to surround the inner sidewall of the vertical opening 352 and the inner sidewall of the vertical opening 354, respectively. In some other embodiments, the channels 302 and 304 may be deposited to fill the vertical opening 352 and the vertical opening 354, respectively.

FIGS. 31A, 31B, 31C, 31D, 31E, 31F, 31G, 31H, 31I, and 31J illustrate various fabrication stages of the semiconductor device 300, in accordance with some embodiments. FIGS. 31A to 31J illustrate respective cross-sectional views of the semiconductor device 300 at the stages in which an extended metal 374, a gate dielectric 376, and the channel 302 are sequentially formed.

Figures 31A, 31B, 31C:
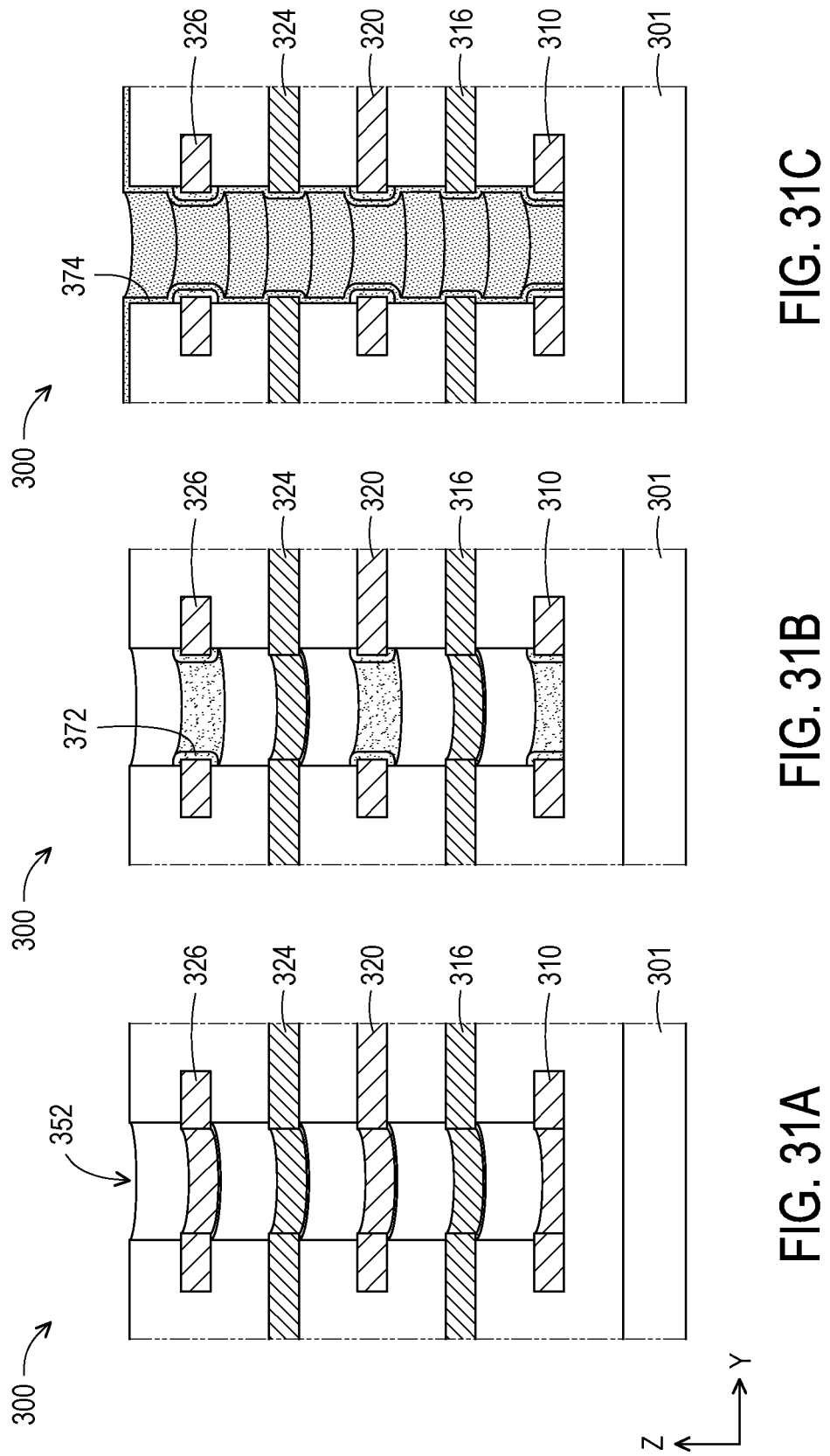
FIGS. 31A to 31J illustrate cutaway or cross-sectional views of a memory device during various fabrication stages, in accordance with some embodiments.
Figures 31D, 31E, 31F:
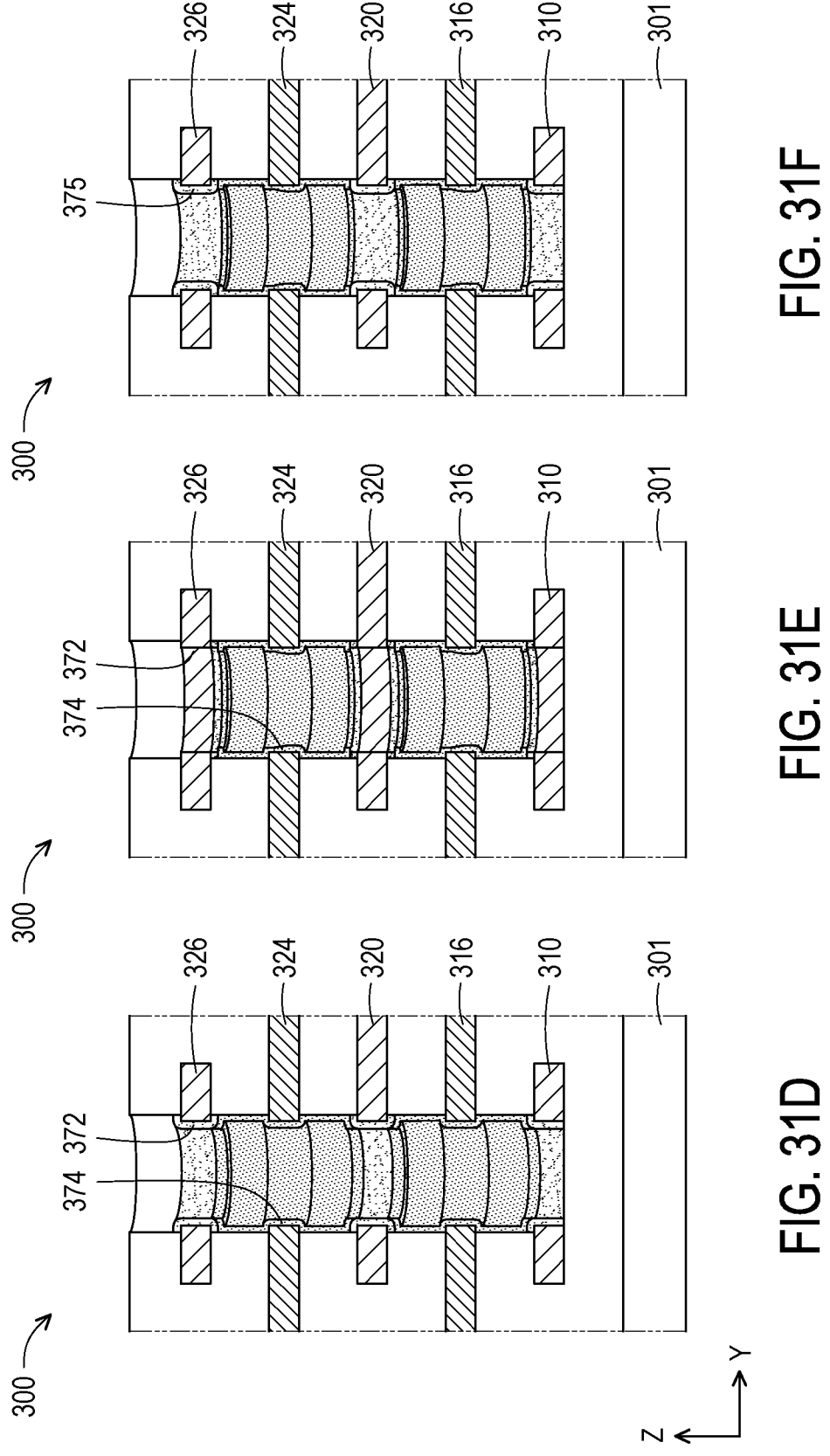

Specifically, in FIG. 31A, upon forming the metal stacks 326 and 328 in the M5 layer, vertical opening 352 and another vertical opening (not shown), corresponding to the footprints of the channels 302 and 304, respectively, are formed through at least one anisotropic etching process. As a result, one or more inner sidewalls of each of the metal stacks 310-328 are exposed. Next, in FIG. 31B, an oxide layer 372 is selectively formed only around the inner sidewalls of the metal stacks 310, 320, and 326 (as shown) and around the inner sidewalls of the metal stacks 314, 322, and 328 (not shown in such a cross-section). This oxide layer 372 may be formed through an oxidation process selectively occurring on the metal stacks 310, 314, 320, 322, 326, and 328. In other words, the inner sidewalls of the metal stacks 316, 318, and 324 may remain substantially intact. Next, in FIG. 31C, the extended metal 374 may be (e.g., conformally) deposited over the workpiece, e.g., extending the whole inner sidewall of the vertical opening 352. In some embodiments, the extended metal 374 may have the same material as the metal tracks 316, 318, and 324.

With the oxide layer 374 interposed between the extended metal 374 and each of the metal stacks 310, 314, 320, 322, 326, and 328, the extended metal 374 may have first portions (that correspond to the positions of the metal stacks 310, 314, 320, 322, 326, and 328) protruding radially inwardly toward a central point of the vertical opening more than other, second portions. Next, in FIG. 31D, an anisotropic etching process is performed to remove such protruding portions, thereby exposing the oxide layer 372 while keeping the second portions of the extended metal 374. In some embodiments, the remaining second portions of the extended metal 374 are electrically connected to the metal stacks 316, 318 (not shown), and 324, which can advantageously lower resistance between the gate terminal and source/drain terminal of a corresponding VGAA transistor. Next, in FIG. 31E, the oxide layer 372 is selectively etched with respect to the second portions of the extended metal 374, which again exposes the inner sidewalls of the metal stacks 310, 314, 320, 322, 326, and 328. Next, in FIG. 31F, another oxide layer 375 is selectively formed only around the inner sidewalls of the metal stacks 310, 320, and 326 (as shown) and around the inner sidewalls of the metal stacks 314, 322, and 328 (not shown in such a cross-section).

Figures 31G, 31H, 31I:
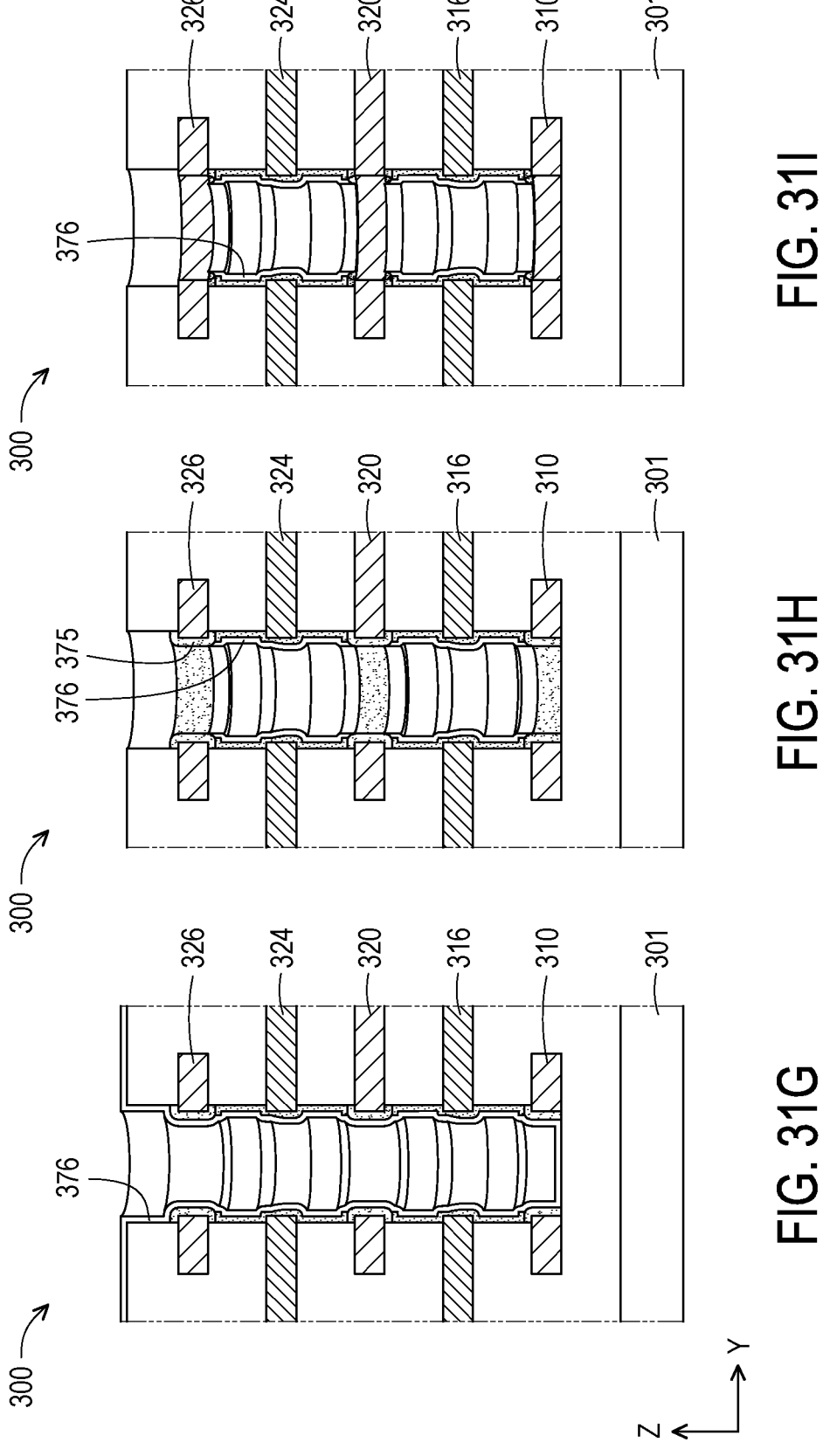
Figure 31J:
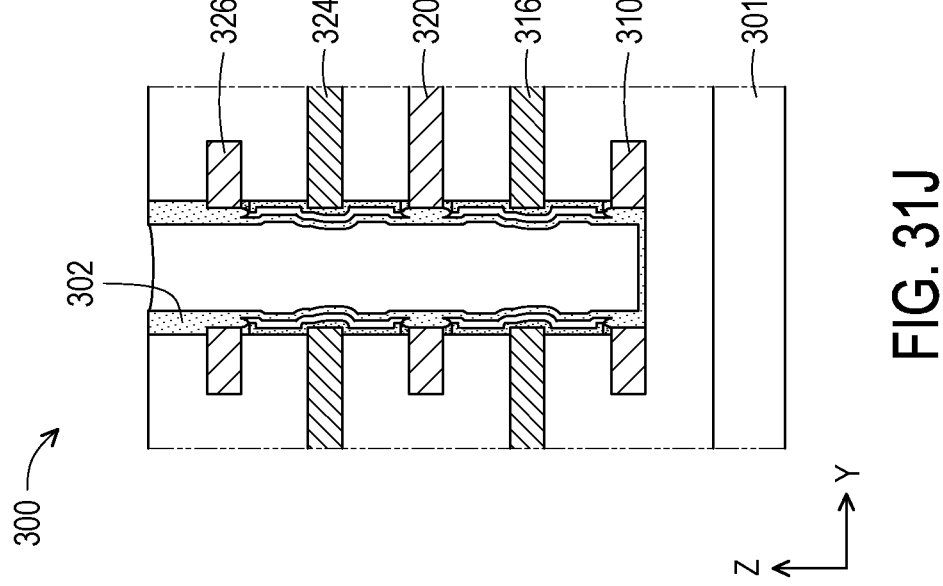

Next, in FIG. 31G, the gate dielectric 376 (e.g., a high-k dielectric material) may be (e.g., conformally) deposited over the workpiece, e.g., extending the whole inner sidewall of the vertical opening 352. With the oxide layer 375 interposed between the gate dielectric 376 and each of the metal stacks 310, 314, 320, 322, 326, and 328, the gate dielectric 376 may have first portions (that correspond to the positions of the metal stacks 310, 314, 320, 322, 326, and 328) protruding radially inwardly toward a central point of the vertical opening more than other, second portions. Next, in FIG. 31H, an anisotropic etching process is performed to remove such protruding portions, thereby exposing the oxide layer 375 while keeping the second portions of the gate dielectric 376. Next, in FIG. 31I, the oxide layer 375 is selectively etched with respect to the second portions of the gate dielectric 376, which again exposes the inner sidewalls of the metal stacks 310, 314, 320, 322, 326, and 328. Next, in FIG. 31J, the channel 302 (as shown) and the channel 304 (not shown in such a cross-section) can be deposited to surround the inner sidewall of the vertical opening 352 and the inner sidewall of the vertical opening 354, respectively. In some other embodiments, the channels 302 and 304 may be deposited to fill the vertical opening 352 and the vertical opening 354, respectively.

Figure 32:
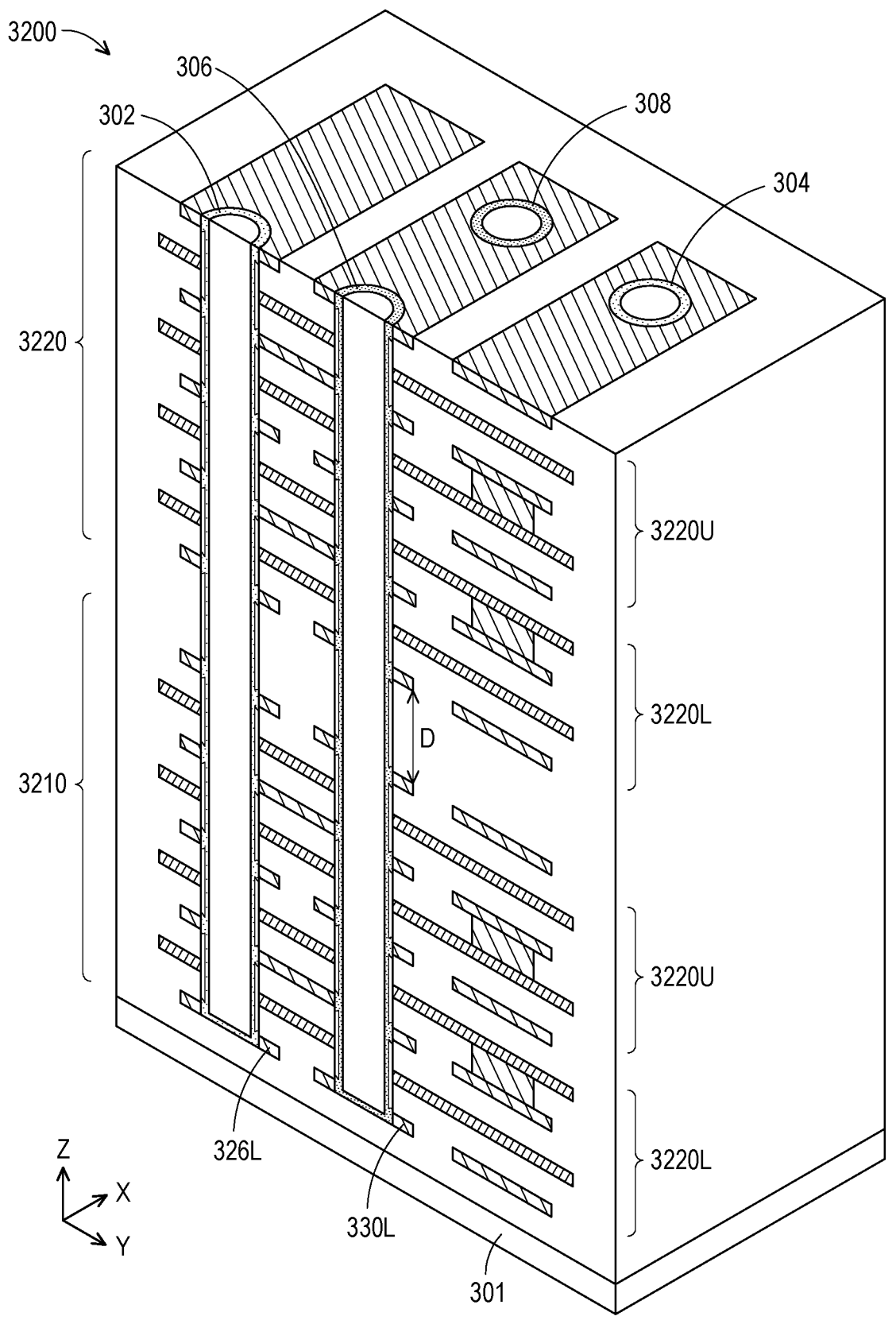
FIG. 32 illustrates a cutaway view of a memory device including multiple stacked memory cells, in accordance with some embodiments.

FIG. 32 illustrates a perspective view of a memory device 3200 including multiple (e.g., 2) stacked memory cells, 3210 and 3220, arranged on top of one another, in accordance with various embodiments. The stacked memory cells 3210 include lower cell 3210L and upper cell 3210U; and the stacked memory cells 3220 include lower cell 3220L and upper cell 3220U. The stacked memory cells 3210 and the stacked memory cells 3220 are each substantially similar to the memory device 1300 of FIG. 13. Accordingly, the corresponding description of the memory device 3200 will be briefly described as follows.

To arrange multiple stacked memory cells along a vertical direction, their channels may continuously extend through these vertically arranged stacked memory cells, with the channels each having an extended length between the different stacked memory cells. For example in FIG. 32, each of the channels 302 to 308 may continuously extend through the nine metallization layers (e.g., the M1 layer to M9 layer) of the stacked memory cells 3210 and the nine metallization layers (e.g., the M1 layer to M9 layer) of the stacked memory cells 3220. In some embodiments, a height difference ("D") between the bottommost metal track of the stacked memory cells 3220 and the topmost metal track of the stacked memory cells 3210 may be configured as equal to or greater than about 10 nanometers (nm).

Figure 33:
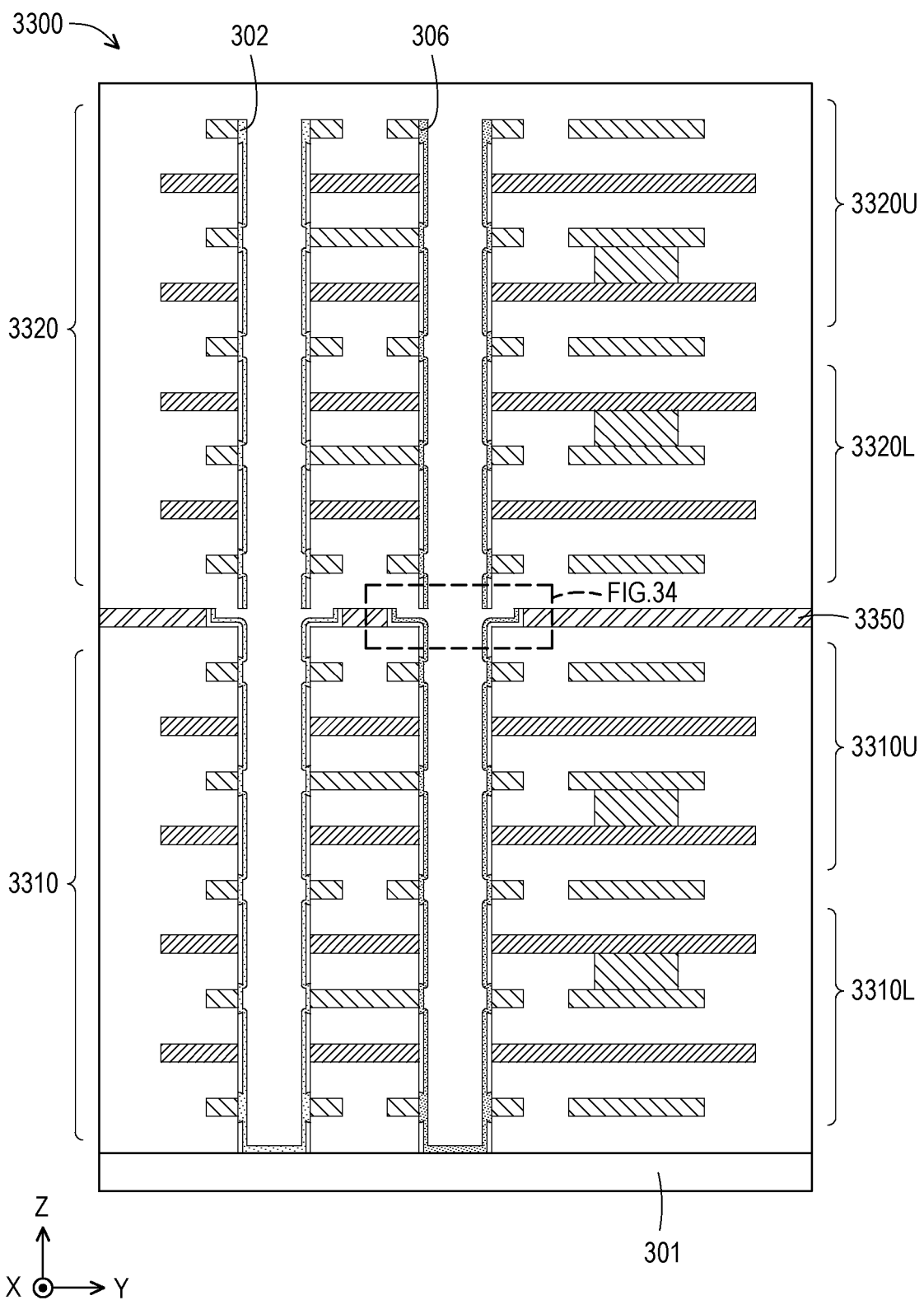
FIG. 33 illustrates a cross-sectional view of the memory device shown in FIG. 32, in accordance with some embodiments.

FIG. 33 illustrates a cross-sectional view of a memory device 3300 including multiple (e.g., 2) stacked memory cells, 3310 and 3320, arranged on top of one another, in accordance with various embodiments. The stacked memory cells 3210 include lower cell 3310L and upper cell 3310U; and the stacked memory cells 3320 include lower cell 3320L and upper cell 3320U. The stacked memory cells 3310 and the stacked memory cells 3320 are each substantially similar to the memory device 1300 of FIG. 13. Accordingly, the corresponding description of the memory device 3300 will be briefly described as follows.

Figure 34:
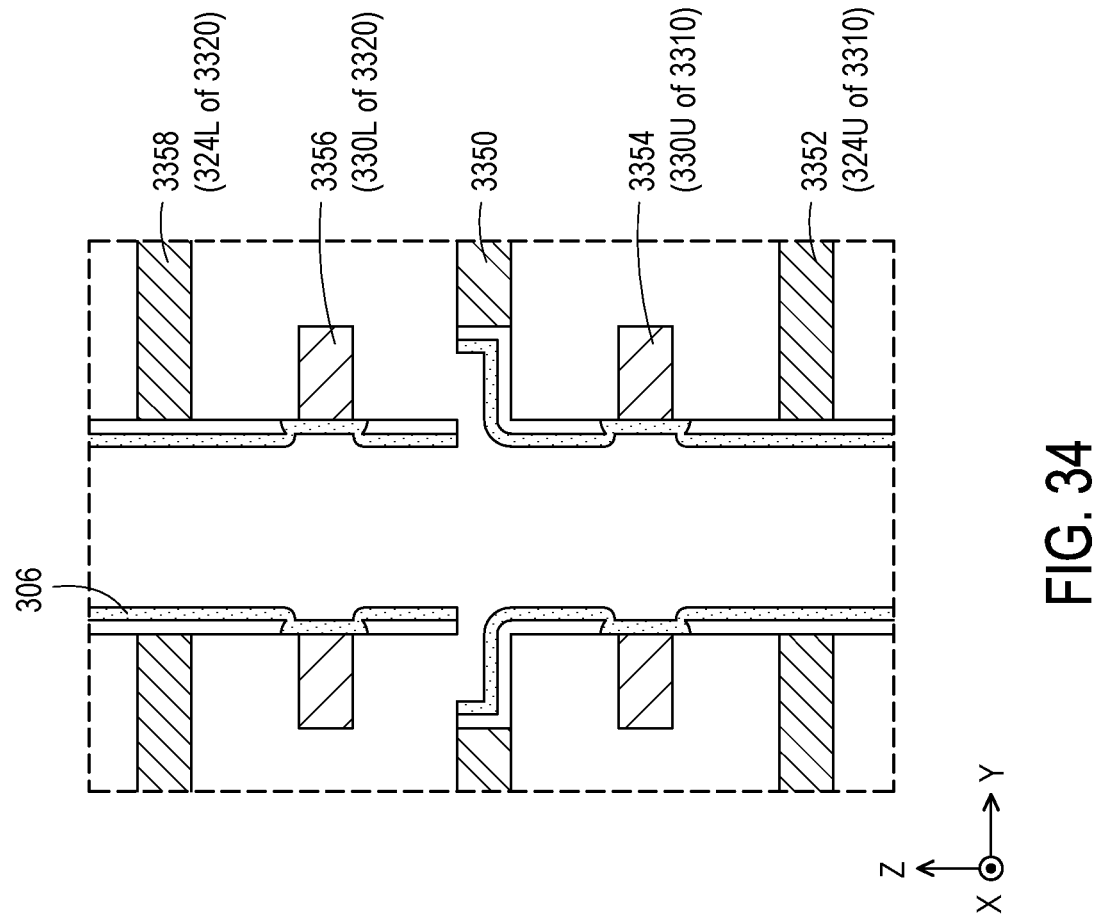
FIG. 34 illustrates an enlarged view of a portion of the memory device shown in FIG. 32, in accordance with some embodiments.

Different from the example memory device 3200 shown in FIG. 32, the channels of different stacked memory cells of the memory device 3300 may discontinuously extend in the vertical direction. For example in FIG. 33, the stacked memory cells 3310 and the stacked memory cells 3320 are separated by a dielectric layer 3350. Further, the dielectric layer 3350 may be indented with respect to the vertical opening where the channels 302 to 308 are each formed. Each of the channels 302 to 308 (e.g., 302 and 306 as shown) belonging to the lower stacked memory cells 3310 can partially extend into such an indent, which can be better appreciated in FIG. 34 illustrating an enlarged view of such a portion of the memory device 3300.

As shown, beneath the dielectric layer 3350, the channel 306 includes a first vertical portion extending across the metal tracks of the stacked memory cells 3310, e.g., metal tracks 3352 and 3354 which correspond to the metal tracks 324U and 330U of the stacked memory cells 3310, respectively. Further, the channel 306 has a horizontal portion and a second vertical portion extending into the indent of the dielectric layer 3350, wherein the horizontal portion, extended from the first vertical portion, and the second vertical portion, extended from the horizontal portion, form a corner with a nearly normal degree. The channel 306 includes a third vertical portion, which is disconnected from the second vertical portion. Such a third vertical portion extends across the metal tracks of the stacked memory cells 3320, e.g., metal tracks 3356 and 3358 which correspond to the metal tracks 330L and 324L of the stacked memory cells 3320, respectively.

FIGS. 35A, 35B, 35C, 35D, 35E, and 35F illustrate various fabrication stages of the semiconductor device 3300, in accordance with some embodiments. FIGS. 35A to 35F illustrate respective cross-sectional views of the semiconductor device 3300 at the stages in which such a discontinued channel 306 is formed. Although only channel 306 is shown, it should be understood that other channels of the semiconductor device 3300 may be similarly formed, e.g., having the similar profiles.

Figure 35B:
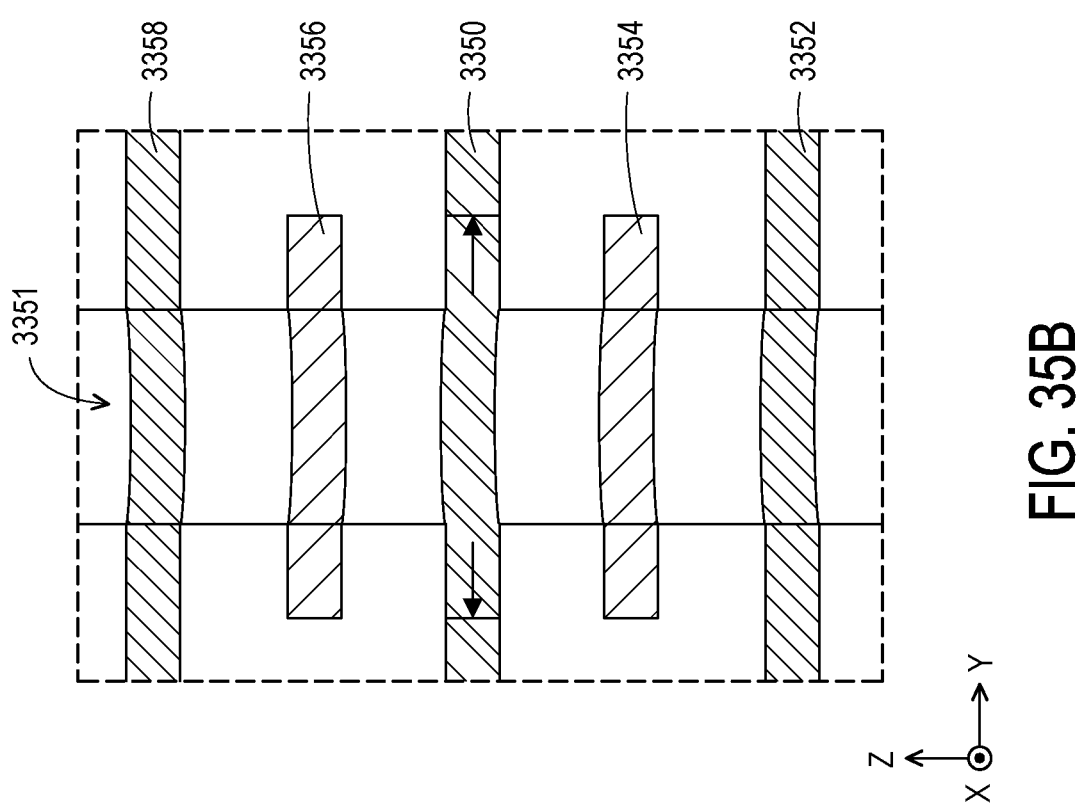
FIGS. 35A to 35F illustrate cross-sectional views of the memory device shown in FIG. 32 during various fabrication stages, in accordance with some embodiments.
Figure 35A:
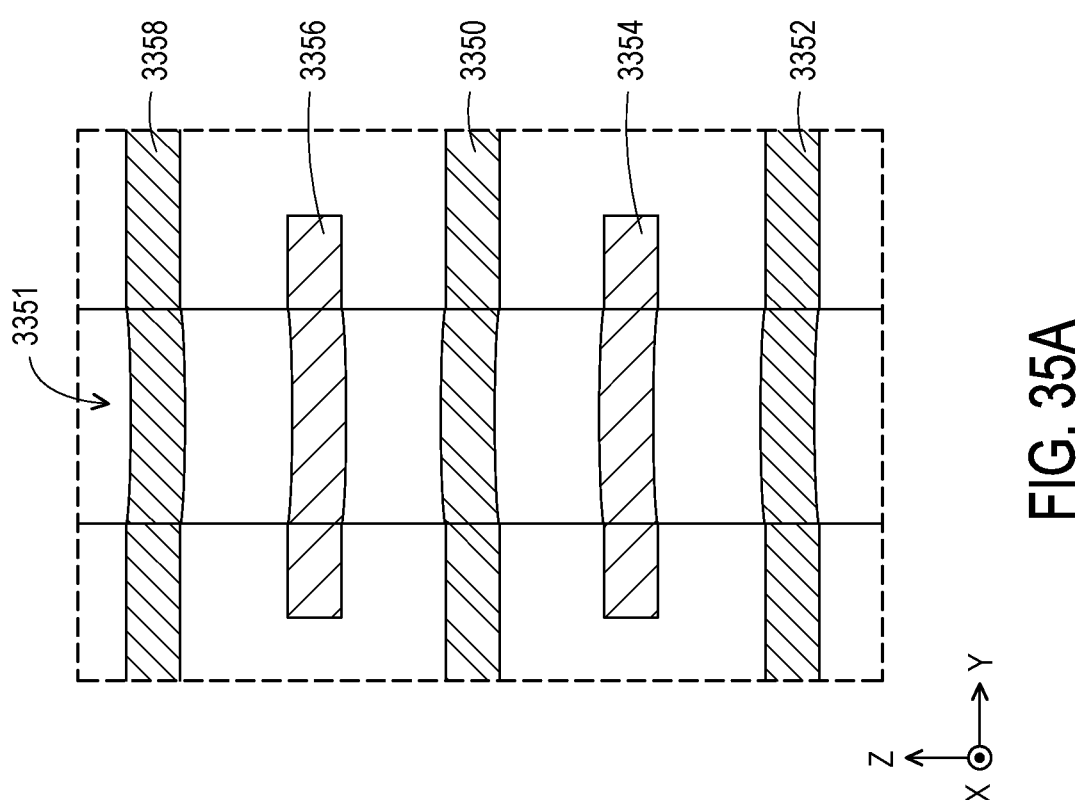
Figure 35D:
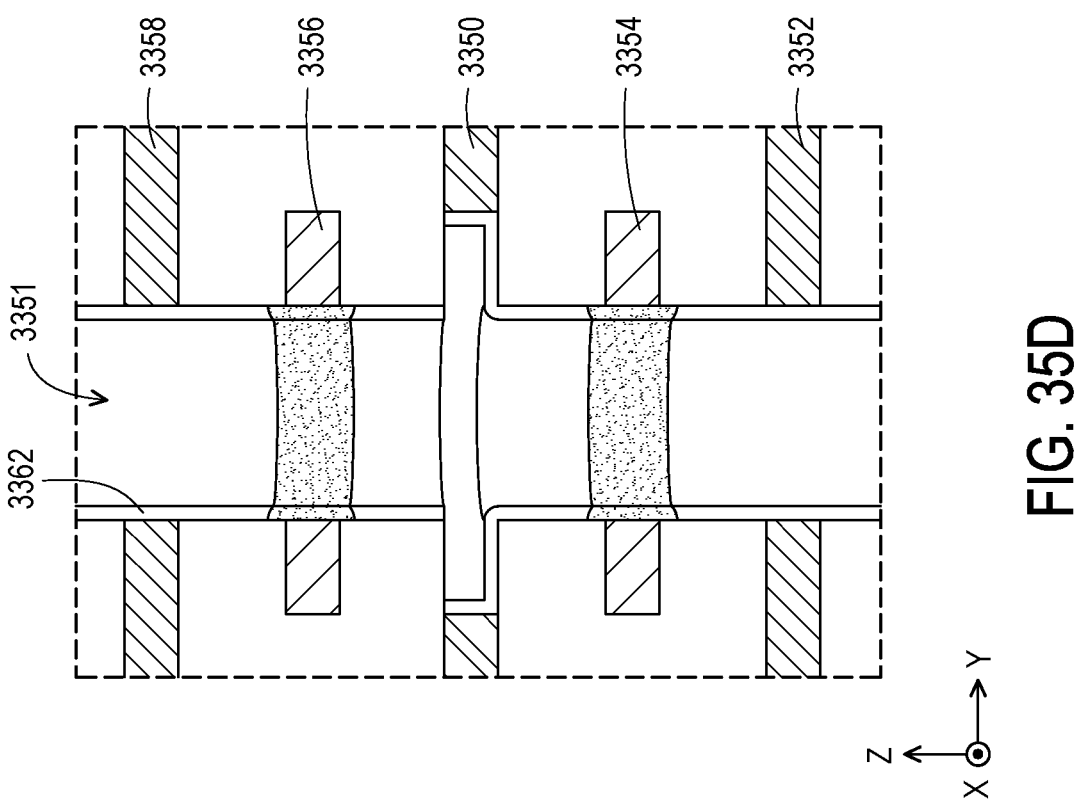
Figure 35C:
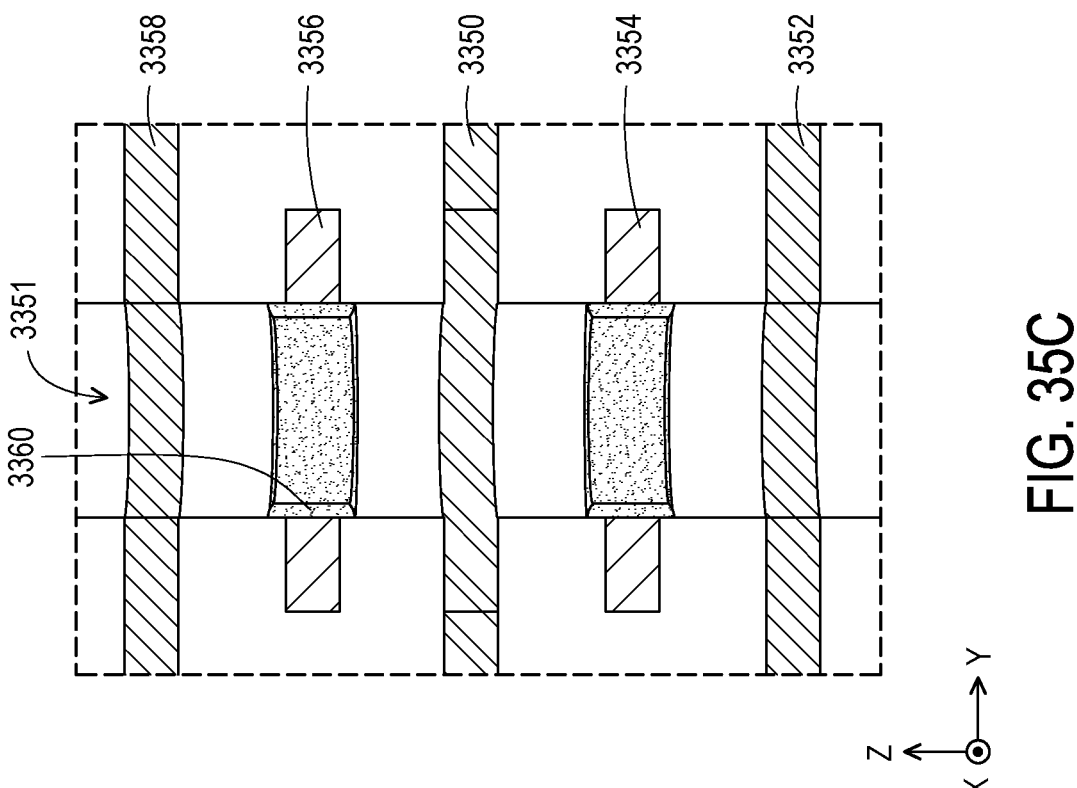
Figure 35F:
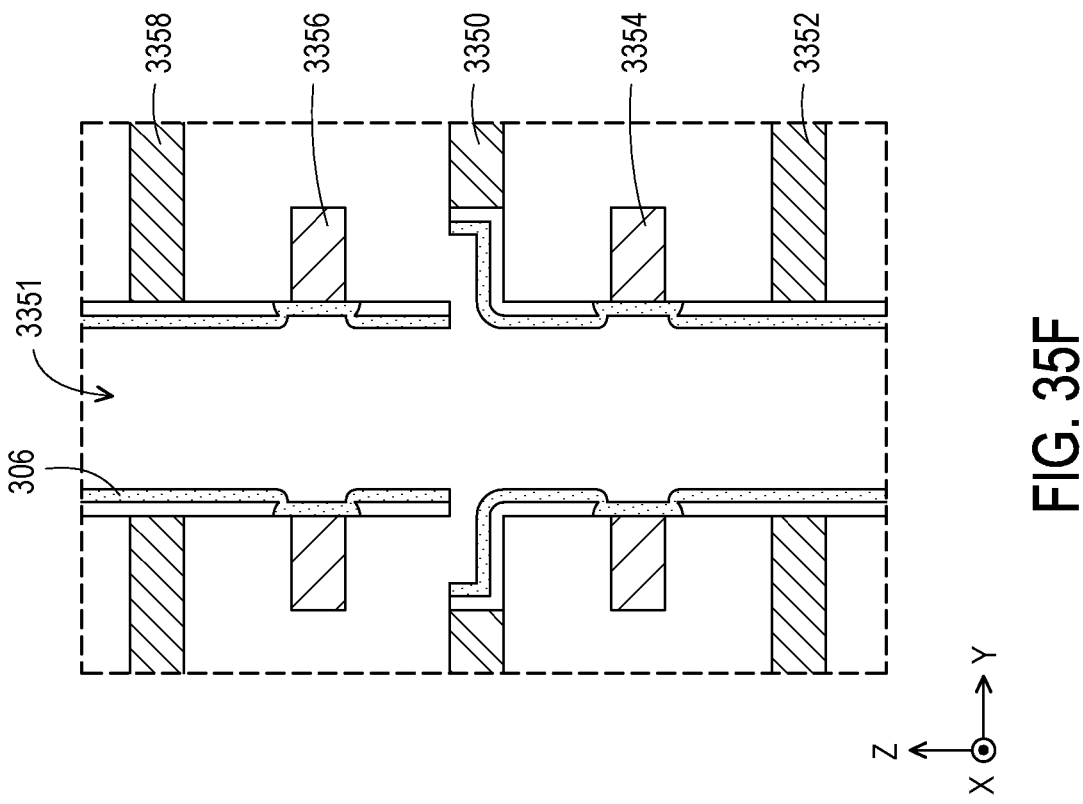
Figure 35E:
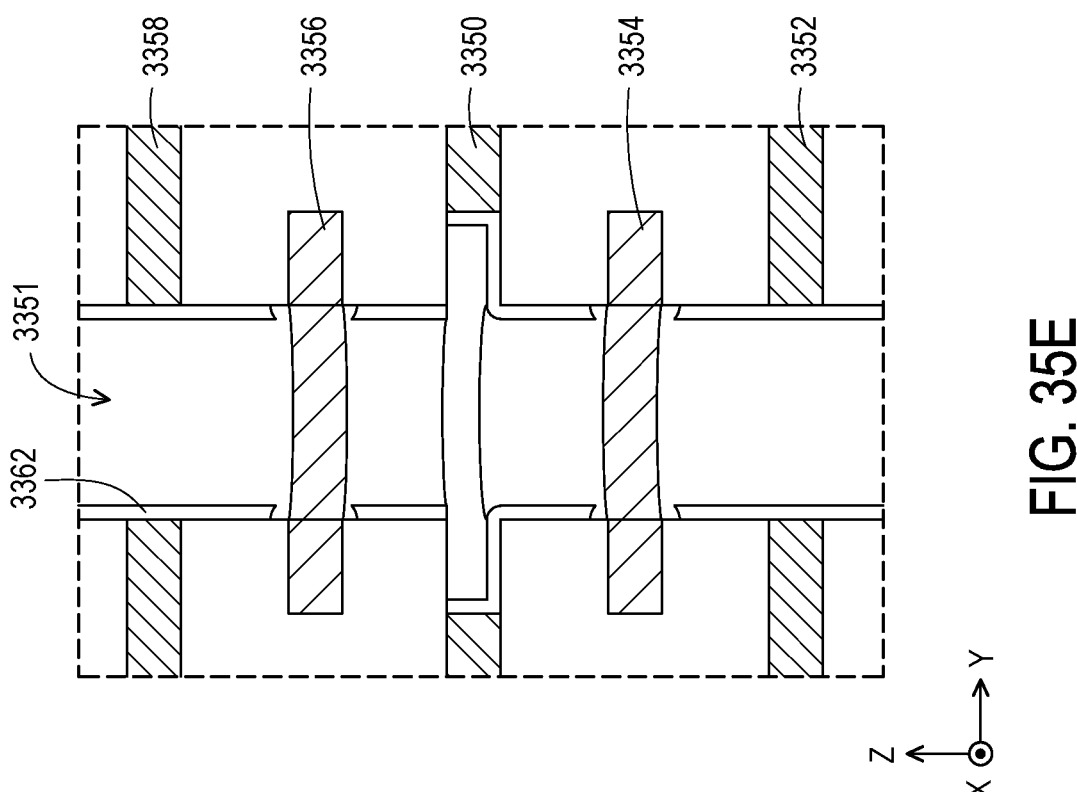

Specifically, in FIG. 35A, upon forming the topmost metal stacks (e.g., 326U, 328U, 330U) for the stacked memory cells 3320, a vertical opening 3351, corresponding to the footprint of the channel 306, is formed through at least one anisotropic etching process. As a result, one or more inner sidewalls of each of the metal stacks (e.g., 3352 to 3358) and one or more inner sidewalls of the dielectric layer 3350 are exposed. Next, in FIG. 35B, a selective etching process can be performed to indent or recess the dielectric layer 3350, as indicated by the arrows. In some embodiments, the dielectric layer 3350 may be formed on a material (e.g., SiOC or the like) having an etching selectivity with respect to the dielectric material of the metallization layers. As such, the inner sidewall of the dielectric layer 3350 can be radially outwardly pushed away from a center of the vertical opening 3351, thereby forming the indents of the dielectric layer 3350. Next, in FIG. 35C, an oxide layer 3360 is selectively formed only around the inner sidewalls of the metal stacks 3354 and 3356. Next, in FIG. 35D, a gate dielectric 3362 (e.g., a high-k dielectric material) may be (e.g., conformally) deposited over the workpiece, e.g., extending the whole inner sidewall of the vertical opening 3351, followed by an anisotropic etching process. Next, in FIG. 35E, the oxide layer 3360 is removed. Next, in FIG. 35F, the channel 306 is (e.g., conformally) deposited.

In one aspect of the present disclosure, a semiconductor device is disclosed. The semiconductor device includes a substrate; a first one of a plurality of metallization layers disposed above the substrate and comprising a first metal track, a second metal track, and a third metal track that extend along a first lateral direction; a second one of the plurality of metallization layers disposed above the first metallization layer and comprising a fourth metal track and a fifth metal track that extend along a second lateral direction perpendicular to the first lateral direction; a third one of the plurality of metallization layers disposed above the second metallization layer and comprising a sixth metal track and a seventh metal track; a fourth one of the plurality of metallization layers disposed above the third metallization layer and comprising an eighth metal track that extend along the second lateral direction; a fifth one of the plurality of metallization layers disposed above the fourth metallization layer and comprising a ninth metal track and a tenth metal track that extend along the first lateral direction; a first channel having a first conductivity and extending along a vertical direction from the first metallization layer to the fifth metallization layer; a second channel having the first conductivity and extending along the vertical direction from the first metallization layer to the fifth metallization layer; a third channel having a second conductivity and extending along the vertical direction from the first metallization layer to the third metallization layer; and a fourth channel having the second conductivity and extending along the vertical direction from the first metallization layer to the third metallization layer.

In another aspect of the present disclosure, a memory device is disclosed. The memory device includes a first n-type transistor and a second n-type transistor formed of a first channel that extends along a vertical direction and is wrapped by a first metal track, a second metal track, a third metal track, a fourth metal track, and a fifth metal track; a third n-type transistor and a fourth n-type transistor formed of a second channel that extends along the vertical direction and is wrapped by a sixth metal track, a seventh metal track, an eighth metal track, the fourth metal track, and an ninth metal track; a first p-type transistor formed of a third channel that extends along the vertical direction and is wrapped by a tenth metal track, the second metal track, and the third metal track; and a second p-type transistor formed of a fourth channel that extends along the vertical direction and is wrapped by the tenth metal track, the sixth metal track, and the seventh metal track.

In yet another aspect of the present disclosure, a method for fabricating memory devices is disclosed. The method includes forming a first metal track, a second metal track, and a third metal track that extend along a first lateral direction and are disposed in a first metallization layer disposed above a substrate; forming a fourth metal track and a fifth metal track that extend along a second lateral direction perpendicular to the first lateral direction and are disposed in a second metallization layer above the first metallization layer; forming a sixth metal track and a seventh metal track that are disposed in a third metallization layer above the second metallization layer; forming a first channel that extends along a vertical direction from the second metal track, through the fourth metal track, and to the sixth metal track, and a second channel that extends along the vertical direction from the second metal track, through the fifth metal track, and to the seventh metal track; forming an eighth metal track that extends along the second lateral direction and is disposed in a fourth metallization layer above the third metallization layer; forming a ninth metal track and a tenth metal track that extend along the first lateral direction and are disposed in a fifth metallization layer above the fourth metallization layer; and forming a third channel that extends along the vertical direction from the first metal track, through the fourth, sixth, and eighth metal tracks, and to the ninth metal track, and a fourth channel that extends along the vertical direction from the third metal track, through the fifth, seventh, and eighth metal tracks, and to the tenth metal track.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

a first one of a plurality of metallization layers disposed above the substrate and comprising a first metal track, a second metal track, and a third metal track that extend along a first lateral direction;

a second one of the plurality of metallization layers disposed above the first metallization layer and comprising a fourth metal track and a fifth metal track that extend along a second lateral direction perpendicular to the first lateral direction;

a third one of the plurality of metallization layers disposed above the second metallization layer and comprising a sixth metal track and a seventh metal track;

a fourth one of the plurality of metallization layers disposed above the third metallization layer and comprising an eighth metal track that extend along the second lateral direction;

a fifth one of the plurality of metallization layers disposed above the fourth metallization layer and comprising a ninth metal track and a tenth metal track that extend along the first lateral direction;

a first channel having a first conductivity and extending along a vertical direction from the first metallization layer to the fifth metallization layer;

a second channel having the first conductivity and extending along the vertical direction from the first metallization layer to the fifth metallization layer;

a third channel having a second conductivity and extending along the vertical direction from the first metallization layer to the third metallization layer; and a fourth channel having the second conductivity and extending along the vertical direction from the first metallization layer to the third metallization layer.

2. The semiconductor device of claim 1, wherein the first to tenth metal tracks and the first to fourth channels operatively serve as a Static Random Access Memory (SRAM) cell.

3. The semiconductor device of claim 2, wherein the SRAM cell consists of six transistors, two of which have the second conductivity and four of which have the first conductivity.

4. The semiconductor device of claim 1, wherein the first to fourth channels each include a semiconductive-behaving oxide material.

5. The semiconductor device of claim 1, wherein the first channel is electrically coupled to and wrapped by the first metal track, the fourth metal track, the sixth metal track, the eighth metal track, and the ninth metal track, and the second channel is electrically coupled to and wrapped by the third metal track, the fifth metal track, the seventh metal track, the eighth metal track, and the tenth metal track.

6. The semiconductor device of claim 5, wherein the third channel is electrically coupled to and wrapped by the second metal track, the fourth metal track, and the sixth metal track, and the fourth channel is electrically coupled to and wrapped by the second metal track, the fifth metal track, and the seventh metal track.

7. The semiconductor device of claim 6, wherein the second metal track is interposed between the first metal track and the third metal track.

8. The semiconductor device of claim 1, further comprising:

a first via structure connecting the fourth metal track to a first portion of the seventh metal track; and a second via structure connecting the fifth metal track to a first portion of the sixth metal track.

9. The semiconductor device of claim 8, wherein the first portions of the sixth and seventh metal tracks extend along the first lateral direction.

10. The semiconductor device of claim 9, wherein the sixth and seventh metal tracks each include a second portion extending along the second lateral direction.

11. A memory device, comprising:

a first n-type transistor and a second n-type transistor formed of a first channel that extends along a vertical direction and is wrapped by a first metal track, a second metal track, a third metal track, a fourth metal track, and a fifth metal track;

a third n-type transistor and a fourth n-type transistor formed of a second channel that extends along the vertical direction and is wrapped by a sixth metal track, a seventh metal track, an eighth metal track, the fourth metal track, and a ninth metal track;

a first p-type transistor formed of a third channel that extends along the vertical direction and is wrapped by a tenth metal track, the second metal track, and the third metal track; and a second p-type transistor formed of a fourth channel that extends along the vertical direction and is wrapped by the tenth metal track, the sixth metal track, and the seventh metal track.

12. The memory device of claim 11, wherein the first, sixth, and tenth metal tracks are disposed in a first metallization layer, with the tenth metal track interposed between the first metal track and the sixth metal track, wherein the second and seventh metal tracks are disposed in a second metallization layer, wherein the third and eighth metal tracks are disposed in a third metallization layer, wherein the fourth metal track is disposed in a fourth metallization layer, and wherein the fifth and ninth metal tracks are disposed in a fifth metallization layer.

13. The memory device of claim 12, wherein the first, sixth, and tenth metal tracks extend along a first lateral direction, wherein the second and seventh metal tracks extend along a second lateral direction perpendicular to the first lateral direction, wherein the fourth metal track extends along the second lateral direction, and wherein the fifth and ninth metal tracks extend along the first lateral direction.

14. The memory device of claim 12, wherein the fifth metallization layer is disposed above the fourth metallization layer, which is disposed above the third metallization layer, which is disposed above the second metallization layer, which is disposed above the first metallization layer.

15. The memory device of claim 11, wherein the first to fourth n-type transistors and the first to second p-type transistors operatively serve as a Static Random Access Memory (SRAM) cell.

16. The memory device of claim 11, wherein the first to fourth channels are each formed as a tube-like or pillar-like structure consisting of a semiconductive-behaving oxide material.

17. The memory device of claim 11, wherein the third and eight metal tracks are each formed in an L-shape.

18. A memory device, comprising:

a first transistor and a second transistor formed of a first channel that extends along a vertical direction and is wrapped by a first metal track, a second metal track, a third metal track, a fourth metal track, and a fifth metal track;

a third transistor and a fourth transistor formed of a second channel that extends along the vertical direction and is wrapped by a sixth metal track, a seventh metal track, an eighth metal track, the fourth metal track, and a ninth metal track;

a fifth transistor formed of a third channel that extends along the vertical direction and is wrapped by a tenth metal track, the second metal track, and the third metal track; and a sixth transistor formed of a fourth channel that extends along the vertical direction and is wrapped by the tenth metal track, the sixth metal track, and the seventh metal track;

wherein the first, second, third, and fourth transistors have a first conductivity type, and the fifth and sixth transistor have a second conductivity type;

wherein the first, sixth, and tenth metal tracks are disposed in a first metallization layer, with the tenth metal track interposed between the first metal track and the sixth metal track;

wherein the second and seventh metal tracks are disposed in a second metallization layer;

wherein the third and eighth metal tracks are disposed in a third metallization layer;

wherein the fourth metal track is disposed in a fourth metallization layer; and wherein the fifth and ninth metal tracks are disposed in a fifth metallization layer.

19. The memory device of claim 18, wherein the fifth metallization layer is disposed above the fourth metallization layer, which is disposed above the third metallization layer, which is disposed above the second metallization layer, which is disposed above the first metallization layer.

20. The memory device of claim 18, wherein the third and eight metal tracks are each formed in an L-shape.

* * * * *